(12) United States Patent
Kitazawa

(10) Patent No.: US 6,377,506 B2
(45) Date of Patent: Apr. 23, 2002

(54) SEMICONDUCTOR DEVICE

(75) Inventor: Motoyasu Kitazawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/783,431

(22) Filed: Feb. 14, 2001

(30) Foreign Application Priority Data

Feb. 14, 2000 (JP) .......................................... 12-035930

(51) Int. Cl.[7] .............................................. G11C 7/00
(52) U.S. Cl. ................................. 365/230.03; 365/233
(58) Field of Search ........................... 365/230.03, 222, 365/233

(56) References Cited

U.S. PATENT DOCUMENTS 5,659,515 A * 8/1997 Matsuo et al. .............. 365/222
6,178,135 B1 * 1/2001 Kang .................... 365/230.03

OTHER PUBLICATIONS

Shinji Miyano, Embedded DRAM Macro for ASIC, Toshiba Review, vol. 52, No. 12, pp. 15–18, 1997.

* cited by examiner

*Primary Examiner*—Vu A. Le
(74) *Attorney, Agent, or Firm*—Hutchins, Wheeler & Dittmar

(57) ABSTRACT

A semiconductor device is provided which has a memory provided with a peripheral device that can operate in a versatile manner, irrespective of combinations of storage capacity, numbers of banks and numbers of rows of memory cell arrays to be refreshed. The memory for storing various data, together with circuits to process a variety of signals, is mounted on one semiconductor chip. The memory includes a memory block in which a plurality of blocks each being made up of one memory cell array each having storage capacity of 1M bits or a plurality of blocks each being made up of one memory cell array and of a first and second sense amplifier between which the memory cell array is sandwiched, is arranged according to pre-set storage capacity of the memory block, and activating circuits which is so configured as to correspond to the block having a number satisfying a maximum settable storage capacity and outputs a variety of activating signals used to activate two or more blocks making up the memory block according to set storage capacity, the number of banks and the number of rows of memory cell arrays to be refreshed.

12 Claims, 48 Drawing Sheets

| storage capacity | numbers of banks | numbers of rows of memory cell arrays to be refreshed | capacity mode signal | | | bank mode signal | | | refresh mode signal | | | |
|---|---|---|---|---|---|---|---|---|---|---|---|---|
| | | | CM8 | CM4 | CM2 | BM4 | BM2 | BM1 | RM40 | RM20 | RM10 | RM05 |
| 8M | 4 | 1k | H | L | L | H | L | L | L | L | H | L |
| 8M | 4 | 512 | H | L | L | H | L | L | L | L | L | H |
| 8M | 2 | 2k | H | L | L | L | H | L | L | H | L | L |
| 8M | 2 | 1k | H | L | L | L | H | L | L | L | H | L |
| 8M | 2 | 512 | H | L | L | L | H | L | L | L | L | H |
| 8M | 1 | 4k | H | L | L | L | L | H | H | L | L | L |
| 8M | 1 | 2k | H | L | L | L | L | H | L | H | L | L |
| 8M | 1 | 1k | H | L | L | L | L | H | L | L | H | L |
| 8M | 1 | 512 | H | L | L | L | L | H | L | L | L | H |
| 4M | 4 | 512 | L | H | L | H | L | L | L | L | L | H |
| 4M | 2 | 1k | L | H | L | L | H | L | L | L | H | L |
| 4M | 2 | 512 | L | H | L | L | H | L | L | L | L | H |
| 4M | 1 | 2k | L | H | L | L | L | H | L | H | L | L |
| 4M | 1 | 1k | L | H | L | L | L | H | L | L | H | L |
| 4M | 1 | 512 | L | H | L | L | L | H | L | L | L | H |
| 2M | 2 | 512 | L | L | H | L | H | L | L | L | L | H |
| 2M | 1 | 1k | L | L | H | L | L | H | L | L | H | L |
| 2M | 1 | 512 | L | L | H | L | L | H | L | L | L | H |
| 1M | 1 | 512 | L | L | L | L | L | H | L | L | L | H |

SEMICONDUCTOR DEVICE

BACKGROUND OF THE INVENTION

1. Field of the Invention

The present invention relates to a semiconductor device and more particularly to the semiconductor device in which a system constructed by connecting, through buses and/or signal lines, a CPU (Central Processing Unit), ROM (Read Only Memory), RAM (Random Access Memory), a plurality of signal processing circuits adapted to process a variety of signals or a like, is integrated into one semiconductor chip.

The present application claims priority of Japanese Patent Application No.2000-035930 filed on Feb. 14, 2000, which is hereby incorporated by reference.

2. Description of the Related Art

In recent years, as semiconductor devices such as an LSI (Large Scale Integrated circuit) or a like become highly integrated and as their packaging densities increase, a semiconductor on which one million or more transistors are mounted can be implemented. One example is a SOC (System On a Chip) in which a system constructed of a CPU, ROM, RAM, a plurality of digital signal processing circuits or a like each being connected through buses to each other, is incorporated into one semiconductor chip. For example, in a literature entitled "Embedded DRAM Macro for ASIC" (Shinji Miyano, Toshiba Review, Vol. 52, No.12. pp.15–18, 1997), a semiconductor device is disclosed in which a system constructed by connecting a DRAM (Dynamic Random Access Memory) having a large capacity memory and a digital signal processing circuit to process a variety of digital signals through buses is incorporated into one semiconductor chip. The semiconductor device of this kind has an advantage in that, since both the memory and digital signal processing circuit are formed on a same semiconductor chip, data can be transferred through buses each having a wider width for transmission and at a higher transmission speed between the memory and the digital signal processing circuit and also a mounting area on a printed circuit board (PCB) can be more reduced, unlike a case where the DRAM formed on an independent chip and encapsulated in an independent package is connected to LSIs containing digital signal processing circuits through pins and through patterns formed on a PCB.

However, since the SOC described above is large in scale, direct design at a transistor level is impossible. To solve this problem, system design to define operations or to decide configurations of a whole system, logical design to decide relations among functional blocks and to define operations within each of functional blocks in accordance with specifications decided by the system design, detail logic design to configure each of the functional blocks by combining logical devices such as NAND gates, NOR gates, latches, counters or a like and circuit design to decide characteristics of electronic circuits and elements so as to meet circuit specifications based on the logical design are sequentially performed, in stages, so that each of the CPUs, ROMs, RAMs or the plurality of digital signal processing circuits adapted to perform specified digital processing or a like can implement its desired functions as one functional block. Moreover, since the semiconductor device is generally expected to be embedded in various electronic devices, it is required that its development period is as short as possible. Therefore, in order to implement facilitation of the system design and shortening of development period, memories making up the SOC have to have general versatility which allows memories mounted on the SOC to be constructed by freely and flexibly combining a plurality of memory blocks containing memory cell arrays having specified memory capacities, sense amplifiers or a like, depending on desired storage capacities, the number of banks, the number of rows of memory cell arrays to be refreshed, or a like. In the above technical literature, there is also a description about such general versatility required in a unit configuration of a DRAM core.

However, since the memory making up the SOC is provided with not only memory blocks but also peripheral devices including input/output circuits used to input or output data to the memory blocks, control circuits generating various control signals used to input or output data to specified cells of the memory arrays making up the memory blocks, in order to achieve facilitation of system design and shortening of development period, it is required that such peripheral devices have such general versatility as described above. Though the above technical literature describes general versatility, however, it describes neither configurations of peripheral devices nor the general versatility required in the peripheral devices.

Thus, even if a system designer can design so that the memory making up the SOC is constructed by combing a plurality of memory blocks depending on desired storage capacities, the number of banks, the number of rows of memory cell arrays to be refreshed or the like, the system designer has to perform separate design of such peripheral devices, which causes a limitation on facilitation of the system design and shortening of development time.

SUMMARY OF THE INVENTION

In view of the above, it is an object of the present invention to provide a semiconductor device having a memory provided with a peripheral device which can operate in a versatile manner, irrespective of combinations of memory capacity, numbers of banks, numbers of rows of memory cell arrays to be refreshed or a like.

According to a first aspect of the present invention, there is provided a semiconductor device including:

a memory to store various data and to be embedded in one semiconductor chip together with circuits to process various signals, wherein the memory includes a memory block in which a plurality of blocks, being corresponded to pre-set storage capacity of the memory block, made up of a memory cell array having predetermined storage capacity and being constructed of a plurality of memory cells is arranged and an activating circuit configured so as to correspond to numbers of blocks satisfying maximum settable storage capacity which outputs a variety of activating signals used to activate a plurality of the blocks making up the memory block according to pre-set storage capacity and/or numbers of banks.

In the foregoing, a preferable mode is one wherein the activating circuit outputs, according to pre-set storage capacity and/or numbers of banks, a block selecting signal used to select any one of blocks making up the memory block, a row address latch signal used to temporarily latch a row address decoded by a row decoder which outputs a main-word activating signal to put a main-word line corresponding to the memory cell array in a selected state based on the decoded row address, a main-word timing control signal used to control timing with which the row decoder outputs the main-word activating signal and a sub-word activating signal used to activate a sub-word line of the memory cell array making up the corresponding block, to each of a plurality of the blocks making up the memory block.

Also, a preferable mode is one that wherein includes a control circuit which generates, according to pre-set storage capacity and/or numbers of banks and based on an address supplied from outside, a latch signal used to temporarily latch the block selecting signal, a first control signal used to control timing with which the row address latch signal is output, a second control signal used to control timing with which the activating circuit outputs the main-word timing control signal, a third control signal used to control timing with which the activating circuit outputs the sub-word activating signal, a capacity mode signal corresponding to pre-set storage capacity and a bank mode signal corresponding to numbers of banks and then feeds these signals to the activating circuit with specified timing, wherein the activating circuit, based on the latch signal, the first to third control signals, the capacity mode signal and the bank mode signal, generates the various activating signals.

Also, a preferable mode is one wherein the control circuit, when a test on the memory is executed, generates a test mode signal used to put all banks in a test mode, a test clock being a clock used in the test mode and a block forcedly-activating signal used to forcedly activate corresponding one block contained in the blocks and feeds these signals to the activating circuit, wherein the activating circuit, based on the test mode signal, the test clock and the block forcedly-activating signal, generates various activating signals.

Furthermore, a preferable mode is one wherein the memory cell array has a storage capacity of 1M bits and has a plurality of memory cells arranged in a matrix-like manner and in 512 rows×2048 columns form and wherein storage capacity that is allowed to be set includes any one of 1M, 2M, 4M and 8M bits and numbers of banks that are allowed to be set include any one of 1, 2 and 4.

According to a second aspect on the present invention, there is provided a semiconductor device including:

a DRAM (Dynamic Random Access Memory) to store various data and to be embedded in one semiconductor chip together with circuits to process various signals, wherein the DRAM includes a memory block in which a plurality of blocks, being corresponded to pre-set storage capacity of the memory block, made up of a memory cell array having predetermined storage capacity and being constructed of a plurality of memory cells is arranged and of first and second sense amplifiers constructed so as to sandwich the memory cell array and used to detect data read to a bit line from the memory cell making up the memory cell array and to amplify the data and an activating circuit configured so as to correspond to numbers of blocks satisfying maximum settable storage capacity which outputs a variety of activating signals used to activate a plurality of the blocks making up the memory block according to pre-set storage capacity, numbers of banks and numbers of rows of memory cell arrays to be refreshed representing numbers of rows of the memory cell arrays to be activated by one time refreshing processing.

In the foregoing, a preferable mode is one wherein the activating circuit outputs, according to pre-set storage capacity, numbers of banks and numbers of rows of memory cell arrays, a block selecting signal used to select any one of blocks making up the memory block, a row address latch signal used to temporarily latch a row address decoded by a row decoder which outputs a main-word activating signal to put a main-word line corresponding to the memory cell array in a selected state, based on the decoded row address, a main-word timing control signal used to control timing with which the row decoder outputs the main-word activating signal, a sub-word activating signal used to activate a sub-word line of the memory cell array making up the corresponding block and a sense amplifier activating signal used to activate two sense amplifiers making up the corresponding block, to each of a plurality of the blocks making up the memory block.

Also, a preferable mode is one that wherein includes a control circuit which generates, according to pre-set storage capacity, numbers of banks and numbers of rows of memory cell arrays to be refreshed and based on an address supplied from outside, a latch signal used to temporarily latch the block selecting signal, a first control signal used to control timing with which the row address latch signal is output, a second control signal used to control timing with which the activating circuit outputs the main-word timing control signal, a third control signal used to control timing with which the activating circuit outputs the sub-word activating signal, a fourth control signal used to control timing with which the activating circuit outputs the sense amplifier activating signal, a capacity mode signal corresponding to pre-set storage capacity, a bank mode signal corresponding to numbers of banks, a refresh mode signal corresponding to pre-set numbers of rows of memory cell arrays to be refreshed and then feeds these signals to the activating circuit with specified timing, wherein the activating circuit, based on the latch signal, the first to fourth control signals, the capacity mode signal, the bank mode signal and the refresh mode signal, generates various activating signals.

Also, a preferable mode is one wherein the activating circuit includes a refresh decoder to decode data obtained by combining higher-order bits contained in the refresh mode signal with those contained in the row address and to generate a block activating designation signal used to designate the block to be activated and a block activating section mounted in numbers corresponding to numbers of blocks satisfying maximum settable capacity, to generate, based on the latch signal, a reversed latch signal obtained by reversing the latch signal, the first to fourth control signals, the capacity mode signal, the bank mode signal and the refresh mode signal, according to pre-set storage capacity, numbers of banks and numbers of rows of memory cell arrays to be refreshed, with specified timing, the block selecting signal and generates the row address latch signal, the main-word timing control signal, the sub-word activating signal and the sense amplifier activating signal.

Also, a preferable mode is one wherein the block activating section includes a block selecting signal generating circuit which generates, based on the block activating designation signal, the latch signal, the reversed latch signal, the refresh mode signal and the bank mode signal, a block selecting signal used to designate the corresponding block, a row address latch signal generating circuit which generates, based on the first control signal and the block selecting signal, the row address latch signal and feeds it to corresponding one contained in the blocks and an activating signal generating circuit which generates, based on the second to fourth control signals and the block selecting signal, the sub-word activating signal and the sense amplifier activating signal and the main-word timing control signal and feeds these signals to corresponding blocks.

Also, a preferable mode is one wherein the control circuit, when a test on the memory is executed, generates a test mode signal used to put all banks in a test mode, a test clock being a clock used in the test mode and a block forcedly-activating signal used to forcedly activate corresponding one block contained in the blocks and feeds these signals to the activating circuit, wherein the activating circuit, based on the test mode signal, the test clock and the block forcedly-activating signal, generates the various activating signals.

Furthermore, a preferable mode is one wherein the memory cell array has a storage capacity of 1M bits and has a plurality of memory cells arranged in a matrix-like manner and in 512 rows×2048 columns form and wherein storage capacity that is allowed to be set includes any one of 1M, 2M, 4M and 8M bits, numbers of banks that are allowed to be set include any one of 1, 2 and 4 and numbers of rows of memory cell arrays to be refreshed that are allowed to be set include any one of 512, $2^{10}$, $2^{11}$ and $2^{12}$.

With the above configuration, since the memory or the DRAM embedded in the one semiconductor chip of the present invention is provided with the memory block in which a plurality of blocks each being made up of one memory cell array having predetermined storage capacity or a plurality of blocks each being made up of one memory cell array and of first and second sense amplifiers between which the memory cell array is sandwiched, is arranged according to pre-set storage capacity of the memory block and with activating circuits so configured as to correspond to the block having the number satisfying the maximum settable storage capacity and output a variety of activating signals used to activate the two or more blocks making up the memory block according to the pre-set storage capacity, the number of banks and the number of rows of memory cell arrays to be refreshed, system designer, even when combinations of the storage capacity, the number of banks and the number of rows of memory cell arrays to be refreshed are changed, can freely and easily perform system design of the memory of the semiconductor device. This also allows system design of the semiconductor device to be made easier and development period of the semiconductor device to be shortened.

With another configuration as above, since the activating circuit, according to the pre-set storage capacity and/or the number of banks and for each of the two or more blocks, generates the row address latch signal used to temporarily hold the row address decoded by the row decoder and the block selecting signal used to select one of blocks making up the memory block and since the control circuit generates the latch signal used to temporarily hold the block selecting signal, it is possible to perform multi-banking operations in which a plurality of blocks belonging to a plurality of banks is simultaneously activated.

With still another configuration as above, since the control circuit generates the test mode signal, test clock and block forcedly-activating signal and the activating circuit, based on the test mode signal, test clock and block forcedly-activating signal, generates various activating signals, it is possible to execute the reliability test on the memory.

BRIEF DESCRIPTION OF THE DRAWINGS

The above and other objects, advantages and features of the present invention will be more apparent from the following description taken in conjunction with the accompanying drawings in which:

FIG. 19 is a schematic block diagram showing one example of configurations of another block selecting signal generating employed in the memory according to the embodiment of the present invention;

FIG. 49 is a table showing combinations of the storage capacity, the number of banks and the number of rows of memory cell arrays to be refreshed that can be applied to the embodiment and relations among capacity mode signals, bank mode signals and refresh mode signals that can be applied to the embodiment of the present invention.

DETAILED DESCRIPTION OF THE PREFERRED EMBODIMENTS

Best modes of carrying out the present invention will be described in further detail using various embodiments with reference to the accompanying drawings.

Figure 1:
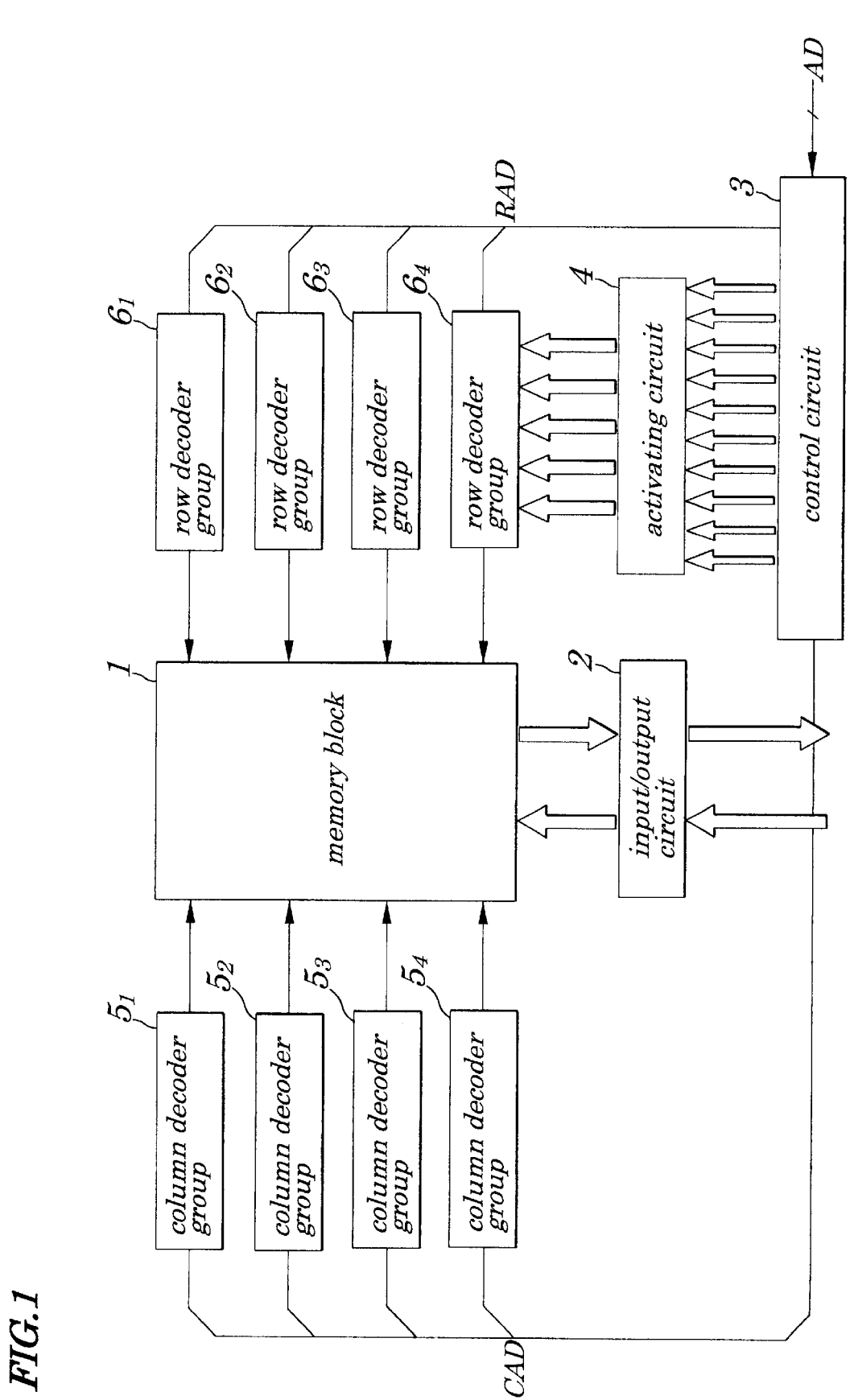
FIG. 1 is a schematic block diagram showing configurations of a memory making up a semiconductor device according to an embodiment of the present invention.

FIG. 1 is a schematic block diagram showing configurations of a memory making up a semiconductor device according to an embodiment of the present invention.

The memory of the embodiment chiefly includes a memory block 1 being a DRAM having a storage capacity of 8M bits and numbers of rows of memory cell arrays to be refreshed being 1K ($=2^{10}$) which represent the number of rows of memory cell arrays (hereinafter the memory cell array being referred to as an "MCA") to be activated by one time refreshing processing and being made up of four banks, an input/output circuit 2, a control circuit 3, an activating circuit 4, column decoder groups $5_1$ to $5_4$ and row decoder groups $6_1$ to $6_4$.

Figure 2:
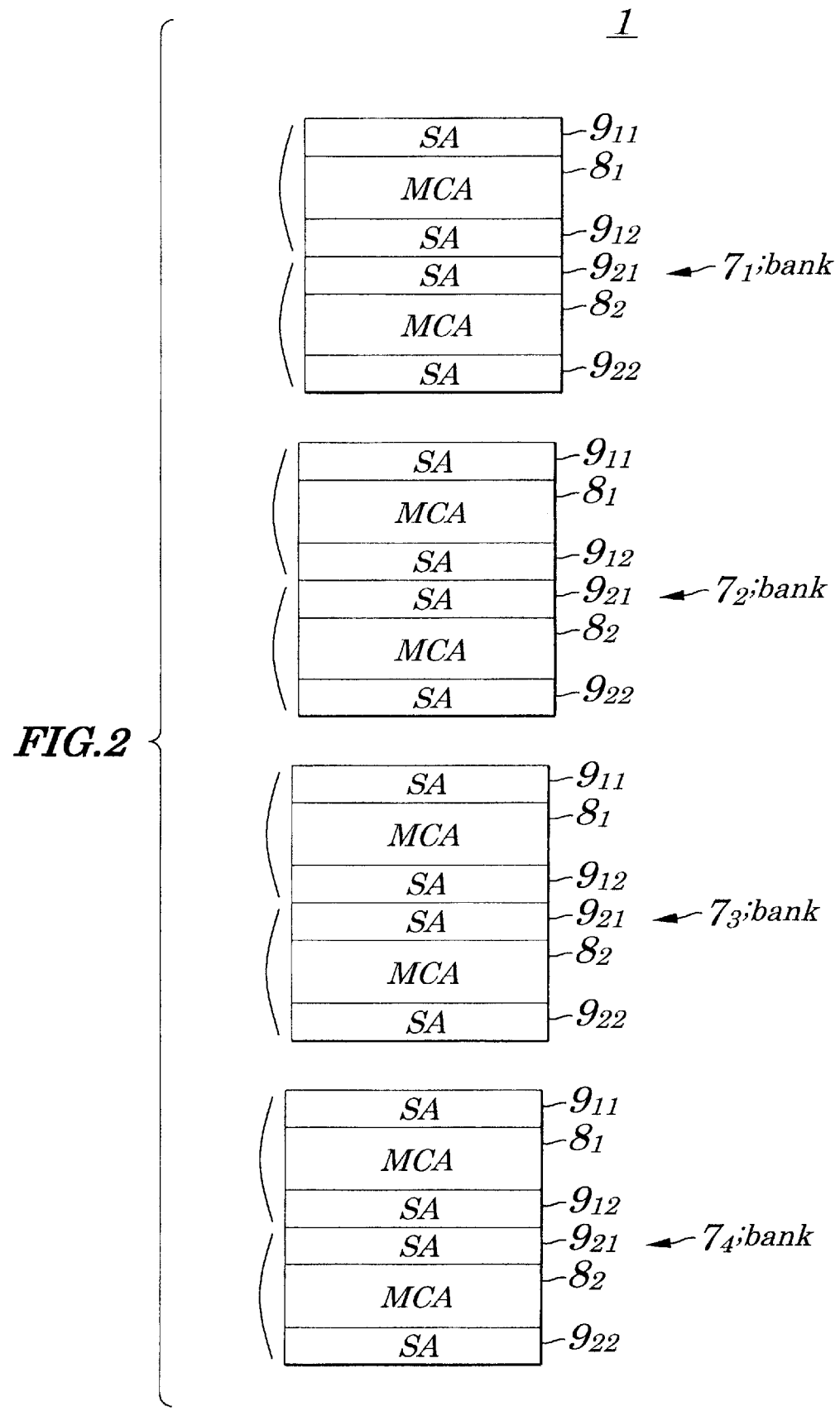
FIG. 2 is a schematic block diagram showing one example of configurations of a memory block making up the memory according to the embodiment of the present invention.

The memory block 1, as shown in FIG. 2, is made up of four banks $7_1$ to $7_4$, each bank having a storage capacity of 2M bits. Each of the bank $7_1$ to $7_4$ chiefly includes two MCAs $8_1$ and $8_2$ and four sense amplifiers (hereinafter the sense amplifier being referred to as an "SA") $9_{11}$, $9_{12}$, $9_{21}$ and $9_{22}$. Each of the MCAs $8_1$ and $8_2$ has a storage capacity of 1M bits and is made up of a plurality of memory cells (512 rows×2048 columns) arranged in a matrix-like form. Each of the MCA $8_1$ and $8_2$ is generally called a "512 refresh array". The MCAs $8_1$ and $8_2$ are mounted in a manner so as to be sandwiched between the SA $9_{11}$ and SA $9_{12}$ and between the SA $9_{21}$ and SA $9_{22}$, respectively. Each of the SA $9_{11}$, SA $9_{12}$, SA$_{21}$ and SA $9_{22}$ detects data read through bit lines from the memory cells contained in the MCA $8_1$ or the MCA $8_2$ selected by the column decoder making up the column decoder groups $5_1$ to $5_4$ and amplifies the detected data. Hereinafter, the one MCA and the two SAs between which the one MCA is sandwiched are referred to as a "block" as a whole.

The input/output circuit 2 shown in FIG. 1 includes chiefly an input/output amplifier (not shown), a data input/output circuit (not shown) and a data input/output bus (not shown) adapted to connect the input/output amplifier to the data input/output circuit. The input/output amplifier is mounted on each of the banks $7_1$ to $7_4$ and chiefly includes a data amplifier (not shown) adapted to amplify data fed through an input/output line (not shown) after the data has been detected and amplified by each of the SA $9_{11}$, SA $9_{12}$, SA $9_{21}$ and SA $9_{22}$ and a write amplifier (not shown) adapted to amplify data fed through the data input/output bus from the data input/output circuit.

The data input/output circuit is also mounted on each of the banks $7_1$ to $7_4$ and feeds data input from a data input/output terminal (not shown) through the data input/output bus and, at the same time, sequentially outputs data fed through the data input/output bus from the input/output amplifier from the data input/output terminal.

The control circuit 3, when being triggered by an address signal CAD fed from outside, outputs various signals, with specified timing, depending on the storage capacity (8M bits in this embodiment), the number of banks (4 banks in this embodiment) and the number of rows of memory cell arrays to be refreshed (1K in this embodiment) which are all set by a system designer. That is, the control circuit 3 outputs latch signals $LT_1$ to $LT_4$ each being used to temporarily latch a block selecting signal BS which is generated in the activating circuit 4 and which is used to select any one block out of the blocks making up the memory block 1 and reversed latch signals $/LT_1$ to $/LT_4$ obtained by reversing the latch signals $LT_1$ to $LT_4$.

The control circuit 3 also outputs first control signals $FIRC_1$ to $FIRC_4$ used to control timing with which the row decoder 10 making up the row decoder groups $6_1$ to $6_2$ outputs row address latch signals $RLT_1$ to $RLT_8$ which are output from the activating circuit 4 and are used to temporarily latch the decoded row address, second Control signals $SECC_1$ to $SECC_4$ used to control timing with which the activating circuit 4 outputs main-word timing control signals $MTC_1$ to $MTC_8$ used to control timing with which the row decoder 10 making up row decoder groups $6_1$ to $6_4$ outputs a main-word line activating signal MWAT to activate main word-lines of the corresponding MCA, third control signals $THIC_1$ to $THIC_4$ used to control timing with which sub-word line activating signals $SWAT_1$ to $SWAT_8$ are output, which are output from the activating circuit 4 and are used to activate the sub-word line of the MCA making up any one of blocks contained in the memory block 1 and fourth control signals $FORC_{11}$ to $FORC_{14}$ and $FORC_{21}$ to $FORC_{24}$, used to control timing with which two kinds of SA activating signals, $SAAT_{11}$ to $SAAT_{18}$ making up one kind and $SAAT_{21}$ to $SAAT_{28}$ making up the other kind are output, both of which are output from the activating circuit 4 and are used to activate two SAs making up any one of blocks contained in the memory block 1.

Moreover, the control circuit 3 outputs capacity mode signals $CM_2$, $CM_4$ and $CM_8$ which go high or low depending on the storage capacity (any one of 1M bits, 2M bits, 4M bits and 8M bits) pre-set by the system designer, bank mode signals $BM_1$, $BM_2$ and $BM_4$ which go high or low depending on the number of banks (any one of one, two or four banks) pre-set by the system designer and refresh mode signals $RM_{05}$, $RM_{10}$, $RM_{20}$ and $RM_{40}$ which go high or low depending on the number of rows of memory cell arrays to be refreshed (any one of 512, 1K, 2K [$=2^{11}$] and 4K [$=2^{12}$]). The control circuit 3 also feeds 11-bit column address signals CAD out of the address signals AD supplied from outside to the column decoder groups $5_1$ to $5_4$ and maximum 12-bit row address signals RAD ($RAD_1$ to $RAD_{12}$) to the row decoder groups $6_1$ to $6_4$ and, at the same time, feeds row address higher-order bit signals $RAD_1$ to $RAD_{12}$ being higher-order 3 bit row address signal RAD and reversed row address higher-order signals $/RAD_{10}$ to $/RAD_{12}$ obtained by reversing the signals $RAD_{10}$ to $RAD_{12}$ to the activating circuit 4.

The control circuit 3, when a reliability test on the DRAM such as an analysis on defects is executed, in order to perform screening by applying a voltage being higher than that normally used to all word lines of all the banks $7_1$ to $7_4$, outputs a high-level test mode signal TM used to put all the banks $7_1$ to $7_4$ in the reliability test mode, a test clock TCK being a clock used in the test mode and block forcedly-activating signals $BFAT_1$ to $BFAT_8$ each sequentially rising to go high on the test clock TCK and, irrespective of a state of block selecting signal BS, forcedly activating corresponding one of the blocks making up the memory block 1.

The activating circuit 4, based on the latch signals $LT_1$ to $LT_4$, reversed latch signals $/LT_1$ to $/LT_4$, first control signals $FIRC_1$ to $FIRC_4$, second control signals $SECC_1$ to $SECC_4$, third control signals $THIC_1$ to $THIC_4$, fourth signals $FORC_{11}$ to $FORC_{14}$ and $FORC_{21}$ to $FORC_{24}$, capacity mode signals $CM_2$, $CM_4$ and $CM_8$, bank mode signals $BM_1$, $BM_2$ and $BM_4$, refresh mode signals $RM_{05}$, $RM_{10}$, $RM_{20}$ and $RM_{40}$, row address higher-bit signals $RAD_{10}$ to $RAD_{12}$, reversed row address higher-bit signals $/RAD_{10}$ to $/RAD_{12}$, test signal TM, test clock a TCK and block forcedly-activating signals $BFAT_1$ to $BFAT_8$ all of which are fed from the control circuit 3, generates the block selecting signal BS, with specified timing, depending on storage capacities, the number of banks and the number of rows of memory cell arrays to be refreshed and, at the same time, row address latch signals $RLT_1$ to $RLT_8$, main-word timing control signals $MTC_1$ to $MTC_5$, sub-word line activating signals $SWAT_1$ to $SWAT_8$ and SA activating signals $SAAT_{11}$ to $SAAT_{18}$ and $SAAT_{21}$ to $SAAT_{28}$. Configurations of the activating circuit 4 will be described later in detail.

Each of the column decoder groups $5_1$ to $5_4$ is mounted in a manner so as to correspond to each of the banks $7_1$ to $7_4$ making up the memory block 1, decodes the column address signal CAD fed from the control circuit 3 and is provided with a plurality of column decoders adapted to output column selecting signals used to select a plurality of column selecting switches adapted to put the SAs $9_{11}$, $9_{12}$, $9_{21}$ and $9_{22}$ in a selected state, each of which is connected to the corresponding bit line of the MCA $8_1$ and $8_2$ making up each of the banks $7_1$ to $7_4$. Each of the row decoder groups $6_1$ to $6_4$ is mounted in a manner so as to correspond to each of the banks $7_1$ to $7_4$ making up the memory block 1, decodes the row address signal RAD fed from the control circuit 3 and is provided with a plurality of row decoders 10 each temporarily latching the decoded row address signal by using one of the row address latch signals $RLT_1$ to $RLT_8$ supplied from the activating circuit 4 and then, with timing controlled by main-word timing control signals $MTC_1$ to $MTC_8$ to be fed from the activating circuit 4, output the main-word activating signal MWAT used to put the corresponding main-word lines of the MCA $8_1$ to $8_2$ in a selected state.

Figure 3:
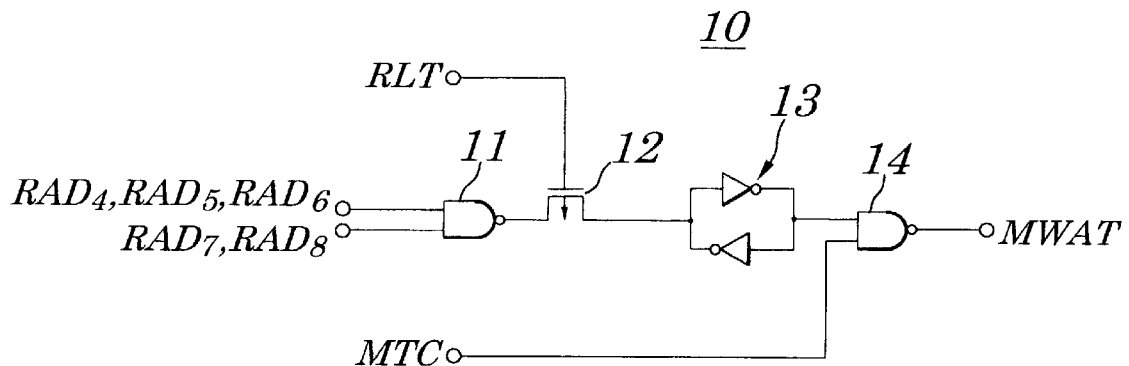
FIG. 3 is a schematic circuit diagram showing one example of configurations of a row decoder employed in the memory according to the embodiment of the present invention.

FIG. 3 is a schematic circuit diagram showing one example of configurations of a row decoder 10 employed in the memory according to the embodiment.

The row decoder 10 of the embodiment includes a decoder 11 adapted to decode fourth to ninth bit address signals $RAD_4$ to $RAD_8$ out of the maximum 12-bit row address signals RAD fed from the control circuit 3, an n-channel MOS transistor 12 which is turned ON by the high-level row address latch signals $RLT_1$ to $RLT_8$ fed from the activating circuit 4 and allows data output from the decoder 11 to be transmitted through, a latch 13 adapted to reverse data signals output from the decoder 11 and to temporarily latch the data signals when the row address latch signals $RLT_1$ to $RLT_8$ are changed to go low to cause the n-channel MOS transistor 12 to turned OFF and a NAND gate 14 adapted to output data read from the latch 13 as the main-word activating signal MWAT when the high-level main-word timing control signals $MTC_1$ to $MTC_8$ are fed from the activating circuit 4. Thus, since the latch 13 is incorporated, even if the row address is changed later, the memory block 1 can remain activated.

Figure 4:
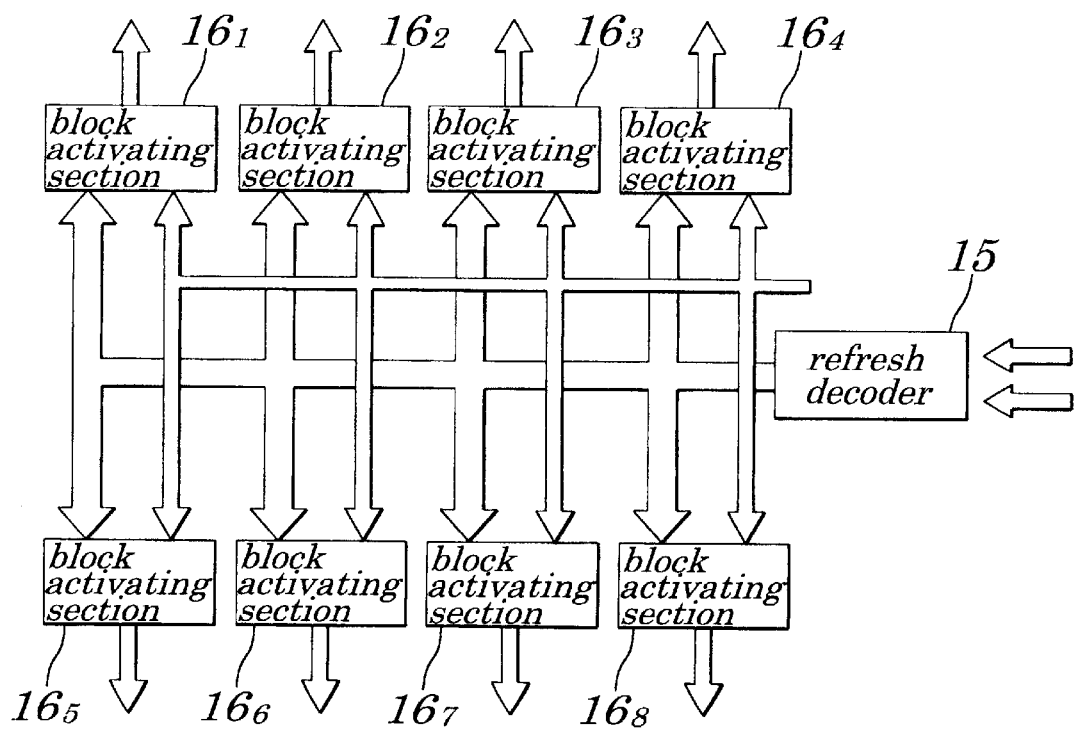
FIG. 4 is a schematic block diagram showing configurations of an activating circuit employed in the memory according to the embodiment of the present invention.

Next, configurations of the activating circuit 4 will be described by referring to FIG. 4 to FIG. 37. The activating circuit 4, as shown in FIG. 4, chiefly includes a refresh decoder 15 and block activating sections $16_1$ to $16_8$.

The refresh decoder 15 decodes signals obtained by combining refresh mode signals $RM_{10}$, $RM_{20}$ and $RM_{40}$ to be fed from the control circuit 3 with row address higher-bit signals $RAD_{10}$ to $RAD_{12}$ and reversed row address higher-bit signals $/RAD_{10}$ to $/RAD_{12}$ and produces block activating designation signals $ATD_1$ to $ATD_{14}$ used to designate a block to be activated. Detailed configurations of the refresh decoder 15 will be explained later. Each of the block activating sections $16_1$ to $16_8$ generates a signal required to activate each of corresponding blocks. The block activating sections $16_1$ to $16_8$ produce block selecting signals BS, based on the latch signals $LT_1$ to $LT_4$ to be fed from the control circuit 3, reversed latch signals $/LT_1$ to $/LT_4$, first control signals $FIRC_1$ to $FIRC_4$, second control signals $SECC_1$ to $SECC_4$, third control signals $THIC_1$ to $THIC_4$, fourth control signals $FORC_{11}$ to $FORC_{14}$ and $FORC_{21}$ to $FORC_{24}$, capacity mode signals $CM_2$, $CM_4$ and $CM_8$, bank mode signals $BM_1$, $BM_2$ and $BM_4$, refresh mode signal $RM_{05}$, test mode signal TM, test clock TCK and block forcedly-activating signals $BFAT_1$ to $BFAT_8$, depending on the storage capacity, the number of banks and the number of rows of memory cell arrays to be refreshed, all of which are set by the system designer, with specified timing and, at the same time, row address latch signals $RLT_1$ to $RLT_8$, main-word timing control signals $MTC_1$ to $MTC_8$, sub-word activating signals $SWAT_1$ to $SWAT_8$, SA activating signals $SAAT_{11}$ to $SAAT_{18}$ and $SAAT_{21}$ to $SAAT_{28}$ and outputs them. Configurations of the block activating sections $16_1$ to $16_8$ will be explained later.

Figure 5:
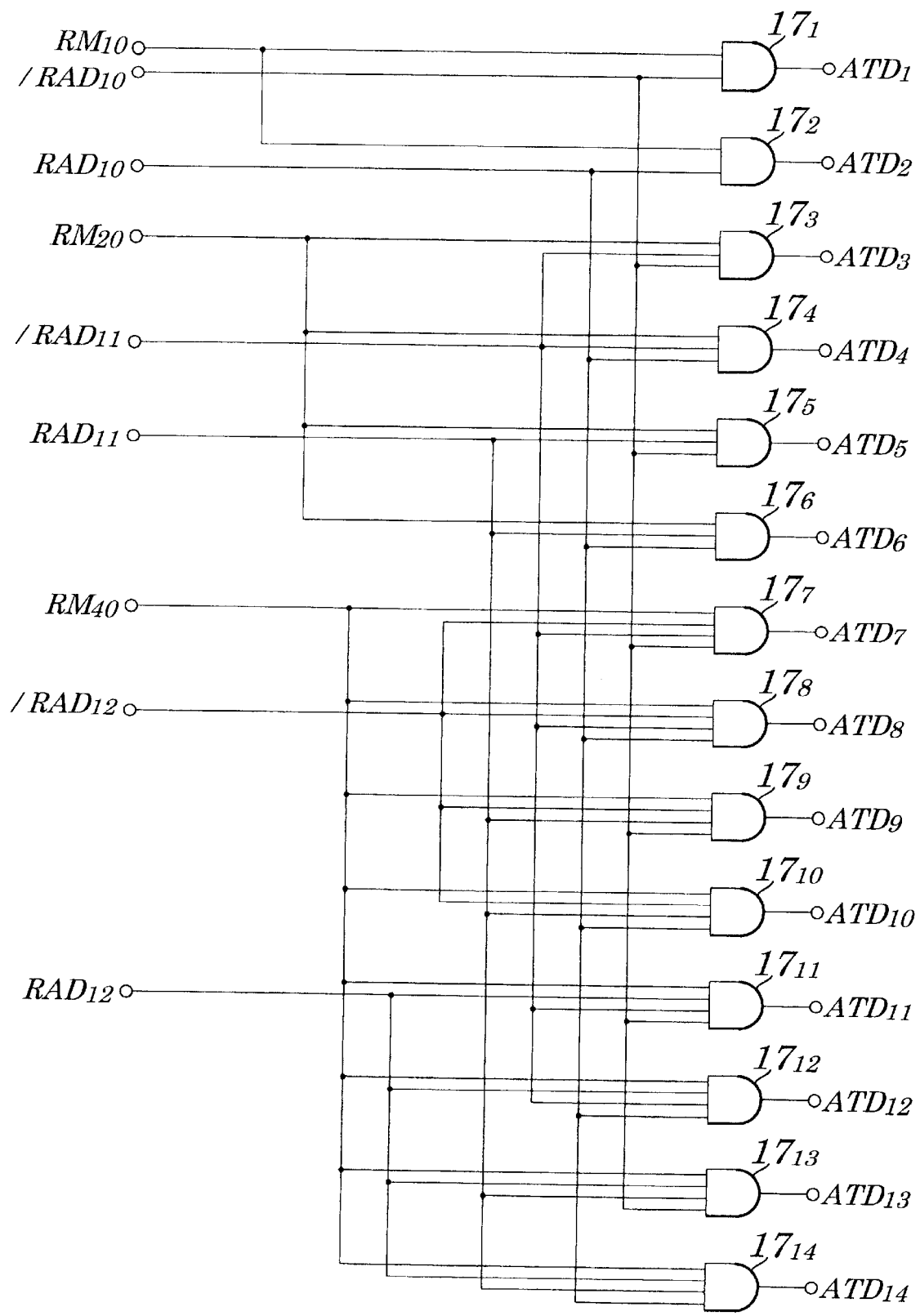
FIG. 5 is a schematic circuit diagram showing one example of configurations of a refresh decoder employed in the memory according to the embodiment of the present invention.

Next, configurations of the refresh decoder 15 will be described by referring to FIG. 5. The refresh decoder 15 includes decoders $17_1$ to $17_{14}$. The decoder $17_1$ decodes signals obtained by combining the refresh mode signal $RM_{10}$, which goes high when the system designer sets the number of rows of memory cell arrays to be refreshed at 1k, with reversed row address higher-bit signal $/RAD_{10}$ and produces the block activating designation signal $ATD_1$ used to designate the block to be activated. The decoder $17_2$ decodes signals obtained by combining the refresh mode signal $RM_{10}$ with the row address higher-bit signal $RAD_{10}$ and generates the block activating designation signal $ATD_2$ used to designate the block to be activated. The decoder $17_3$ decodes signals obtained by combining refresh mode signal $RM_{20}$, which goes high when the system designer sets the number of rows of memory cell arrays to be refreshed at 2k, with the reversed row address higher-bit signal $/RAD_{10}$ and with reversed row address higher-bit signal $/RAD_{11}$ and generates the block activating designation signal $ATD_3$ used to designate the block to be activated. The decoder $17_4$ decodes signals obtained by combining the refresh mode signal $RM_{20}$ with the row address higher-bit signal $RAD_{10}$ and with the reversed row address higher-bit signal $/RAD_{11}$ and generates the block activating designation signal $ATD_4$ used to designate the block to be activated. The decoder $17_5$ decodes signals obtained by combining the refresh mode signal $RM_{20}$ with reversed row address higher-bit signal $/RAD_{10}$ and with row address higher-bit signal $RAD_{11}$ and generates the block activating designation signal $ATD_5$ used to designate the block to be activated. The decoder $17_6$ decodes signals obtained by combining the refresh mode signal $RM_{20}$ with the row address higher-bit signal $RAD_{10}$ and with the row address higher-bit signal $RAD_{11}$ and generates the block activating designation signal $ATD_6$ used to designate the block to be activated. The decoder $17_7$ decodes signals obtained by combining the refresh mode signal $RM_{40}$, which goes high when the system designer sets the number of rows of memory cell arrays to be refreshed at 4 k, with the reversed row address higher-bit signal $/RAD_{10}$, with the reversed row address higher-bit signal $/RAD_{11}$ and with the reversed row address higher-bit signal /$RAD_{12}$ and generates the block activating designation signal $ATD_7$ used to designate the block to be activated. The decoder $17_8$ decodes signals obtained by combining the refresh mode signal $RM_{40}$ with the row address higher-bit signal $RAD_{10}$, with the reversed row address higher-bit signal /$RAD_{11}$ and with the reversed row address higher-bit signal /$RAD_{12}$ and generates the block activating designation signal $ATD_8$ used to designate the block to be activated. The decoder $17_9$ decodes signals obtained by combining the refresh mode signal $RM_{40}$ with the reversed row address higher-bit signal /$RAD_{10}$, with the row address higher-bit signal $RAD_{11}$ and with the reversed row address higher-bit signal /$RAD_{12}$ and generates the block activating designation signal $ATD_9$ used to designate the block to be activated. The decoder $17_{10}$ decodes signals obtained by combining the refresh mode signal $RM_{40}$ with the row address higher-bit signal $RAD_{10}$, with the row address higher-bit signal $RAD_{11}$ and with the reversed row address higher-bit signal /$RAD_{12}$ and generates the block activating designation signal $ATD_{10}$ used to designate the block to be activated. The decoder $17_{11}$ decodes signals obtained by combining the refresh mode signal $RM_{40}$ with the reversed row address higher-bit signal /$RAD_{10}$, with the reversed row address higher-bit signal /$RAD_{11}$ and with the row address higher-bit signal $RAD_{12}$ and generates the block activating designation signal $ATD_{11}$ used to designate the block to be activated. The decoder $17_{12}$ decodes signals obtained by combining the refresh mode signal $RM_{40}$ with the row address higher-bit signal $RAD_{10}$, with the reversed row address higher-bit signal /$RAD_{11}$ and with the row address higher-bit signal $RAD_{12}$ and generates the block activating designation signal $ATD_{12}$ used to designate the block to be activated. The decoder $17_{13}$ decodes signals obtained by combining the refresh mode signal $RM_{40}$ with the reversed row address higher-bit signal /$RAD_{10}$, with the row address higher-bit signal $RAD_{11}$ and with the row address higher-bit signal $RAD_{12}$ and generates the block activating designation signal $ATD_{13}$ used to designate the block to be activated. The decoder $17_{14}$ decodes signals obtained by combining the refresh mode signal $RM_{40}$ with the row address higher-bit signal $RAD_{10}$, with the row address higher-bit signal $RAD_{11}$ and with the row address higher-bit signal $RAD_{12}$ and generates the block activating designation signal $ATD_{14}$ used to designate the block to be activated.

Figure 6:
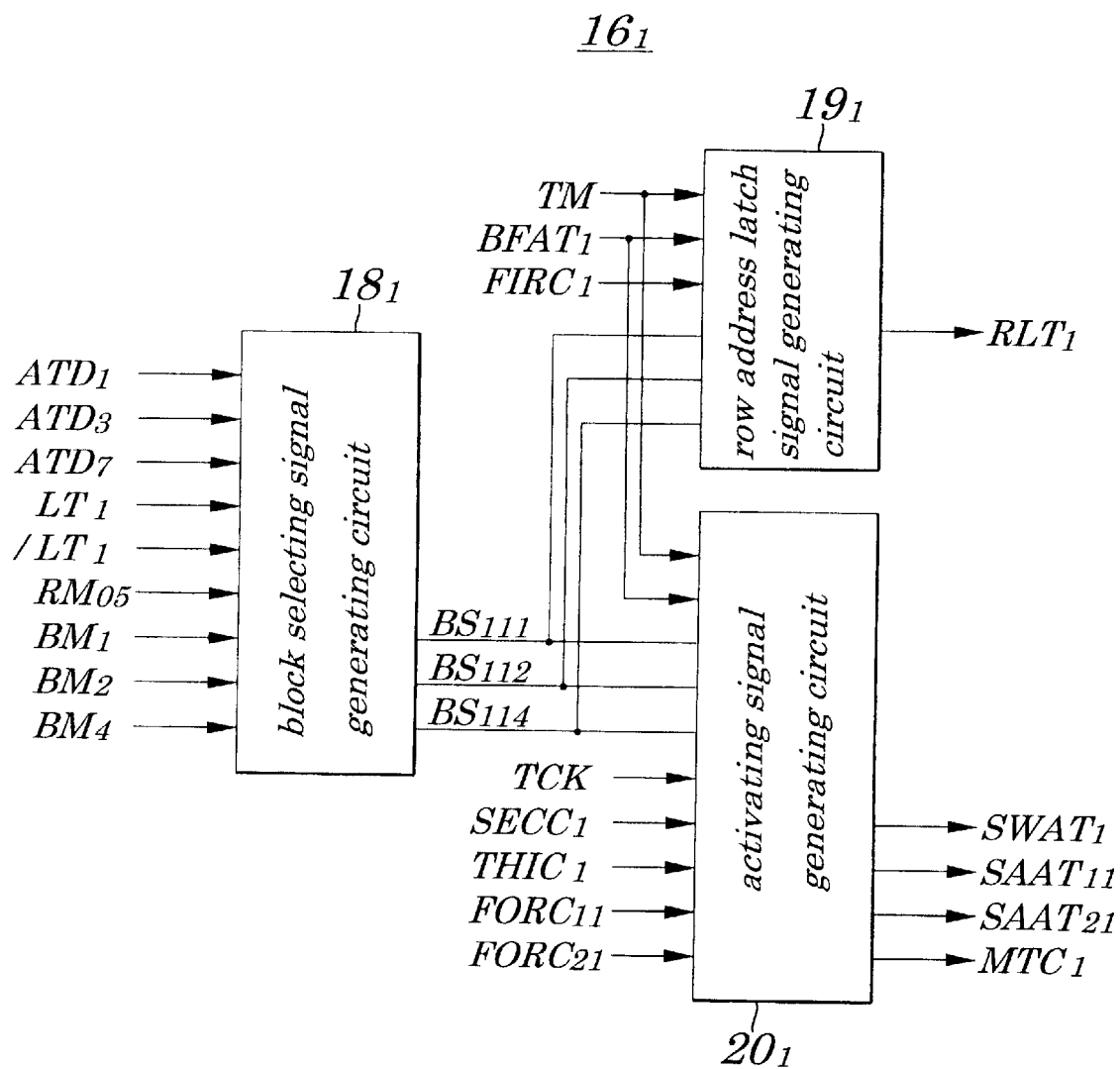
FIG. 6 is a schematic block diagram showing configurations of one block activating section employed in the memory according to the embodiment of the present invention.

Next, configurations of the block activating sections $16_1$ to $16_8$ will be described by referring to FIG. 6 to FIG. 37. The block activating section $16_1$ includes, as shown in FIG. 6, a block selecting signal generating circuit $18_1$, a row address latch signal generating circuit $19_1$ and an activating signal generating circuit $20_1$. The block selecting signal generating circuit $18_1$, based on the block activating designation signals $ATD_1$, $ATD_3$ and $ATD_7$ to be supplied from the refresh decoder 15, the latch signal $LT_1$ and reversed latch signal /$LT_1$ to be supplied from the control circuit 3, the refresh mode signal $RM_{05}$, and based on bank mode signals $BM_1$, $BM_2$ and $BM_4$, generates any one of the block selecting signal $BS_{111}$ used to activate the first block, if a memory block 1 is made up of one bank, using the whole blocks belonging to the one bank, a block selecting signal $BS_{112}$ used to activate the first block, when the memory block 1 is made up of four banks, using the whole blocks belonging to the first bank and a block selecting signal $BS_{114}$ used to activate the first block, if the memory block 1 is made up of four banks, using the whole blocks belonging to the first bank.

Figure 7:
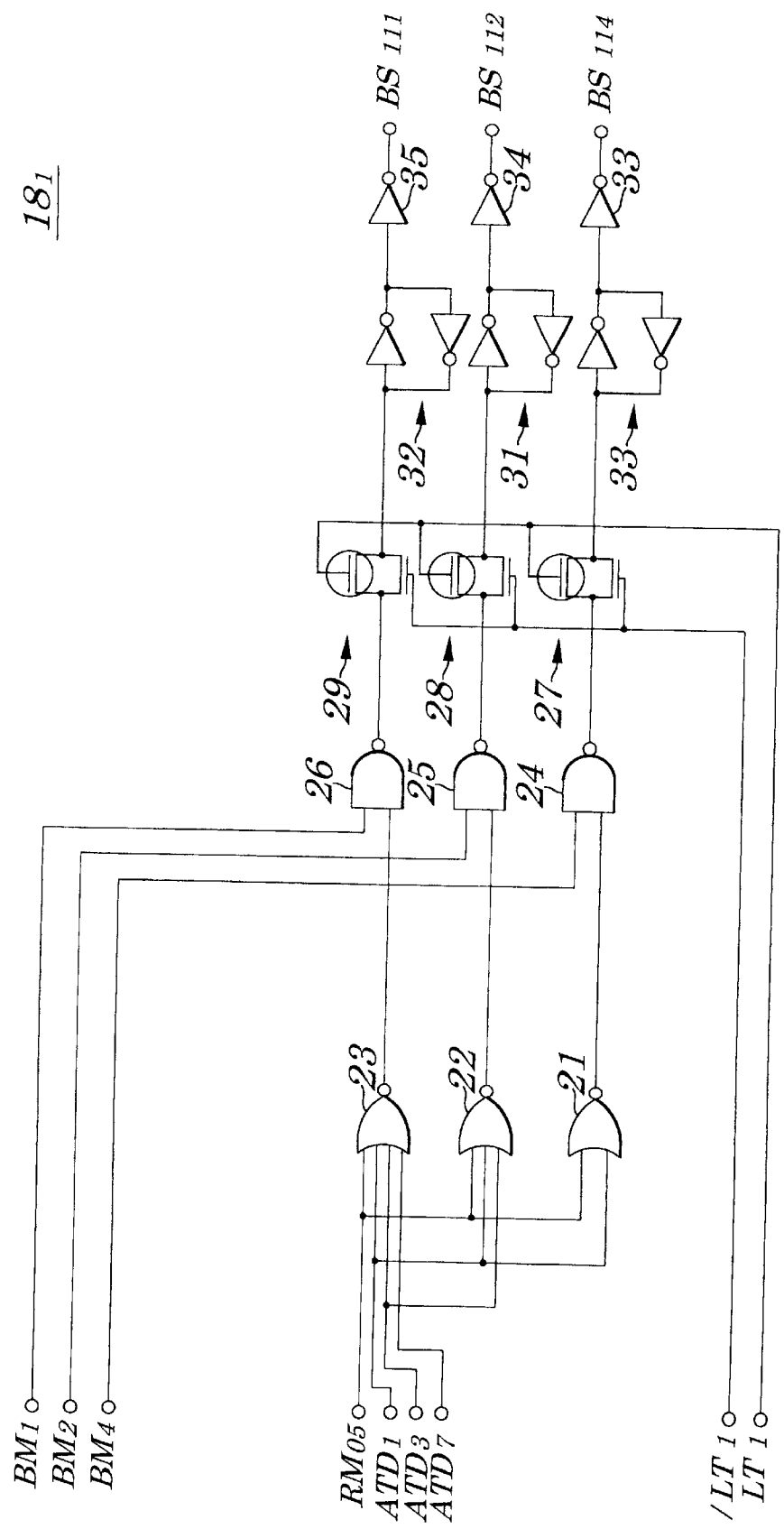
FIG. 7 is a schematic block diagram showing one example of configurations of a block selecting signal generating circuit employed in the memory according to the embodiment of the present invention.

FIG. 7 is a schematic block diagram showing one example of configurations of a block selecting signal generating circuit $18_1$ employed in the memory according to the embodiment. The block selecting signal generating circuit $18_1$ includes an OR gate 21 having two inputs, an OR gate 22 having three inputs, an OR gate 23 having four inputs, NAND gates 24 to 26 each having two inputs, transfer gates 27 to 29, latches 30 to 32 and inverters 33 to 35. When either of the refresh mode signal $RM_{05}$ which goes high when the system designer sets the number of rows of memory cell arrays to be refreshed at 512 or the high-level block activating designation signal $ATD_1$ which is produced when the system designer sets the number of rows of memory cell arrays to be refreshed at 1k and when a high-level reversed row address higher-bit signal /$RAD_{10}$ is fed to the OR gate 21, a high-level signal is output from the OR gate 21. Therefore, when the output high-level signal is input to the NAND gate 24 and if the high-level bank mode signal $BM_4$ to be supplied when the system designer sets the number of banks at four, has been fed to the NAND gate 24, a low-level signal is output from the NAND gate 24, which passes through the transfer gate 27 being turned ON and is reversed by the latch 30 to go high and is again reversed by the inverter 33 to go low and is then output as the low-level block selecting signal $BS_{114}$ used to select the first block, if the memory block 1 is made up of four banks, by using the whole blocks belonging to the first bank. Then, when the high-level latch signal $LT_1$ and the low-level reversed latch signal /$LT_1$ used to temporarily latch the block selecting signal BS to be supplied to all blocks belonging to the first bank are fed from the control circuit 3 to the transfer gate 27, the transfer gate 27 is turned OFF. While the transfer gate 27 is in an OFF state, a state of the block selecting signal $BS_{114}$ obtained before being reversed is being latched by the latch 30. Moreover, an aim of temporarily holding the state of the block selecting signal $BS_{114}$ obtained before being reversed in the latch 30 by using the high-level latch signal $LT_1$ and the low-level reversed latch signal /$LT_1$ is to prevent the block being now operated from becoming inactivated even when other blocks are activated at later time compared with the block being now operated. The latches 31 and 32 are mounted because of the same reasons as above.

When the high-level refresh mode signal $RM_{05}$ and either of the high-level block activating designation signal $ATD_3$ or the block activating designation signal $ATD_3$ which is produced when the system designer sets the number of rows of memory cell arrays to be refreshed at 2k and when the high-level reversed row address higher-bit signal /$RAD_{10}$ and the high-level reversed row address higher-bit signal /$RAD_{11}$ are supplied, are fed to the OR gate 22, a high-level signal is output from the OR gate 22. Therefore, if the bank mode signal $BM_2$ to be supplied when the system designer sets the number of banks at two, has been fed to the NAND gate 25, a low level signal is output from the NAND gate 25, which passes through the transfer gate 28 and is reversed by the latch 31 to go high and is again reversed by the inverter 34 to go low and then is output as the low-level block selecting signal $BS_{112}$ used to select the first block, if the memory block 1 is made up of two banks, by using the whole blocks belonging to the first bank. Then, when the high-level latch signal $LT_1$ and the low-level reversed latch signal /$LT_1$ are fed from the control circuit 3 to the transfer gate 28, the transfer gate 28 is turned OFF. While the transfer gate 28 is in an OFF state, a state of the block selecting signal $BS_{112}$ obtained before being reversed is being latched by the latch 31.

When the high-level refresh mode signal $RM_{05}$ and any one of the block activating designation signal $ATD_1$, block activating designation signal $ATD_3$ and the block activating designation. signal $ATD_7$ produced when the system designer sets the number of rows of memory cell arrays to be refreshed at 4k and when the high-level reversed row address higher-bit signal $/RAD_{10}$, the high-level reversed row address higher-bit signal $/RAD_{11}$ and the high-level reversed row address higher-bit signal $ATD_7$ are supplied, are fed to the OR gate 23, a high-level signal is output from the OR gate 23. Therefore, if the bank mode signal $BM_1$ produced because the system designer had set the number of banks at one, has been fed to the NAND gate 26, a low level signal is output from the NAND gate 26, which passes through the transfer gate 29 and is reversed by the latch 32 to go high and is again reversed to go low by the inverter 35 and is then output as the low-level block selecting signal $BS_{111}$ used to select the first block, if the memory block 1 is made up of one bank, by using the whole blocks belonging to the bank. Then, when the high-level latch signal $LT_1$ and the low-level reversed latch signal $/LT_1$ are fed from the control circuit 3 to the transfer gate 29, the transfer gate 29 is turned OFF. While the transfer gate 29 is in an OFF state, a state of the block selecting signal $BS_{111}$ obtained before being reversed is latched by the latch 32. Moreover, when the system designer sets the number of rows of memory cell arrays to be refreshed at 512, the high-level refresh mode signal $RM_{05}$ is fed and even when the system designer sets the number of banks to any value, one of the block selecting signals BS is output. This is because no block activating designation signal ATD is produced, as is understood from FIG. 5.

The row address latch signal generating circuit $19_1$, based on the first control signal $FIRC_1$ fed from the control circuit 3, test mode signal TM, block forcedly-activating signal $BFAT_1$, and block selecting signals $BS_{111}$, $BS_{112}$ and $BS_{114}$, generates the row address latch signal $RLT_1$ used to temporarily latch the row address decoded by the row decoder 10 (see FIG. 3) and to feeds it to the first block.

Figure 8:
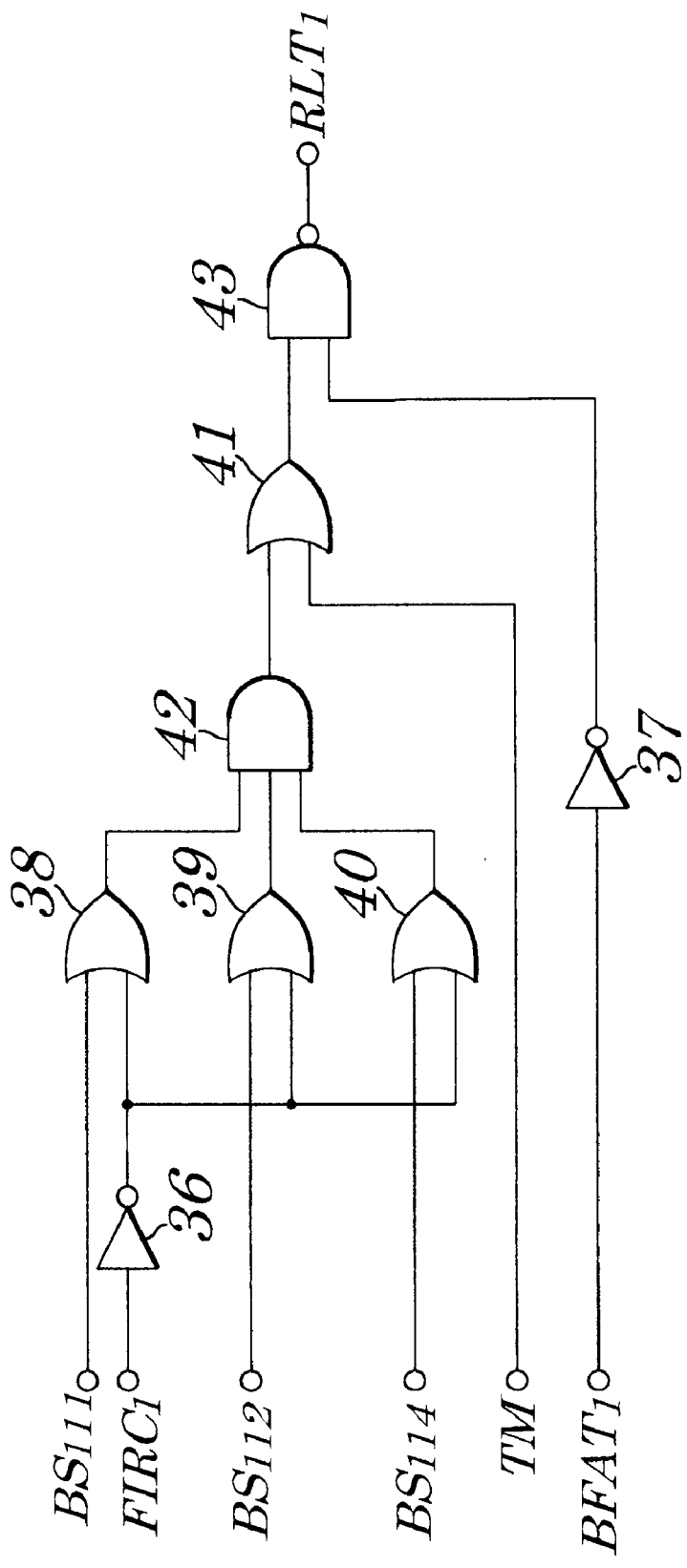
FIG. 8 is a schematic block diagram showing one example of configurations of a row address latch signal generating circuit employed in the memory according to the embodiment of the present invention.

FIG. 8 is a schematic block diagram showing one example of configurations of the row address latch signal generating circuit $19_1$. The row address latch signal generating circuit $19_1$ includes inverters 36 and 37, OR gates 38 to 41 each having two inputs, AND gate 42 having three inputs and NAND gate 43 each having two inputs. In a state where all the block selecting signals $BS_{111}$, $BS_{112}$ and $BS_{114}$ are fed as high-level signals from the block selecting signal generating circuit $18_1$ and, at the same time, the first control signal $FIRC_1$ used to control timing of outputting the row address latch signal $RLT_1$ to the first bank is fed as the low-level signal, since a high-level signal is output from any one of the OR gates 38 to 41, a high-level signal is output from the AND gate 42. Moreover, normally, the test mode signal TM and the block forcedly-activating signal $BFAT_1$ are fed as low-level signals. Therefore, in this state, the low-level row address latch signal $RLT_1$ is output from the NAND gate 43. Next, even when any one of the block selecting signals $BS_{111}$, $BS_{112}$ and $BS_{114}$ is fed as the low-level signal, if the first control signal $FIRC_1$ remains at a low level, no changes occur. Then, when the first control signal $FIRC_1$ changes to go high, since any one of the block selecting signals $BS_{111}$, $BS_{112}$ and $BS_{114}$ has been changed to be at a high level, a low-level signal is output from the OR gate 38 to 41 to which any one of the block selecting signals $BS_{111}$, $BS_{112}$ and $BS_{114}$ has been fed. Since this causes the AND gate 42 to output a low-level signal, the row address latch signal $RLT_1$ is output from the NAND gate 43 and is then fed to the first block. That is, after the row address signal generating circuit $19_1$ has been selected from 8 pieces of the row address signal generating circuits $19_1$ to $19_8$ by any one of the high-level block selecting signals $BS_{111}$, $BS_{112}$ and $BS_{114}$, the high-level row address latch signal $RLT_1$ is output with timing in which the first control signal $FIRC_1$ changes to go high and is fed to the first block. Moreover, at a time of the test, since the test mode signal TM changes to go high, irrespective of supply of the block selecting signals $BS_{111}$, $BS_{112}$ and $BS_{114}$ and the first control signal $FIRC_1$, with timing in which the block forcedly-activating signal $BFAT_1$ changes to go high, the high-level row address latch signal $RLT_1$ is output.

The activating signal generating circuit $20_1$ shown in FIG. 6, based on the second control signal $SECC_1$, third control signal $THIC_1$, fourth control signals $FORC_{11}$ and $FORC_{21}$, test mode signal TM, test clock TCK and block forcedly-activating signal $BFAT_1$ all of which are fed from the control circuit 3, and based on the block selecting signals $BS_{111}$, $BS_{112}$ and $BS_{114}$ fed from the block selecting signal generating circuit $18_1$, generates the sub-word activating signal $SWAT_1$ used to activate the sub-word line of the MCA making up the first block contained in the memory block 1, two kinds of SA activating signals $SAAT_{11}$ and $SAAT_{21}$ used to activate two SAs making up the first block contained in the memory block 1 and the main-word timing control signal $MTC_1$ used to control timing with which the row decoder 10 outputs the main-word activating signal MWAT and then feeds them to the first block.

Figure 9:
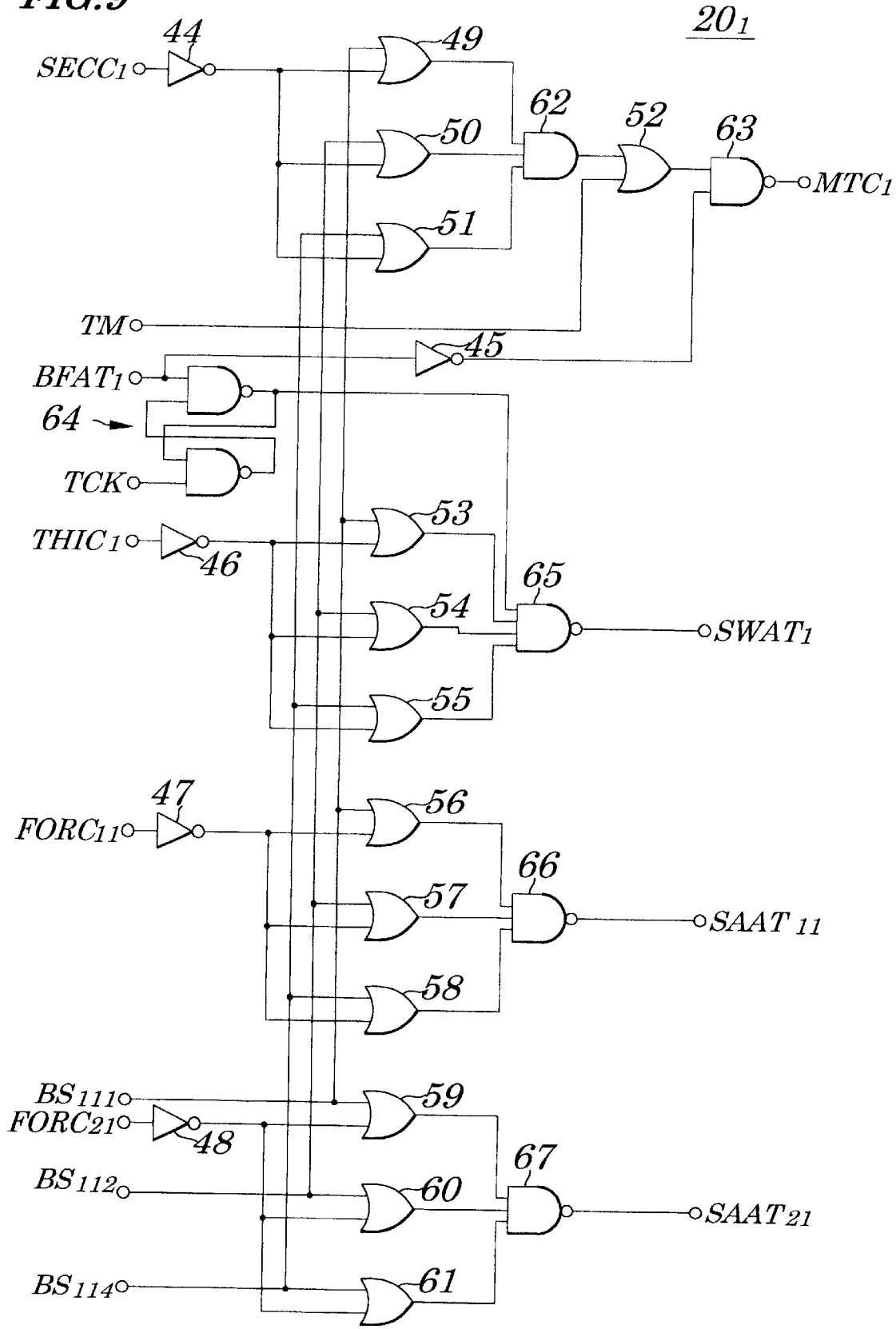
FIG. 9 is a schematic block diagram showing one example of configurations of an activating signal generating circuit employed on the memory according to the embodiment of the present invention.

FIG. 9 is a schematic block diagram showing one example of configurations of the activating signal generating circuit $20_1$ employed in the memory according to the embodiment. The activating signal generating circuit $20_1$ of the embodiment includes inverters 44 to 48, OR gates 49 to 61, each having two inputs, AND gate 62 having three inputs, NAND gate 63 having two inputs, SR latch 64, NAND gate 65 having four inputs and NAND gates 66 and 67 each having three inputs. In a state where all the block selecting signals $BS_{111}$, $BS_{,112}$ and $BS_{114}$ are fed as high-level signals from the block selecting signal generating circuit $18_1$ and, at the same time, the second control signal $SECC_1$ used to control timing with which the main-word timing control signal $MTC_1$ is output to the first bank is fed as the low-level signal, since a high-level signal is output from any one of the OR gates 49 to 51, a high-level signal is output from the AND gate 62. Normally, all the test mode signal TM and block forcedly-activating signal $BFAT_1$ are fed as low-level signals. Therefore, in this state, the low-level main-word timing control signal $MTC_1$ is output from the NAND gate 63. Next, even when any one of the block selecting signals $BS_{111}$, $BS_{112}$ and $BS_{114}$ is fed as low-level signals, if the second control signal $SECC_1$ remains at a low level, no changes occur. Then, when the second control signal $SECC_1$ changes to go high, since one of the block selecting signals $BS_{111}$, $BS_{112}$ and $BS_{114}$ has been changed to be at a low level, a low-level signal is output from the OR gate to which any one of the block selecting signals has $BS_{111}$, $BS_{112}$ and $BS_{114}$ been fed. This causes the AND gate 62 to output a low-level signal and the NAND gate 63 to output the high-level main-word timing control signal $MTC_1$ which is then fed to the first block. That is, after the activating signal generating circuit $20_1$ has been selected from 8 pieces of the activating signal generating circuits $20_1$ to $20_8$ by any one of the low-level block selecting signals $BS_{111}$, $BS_{112}$ and $BS_{114}$, the high-level main-word timing control signal $MTC_1$ is output with timing in which the second control signal $SECC_1$ changes to go high and is fed to the first block. Moreover, at a time of the test, since the test mode signal TM changes to go high, irrespective of supply of the block selecting signal $BS_{111}$, $BS_{112}$ and $BS_{114}$ and the second control signal $SECC_1$, with timing in which the block forcedly activating signal $BFAT_1$ changes to go high, the high-level main-word timing control signal $MTC_1$ is output.

In a state where all the block selecting signals $BS_{111}$, $BS_{112}$ and $BS_{114}$ are fed as high-level signals from the block selecting signal generating circuit $18_1$ and, at the same time, the third control signal $THIC_1$ used to control timing with which the sub-word activating signal $SWAT_1$ is output to the first bank is fed as the low-level signal, a high-level signal is output from all the OR gates 53 to 55. Normally, since the block forcedly-activating signal $BFAT_1$ is fed as a low-level signal and the test clock TCK is not fed, a high-level signal is output from the SR latch 64. Therefore, in this state, the low-level sub-word activating signal $SWAT_1$ is output from the NAND gate 65. Next, even when any one of the block selecting signals $BS_{111}$, $BS_{112}$ and $BS_{114}$ is fed as the low-level signal, if the third control signal $THIC_1$ remains at a low level, no changes occur. When the third control signal $THIC_1$ changes to go high, since any one of the block selecting signals $BS_{111}$, $BS_{112}$ and $BS_{114}$ has been changed to be at a low level, a low-level signal is output from the OR gate to which any one of the block selecting signals $BS_{111}$, $BS_{112}$ and $BS_{114}$ has been fed. This causes the NAND gate 65 to output the high-level sub-word activating signal $SWAT_1$ which is then fed to the first block. That is, after the activating signal generating circuit $20_1$ has been selected from 8 pieces of the activating signal generating circuits $20_1$ to $20_8$ by any one of the high-level block selecting signals $BS_{111}$, $BS_{112}$ and $BS_{114}$, a high-level sub-word activating signal $SWAT_1$ is output with timing in which the third control signal $THIC_1$ changes to go high and is fed to the first block. Moreover, at a time of the test, the test clock TCK is first fed and, after the block forcedly-activating signal $BFAT_1$ has risen to go high at a time of a first rise of the test clock TCK, an output signal from the SR latch 64 changes to go low at a time of a fist fall of the test clock TCK. Therefore, the high-level sub-word activating signal $SWAT_1$ is output, irrespective of supply of the block selecting signals $BS_{111}$, $BS_{112}$ and $BS_{114}$ and the third control signal $THIC_1$, with timing in which the test clock TCK first falls.

In a state where all the block selecting signals $BS_{111}$, $BS_{112}$ and $BS_{114}$ are fed as high-level signals from the block selecting signal generating circuit $18_1$ and, at the same time, the fourth control signals $FORC_{11}$ and $FORC_{21}$ used to control timing in which two kinds of the SA activating signals $SAAT_1$ and $SAAT_2$ are output to the first bank are fed as low-level signals, a high-level signal is output from all the OR gates 56 to 61. Therefore, in this state, the low-level SA activating signals $SAAT_{11}$ and $SAAT_{21}$ are output from both the NAND gates 66 and 67. Next, even when any one of the block selecting signals $BS_{111}$, $BS_{112}$ and $BS_{114}$ is fed as the low-level signal, if both the fourth control signals $FORC_{11}$ and $FORC_{21}$ remain at a low level, no changes occur. When the fourth control signal $FORC_{11}$ changes to go high, since any one of the block selecting signals $BS_{111}$, $BS_{112}$ and $BS_{114}$ has been changed to be at a low level, a low-level signal is output from the OR gate to which the fourth control signal $FORC_{11}$ is fed. This causes the NAND gate 66 to output the high-level SA activating signal $SATT_{11}$, which is then fed to the first block. Moreover, when the fourth control signal $FORC_{21}$ changes to go high, since any one of the block selecting signals $BS_{111}$, $BS_{112}$ and $BS_{114}$ has been changed to be at a low level, a low-level signal is output from the OR gate to which any one of the block selecting signals $BS_{111}$, $BS_{112}$ and $BS_{114}$ has been fed. This causes the NAND gate 67 to output a high-level SA activating signal $SATT_{21}$, which is then fed to the first block. That is, after the activating signal generating circuit $20_1$ has been selected from 8 pieces of the activating signal generating circuits $20_1$ to $20_8$ by any one of the high-level block selecting signals $BS_{111}$, $BS_{112}$ and $BS_{114}$, the high-level SA activating signals $SAAT_{11}$ and $SAAT_{21}$ are sequentially output with timing in which the fourth control signals $FORC_{11}$ and $FORC_{21}$ change sequentially to go high, which are then fed to the first block.

Figure 10:
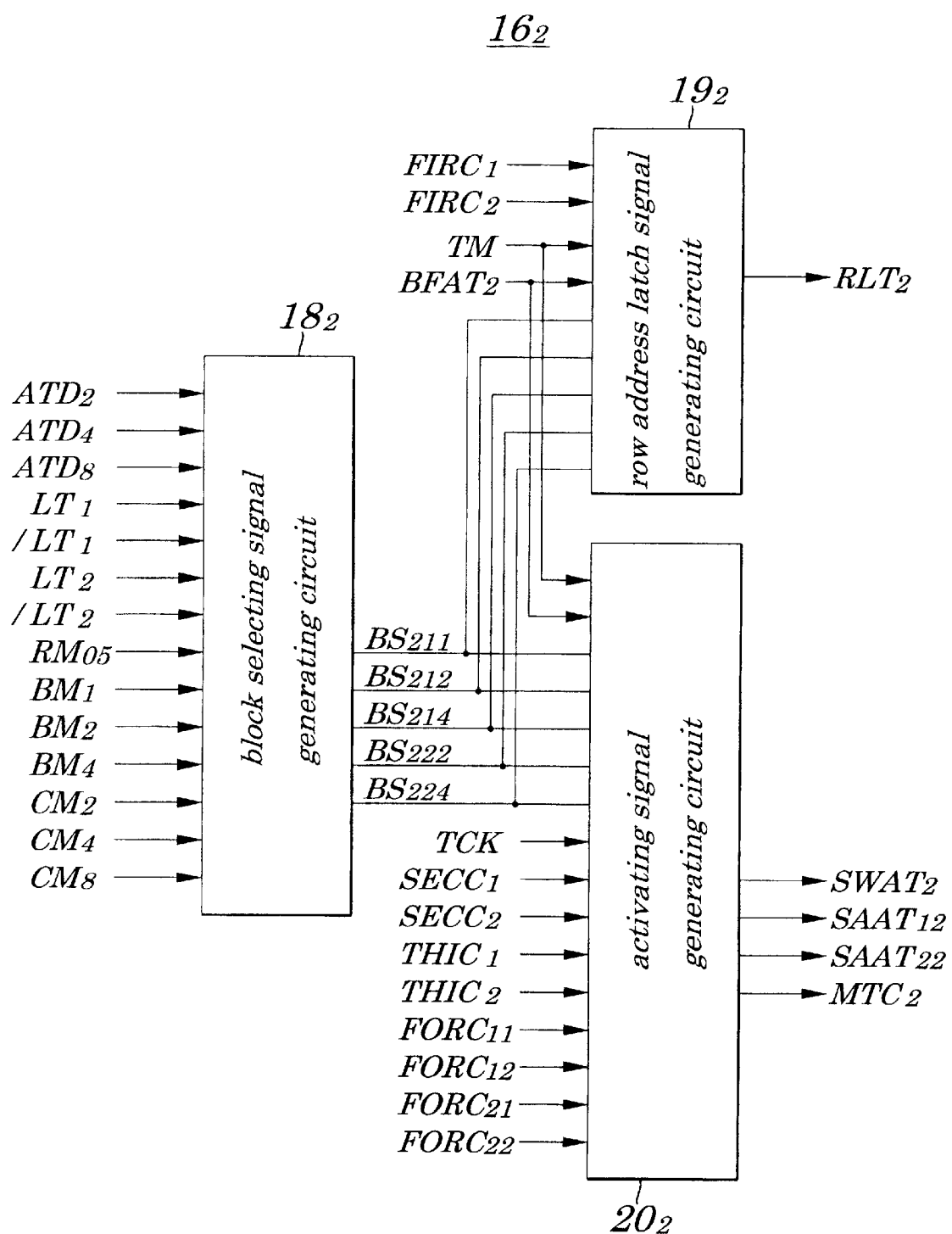
FIG. 10 is a schematic block diagram showing configurations of another block activating section employed in the memory according to the embodiment of the present invention.

The block activating section $16_2$, as shown in FIG. 10, includes a block selecting signal generating circuit $18_2$, a row address latch signal generating circuit $19_2$ and an activating signal generating circuit $20_2$.

The block selecting signal generating circuit $18_2$, based on the block activating designation signals $ATD_2$, $ATD_4$ and $ATD_8$ fed from the refresh decoder 15, latch signals $LT_1$ and $LT_2$, reversed latch signals $/LT_1$ and $/LT_2$, refresh mode signal $RM_{05}$, bank mode signals $BM_1$, $BM_2$ and $BM_4$ and capacity mode signals $CM_2$, $CM_4$ and $CM_8$ all of which are fed from the control circuit 3, generates any one of a block selecting signal $BS_{211}$ used to activate the second block, if the memory block 1 is made up of one bank, by using the whole blocks belonging to the bank, a block selecting signal $BS_{212}$ used to activate the second block, if the memory block 1 is made up of two banks, by using the whole blocks belonging to the first bank, a block selecting signal $BS_{214}$ used to activate the second block, if the memory block 1 is made up of four banks, by using the whole blocks belonging to the first bank, a block selecting signal $BS_{222}$ used to activate the second block, if the memory block 1 is made up of two banks, by using the whole blocks belonging to the second bank and a block selecting signal $BS_{224}$ used to activate the second block, if the memory block 1 is made up of four banks, by using the whole blocks belonging to the second bank.

Figure 11:
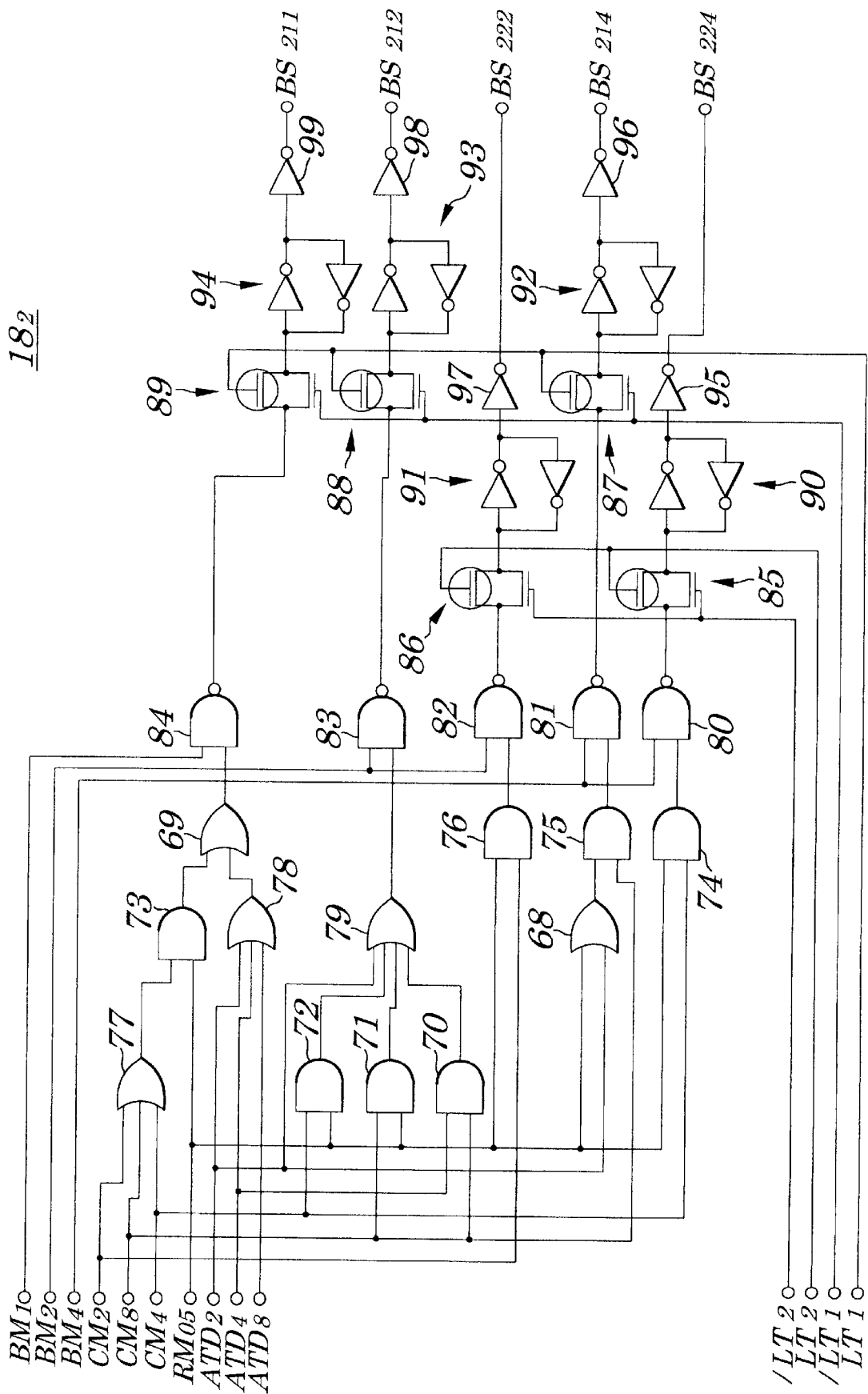
FIG. 11 is a schematic block diagram showing one example of configurations of another block selecting signal generating circuit employed in the memory according to the embodiment of the present invention.

FIG. 11 is a schematic block diagram showing one example of configurations of the block selecting signal generating circuit $18_2$ employed in the memory according to the embodiment. The block selecting signal generating circuit $18_2$ of the embodiment includes OR gates 68 and 69 each having two inputs, AND gates each having two inputs, OR gate having three inputs, OR gate 79 having four inputs, NAND gates 80 to 84 each having two inputs, transfer gates 85 to 89, latches 90 to 94 and inverters 95 to 99. When the refresh mode signal $RM_{05}$ which goes high when the system designer sets the number of rows of memory cell arrays to be refreshed at 512 and the capacity mode signal $CM_4$ which goes high when the system designer sets a storage capacity at 4M bits are fed simultaneously, a high-level signal is output from the AND gate 74. Therefore, if the bank mode signal $BM_4$ which has gone high because the system designer had set the number of banks at 4, has been fed, a low-level signal is output from the NAND gate 80, which passes through the transfer gate 85 being turned ON and is reversed by the latch 90 to go high and then is again reversed by the inverter 95 to go low and is then output as the low-level block selecting signal $BS_{224}$ used to select the second block, if the memory block 1 is made up of four banks, by using the whole blocks belonging to the second bank. Then, when the high-level latch signal $LT_2$ and the low-level reversed latch signal $/LT_2$ used to temporarily latch the block selecting signal BS to be fed to all the blocks belonging to the second bank are fed from the control circuit 3, since the transfer gate 85 is turned OFF, while it is in an OFF state, a state of the block selecting signal $BS_{224}$ obtained before being reversed is being latched by the latch 85. Moreover, an aim of temporarily holding the state of the block selecting signal $BS_{224}$ obtained before being reversed in the latch 85 by using the high-level latch signal $LT_2$ and the low-level reversed latch signal /LT$_2$ is to prevent the block being now operated from becoming inactivated even when other blocks are activated at a later time compared with the block being now operated. The latches 91 to 94 are mounted because of the same reasons as above.

When either the high-level refresh mode signal RM$_{05}$ or the block activating designation signal ATD$_2$ which is produced when the system designer sets the number of rows of memory cell arrays to be refreshed at 1k and when the high-level row address higher-bit signal RAD$_{10}$ is fed and the capacity mode signal CM$_8$ which goes high when the system designer sets a storage capacity at 8M bits, are fed simultaneously, a high-level signal is output from the AND gate 75. Therefore, if the high-level bank mode signal BM$_4$ has been fed, a low-level signal is output from the NAND gate 81, which passes through the transfer gate 87 being turned ON and is reversed by the latch 92 to go high and is again reversed by the inverter 96 to go low and is then output as the low-level block selecting signal BS$_{214}$ used to activate the second block, if the memory block 1 is made up of four banks, by using the whole blocks belonging to the first bank. Then, when the high-level latch signal LT$_1$ and low-level reversed latch signal /LT$_1$ used to temporarily latch the block selecting signal BS to be fed to all the blocks belonging to the second bank are fed from the control circuit 3, since the transfer gate 87 is turned OFF, while it is in an OFF state, a state of the block selecting signal BS$_{214}$ obtained before being reversed is being latched by the latch 92.

Also, when both the high-level refresh mode signal RM$_{05}$ and the capacity mode signal CM$_8$ which goes high when the system designer sets the storage capacity at 2M bits, are fed simultaneously, a high-level signal is output from the AND gate 76. Therefore, if the high-level bank mode signal BM$_4$ produced because the system designer had set the number of banks at 2, has been fed, a low-level signal is output from the NAND gate 82 and, which passes through the transfer gate 86 being turned ON and is reversed by the latch 91 to go high and then is again reversed by the inverter 97 to go low, which is then output as the low-level block selecting signal BS$_{222}$ used to activate the second block, if the memory block 1 is made up of two banks, by using the whole blocks belonging to the second bank. Then, when the high-level latch signal LT$_2$ and the low-level reversed latch signal /LT$_2$ are fed from the control circuit 3, since the transfer gate 86 is turned OFF, while it is in an OFF state, a state of the block selecting signal BS$_{214}$ obtained before being reversed is being latched by the latch 91.

When both the block activating designation signal ATD$_4$ which is generated when the system designer sets the number of rows of memory cell arrays to be refreshed at 2k and when the high-level row address higher-bit signal RAD$_{10}$ and high-level reversed row address higher-bit signal /RAD$_{11}$ are fed and the high-level capacity mode signal CM$_8$ are fed simultaneously to the AND gate 70, a high-level signal is output from the AND gate 70. When both the high-level refresh mode signal RM$_{05}$ and the high-level capacity mode signal CM$_8$ are simultaneously fed to the AND gate 71, a high-level signal is output from an AND gate 71. When both the high-level refresh mode signal RM$_{05}$ and the high-level capacity mode CM$_4$ are simultaneously fed to the AND gate 72, a high-level signal is output from then AND gate 72. Accordingly, when the block activating designation signal ATD$_2$ is fed to the OR gate 79, since the high-level signals are output from all the AND gates 70, 71 and 72, a high-level signal is output from the OR gate 79. Therefore, if the high-level bank mode signal BM$_2$ has been fed, a low-level signal is output from the NAND gate 83, which passes through the transfer gate 88 and is then reversed by the latch 93 to go high and is again reversed by the inverter 98 to go low and is then output as the low-level block selecting signal BS$_{212}$ used to activate the second block, if the memory block 1 is made up of two banks, by using the whole blocks belonging to the first bank. Then, when the high-level latch signal LT$_1$ and low-level reversed latch signal /LT$_1$ are fed from the control circuit 3, since the transfer gate 97 is turned OFF, while it is in an OFF state, a state of the block selecting signal BS$_{212}$ obtained before being reversed is being latched by the latch 93.

When any one of the block activating designation signals ATD$_2$ and ATD$_4$, and ATD$_8$ produced when the system designer sets the number of rows of memory cell arrays to be refreshed at 4k and when the high-level row address higher-bit signal RAD$_{10}$, high-level reversed row address higher-bit signal /RAD$_{11}$ and high-level reversed row address higher-bit signal /RAD$_{12}$ are fed, is supplied, a high-level signal is output from the OR gate 78. When any one of the high-level capacity mode signals CM$_2$, CM$_4$ and CM$_8$ and the high-level refresh mode signal RM$_{05}$ are fed, a high-level signal is output from the AND gate 73. Since, in all the above cases, a high-level signal is output from the OR gate 69, if the high-level bank mode signal BM$_1$ produced because the system designer sets the number of banks at 1, is fed, a low-level signal is output from the NAND gate 84, which passes through the transfer gate 89 and is then reversed by the latch 94 to go high and is again reversed by the inverter 99 to go low, which is then output as the low-level block selecting signal BS$_{211}$ used to activate the second block, if the memory block 1 is made up of one bank, by using all blocks belonging to the bank being operated. Then, when the high-level latch signal LT$_1$ and the low-level reversed latch signal /LT$_1$ are fed from the control circuit 3, since the transfer gate 89 is turned OFF, while it is in an OFF state, a state of the block selecting signal BS$_{211}$ obtained before being reversed is being latched by the latch 94. Moreover, when the system designer sets the number of rows of memory cell arrays to be refreshed at 512, the high-level refresh mode signal RM$_{05}$ is fed and even when the system designer sets the number of banks to any value, one of the block selecting signals BS is output. This is because no block activating designation signal ATD is produced, as is understood from FIG. 5.

The row address latch signal generating circuit 19$_2$ shown in FIG. 10, based on the first control signal FIRC$_1$ and FIRC$_2$, test mode signal TM and block forcedly-activating signal BFAT$_2$, block selecting signals BS$_{211}$, BS$_{212}$, BS$_{222}$, BS$_{214}$ and BS$_{224}$ fed from the block selecting signal generating circuit 18$_2$, generates the row address latch signal RLT$_2$ used to temporarily hold the row address decoded by the row decoder 10 and feeds it to the second block.

Figure 12:
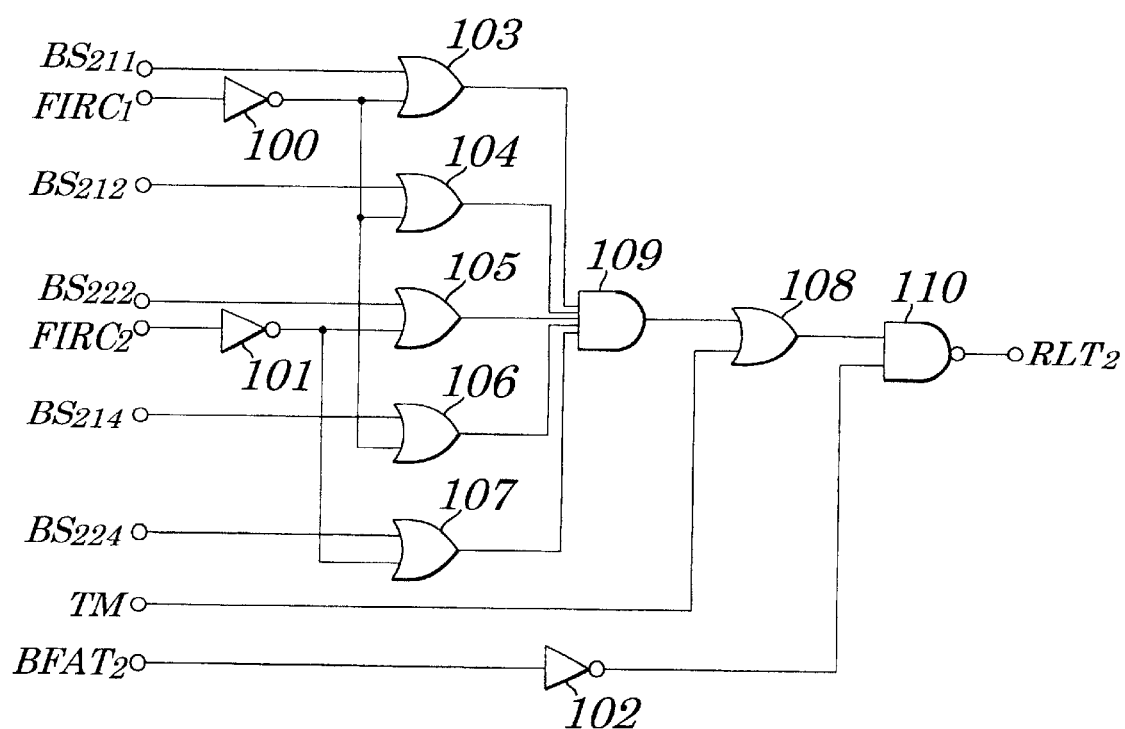
FIG. 12 is a schematic block diagram showing one example of configurations of another row address latch signal generating circuit employed in the memory according to the embodiment of the present invention.

FIG. 12 is a schematic block diagram showing one example of configurations of the row address latch signal generating circuit 19$_2$ employed in the memory according to the embodiment. The row address latch signal generating circuit 19$_2$ includes inverters 100 to 102, OR gates 103 to 108 each having two inputs, OR gates each having five inputs and NAND gate 110 having two inputs. In a state where all the block selecting signals BS$_{211}$, BS$_{212}$, BS$_{222}$, BS$_{214}$ and BS$_{224}$ are fed as high-level signals from the block selecting signal generating circuit 18$_2$ and, at the same time, the first control signals FIRC$_1$ and FIRC$_2$ used to control timing with which the row address latch signal RLT is output to the first and second banks are fed as low-level signals, since a high-level signal is output from all the OR gates 103 to 107, a high-level signal is output from the AND gate 42.

Normally, both the test mode signal TM and block forcedly-activating signal $BFAT_2$ are fed as low-level signals. Therefore, in this state, the low-level row address latch signal $RLT_2$ is output from the NAND gate 110. Even when any one of the block selecting signals $BS_{211}$, $BS_{212}$ and $BS_{214}$ is supplied as the low-level signal, if the first control signal $FIRC_1$ remains at a low level, no changes occur. When the first control signal $FIRC_1$ changes to go high, since any one of the block selecting signals $BS_{211}$, $BS_{212}$ and $BS_{214}$ has been changed to be at a low level, a low-level signal is output from the OR gate to which any one of the block selecting signals has been fed. This causes the AND gate 109 to output a low-level signal and, therefore, the NAND gate 110 to output the high-level row address latch signal $RLT_2$, which is then fed to the second block. Similarly, even when either of the block selecting signals $BS_{222}$ or $BS_{224}$ is supplied as the low-level signal, if the first control signal $FIRC_2$ remains at a low level, no changes occur. When the first control signal $FIRC_2$ changes to go high, since either of the block selecting signal $BS_{222}$ or $BS_{224}$ has been changed to be at a low level, a low-level signal is output from the OR gate to which either of the block selecting signal $BS_{222}$ or $BS_{224}$ has been fed. This causes the AND gate 109 to output a low-level signal and, therefore, the NAND gate 110 to output the high-level row address latch signal $RLT_2$, which is then fed to the second block. That is, after the row address latch signal generating circuit $19_2$ has been selected out of 8 pieces of the row address latch signal generating circuits $19_1$ to $19_8$ by any one of the low-level block selecting signals $BS_{211}$, $BS_{212}$, $BS_{222}$, $BS_{214}$ and $BS_{224}$, the high level row address latch signal $RLT_1$ is output with timing in which the first control signal $FIRC_1$ or $FIRC_2$ changes to go high, and is then fed to the second block. Moreover, since the test mode signal TM changes to go high at a time of the test, irrespective of supply of the block selecting signals $BS_{211}$, $BS_{212}$, $BS_{222}$, $BS_{214}$ and $BS_{224}$ and the first control signals $FIRC_1$ and $FIRC_2$, the high-level row address latch signal $RLT_2$ is output with timing in which the block forcedly-activating signal $BFAT_2$ changes to go high.

The activating signal generating circuit $20_2$ shown in FIG. 10, based on the second control signals $SECC_1$ and $SECC_2$, third control signals $THIC_1$ and $THIC_2$, fourth control signals $FORC_{11}$, $FORC_{12}$, $FORC_{21}$ and $FORC_{22}$, test mode signal TM, test clock TCK and block forcedly-activating signal $BFAT_2$ all of which are fed from the control circuit 3, and based on the block selecting signals $BS_{211}$, $BS_{212}$, $BS_{222}$, $BS_{214}$ and $BS_{224}$ fed from the block selecting signal generating circuit $18_2$, generates the sub-word activating signal $SWAT_2$ used to activate sub-word lines of the MCA making up the second block contained in the memory block 1, two kinds of the SA activating signals $SAAT_{12}$ and $SAAT_{22}$ used to activate the two SAs making up the second block contained in the memory block 1 and the main-word timing control signal $MTC_2$ used to control timing with which the row decoder 10 outputs the main-word activating signal MWAT and feeds them to the second block.

Figure 13:
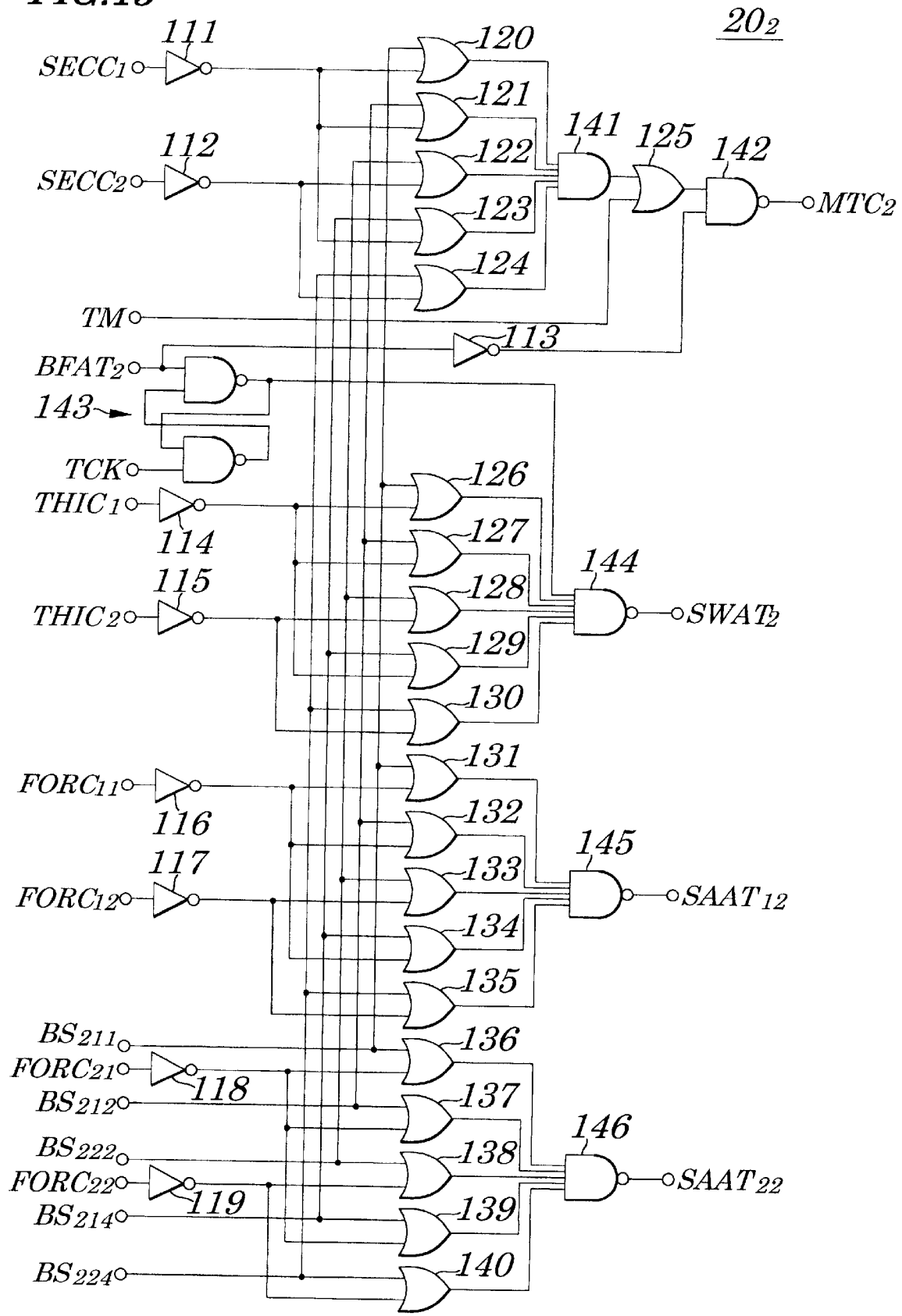
FIG. 13 is a schematic block diagram showing one example of configurations of another activating signal generating circuit employed in the memory according to the embodiment of the present invention.

FIG. 13 a schematic block diagram showing one example of configurations of the activating signal generating circuit $20_2$ employed in the memory according to the embodiment. The activating signal generating circuit $20_2$ of the embodiment includes inverters 111 to 119, OR gates 120 to 140 having two inputs, AND gates 141 having four inputs, NAND gate 142 having two inputs, SR latch 143, NAND gate 144 having six inputs and NAND gates 145 to 146 each having five inputs.

Moreover, in a state where all the block selecting signals $BS_{211}$, $BS_{212}$, $BS_{214}$, $BS_{222}$ and $BS_{224}$ are fed as high-level signals from the block selecting signal generating circuit $18_2$ and, at the same time, all the second control signals $SECC_1$ and $SECC_2$ used to control timing with which the main-word timing control signal MTC is output to the first and second banks, are fed as low-level signals, since a high-level signal is output from all the OR gates 120 to 124, a high-level signal is output from the AND gate 141. Normally, all of the test mode signal TM and block forcedly-activating signal $BFAT_2$ are fed as low-level signals. Therefore, in this state, the low-level main-word timing control signal $MTC_2$ is output from the NAND gate 142. Even when any one of the block selecting signals $BS_{211}$, $BS_{212}$ and $BS_{214}$ is supplied as the low level signal, if the second control signal $SECC_1$ remains at a low level, no changes occur. When the second control signal $SECC_1$ changes to go high, since any one of the block selecting signals $BS_{211}$, $BS_{212}$ and $BS_{214}$ has been changed to be at a low level, a low-level signal is output from the OR gate to which any one of the block selecting signals has been fed. This causes the AND gate 141 to output a low-level signal and, therefore, the NAND gate 142 to output the high-level main-word timing control signal $MTC_2$, which is then fed to the second block. Similarly, even when either of the low-level block selecting signals $BS_{222}$ or $BS_{224}$ is supplied, if the second control signal $SECC_2$ remains at a low level, no changes occur. When the second control signal $SECC_2$ changes to go high, since either the block selecting signal $BS_{222}$ or block selecting signal $BS_{224}$ has been changed to be at a low level, a low-level signal is output from the OR gate to which either of the block selecting signals has been fed. This causes the AND gate 141 to output a low-level signal and, therefore, the NAND gate 142 to output the high-level main-word timing control signal $MTC_2$, which is then fed to the second block. That is, after the activating signal generating circuit $20_2$ has been selected out of 8 pieces of the activating signal generating circuits $20_1$ to $20_8$ by any one of the low-level block selecting signals $BS_{211}$, $BS_{212}$, $BS_{222}$, $BS_{214}$ and $BS_{224}$, the high-level main-word timing control signal $MTC_2$ is output with timing in which the second control signal $SECC_1$ or $SECC_2$ changes to go high, and is then fed to the second block. Moreover, since the test mode signal TM changes to go high at a time of the test, irrespective of supply of the block selecting signals $BS_{211}$, $BS_{212}$, $BS_{222}$, $BS_{214}$ and $BS_{224}$ and the second control signals $SECC_1$ and $SECC_2$, the high-level main-word timing control signal $MTC_2$ is output with timing in which the block forcedly-activating signal $BFAT_2$ changes to go high.

Moreover, in a state where all the block selecting signals $BS_{211}$, $BS_{212}$, $BS_{222}$, $BS_{214}$ and $BS_{224}$ are fed as high-level signals from the block selecting signal generating circuit $18_2$ and, at the same time, both the third control signals $THIC_1$ and $THIC_2$ used to control timing with which the sub-word activating signal SWAT is output to the first and second banks, are fed as low-level signals, a high-level signal is output from all the OR gates 126 to 130. Normally, the block forcedly-activating signal $BFAT_2$ are fed as low-level signals and, since the test clock TCK is not supplied, a high-level signal is output from the SR latch 143. Therefore, in this state, the low-level sub-word activating signal $SWAT_2$ is output from the NAND gate 144. Then, even when any one of the low-level block selecting signals $BS_{211}$, $BS_{212}$ and $BS_{214}$ is supplied, if the third control signal $THIC_1$ remains at a low level, no changes occur. When the third control signal $THIC_1$ changes to go high, since any one of the block selecting signals $BS_{222}$, $BS_{214}$ and $BS_{224}$ has been changed to be at a low level, a low-level signal is output from the OR gate to which any one of the block selecting signals has been fed. This causes the NAND gate 144 to output the high-level sub-word activating signal $SWAT_2$, which is then fed to the second block. Similarly, even when either of the low-level block selecting signals $BS_{222}$ or $BS_{224}$ is supplied, if the third control signal $THIC_2$ remains at a low level, no changes occur. When the third control signal $THIC_2$ changes to go high, since either of the block selecting signal $BS_{222}$ or $BS_{224}$ has been changed to be at a low level, a low-level signal is output from the OR gate to which either of the block selecting signals has been fed. This causes the NAND gate 144 to output the high-level sub-word activating signal $SWAT_2$, which is then fed to the second block. That is, after the activating signal generating circuit $20_2$ has been selected out of 8 pieces of the activating signal generating circuits $20_1$ to $20_8$ by any one of the low-level block selecting signals $BS_{211}$, $BS_{212}$, $BS_{222}$, $BS_{214}$ and $BS_{224}$, the high-level sub-word activating signal $SWAT_2$ is output with timing in which the third control signal $THIC_1$ or $THIC_2$ is changed to go high, and is then fed to the second block.

Moreover, at a time of the test, the test clock TCK is first fed and, after the block forcedly-activating signal $BFAT_2$ has risen to go high at a time of a second rise of the test clock TCK, an output signal from the SR latch 143 changes to go low at a time of a second fall of the test clock TCK. Therefore, a high-level sub-word activating signal $SWAT_2$ is output, irrespective of supply of the block selecting signals $BS_{211}$, $BS_{212}$, $BS_{222}$, $BS_{214}$ and $BS_{224}$ and the third control signals $THIC_1$ and $THIC_2$, with timing in which the test clock TCK first falls.

In a state where all the block selecting signals $BS_{211}$, $BS_{212}$, $BS_{222}$, $BS_{214}$ and $BS_{224}$ are fed as high-level signals from the block selecting signal generating circuit $18_2$ and, at the same time, the fourth control signals $FORC_{11}$, $FORC_{12}$, $FORC_{21}$ and $FORC_{22}$, used to control timing with which two kinds of SA activating signals $SAAT_1$ and $SAAT_2$ are output to the first and second banks, are fed as low-level signals, a high-level signal is output from all the OR gates 131 to 140. Therefore, in this state, the SA activating signals $SAAT_{12}$ and $SAAT_{22}$, both of which are low-level signals, are output from the NAND gates 145 and 146 respectively. Then, even when any one of the low-level block selecting signals $BS_{211}$, $BS_{212}$ and $BS_{214}$ is supplied, if the fourth control signals $FORC_{11}$ and $FORC_{21}$ remain at a low level, no changes occur. When the fourth control signal $FORC_{11}$ changes to go high, since any one of the block selecting signals $BS_{211}$, $BS_{212}$ and $BS_{214}$ has been changed to be at a low level, a low-level signal is output from the OR gate to which any one of the block selecting signals has been fed. This causes the NAND gate 145 to output the high-level SA activating signal $SAAT_{12}$, which is then fed to the second block. Then, when the fourth control signal $FORC_{21}$ changes to go high, since any one of the block selecting signals $BS_{211}$, $BS_{212}$ and $BS_{214}$ has changed to be at a low level, a low-level signal is output from the OR gate to which any of the block selecting signals has been fed. This causes the NAND gate 146 to output the high-level SA activating signal $SAAT_{22}$, which is then fed to the second block. Similarly, even when either of the low-level block selecting signals $BS_{222}$ or $BS_{224}$ is supplied, if the fourth control signals $FORC_{12}$ and $FORC_{22}$ remain at a low level, no changes occur. When the fourth control signal $FORC_{12}$ changes to go high, since either of the block selecting signal $BS_{222}$ or $BS_{224}$ has been changed to be at a low level, a low-level signal is output from the OR gate to which either of the block selecting signals has been fed. This causes the NAND gate 145 to output the high-level SA activating signal $SAAT_{12}$, which is then fed to the second block. Then, when the fourth control signal $FORC_{22}$ changes to go high, since either of the block selecting signals $BS_{222}$ or $BS_{224}$ has changed to be at a low level, a low-level signal is output from the OR gate to which either of the block selecting signals has been supplied. This causes the NAND gate 146 to output the high-level SA activating signal $SAAT_{22}$, which is then fed to the second block. That is, after the activating signal generating circuit $20_2$ has been selected out of 8 pieces of the activating signal generating circuits $20_1$ to $20_8$ by any one of the low-level block selecting signals $BS_{211}$, $BS_{212}$, $BS_{222}$, $BS_{214}$ and $BS_{224}$, the high-level SA activating signals $SAAT_{12}$ and $SATT_{22}$ are sequentially output with timing in which the fourth control signals $FORC_{11}$, $FORC_{21}$, $FORC_{12}$ and $FORC_{22}$ sequentially change to go high, and is then fed to the second block.

Figure 14:
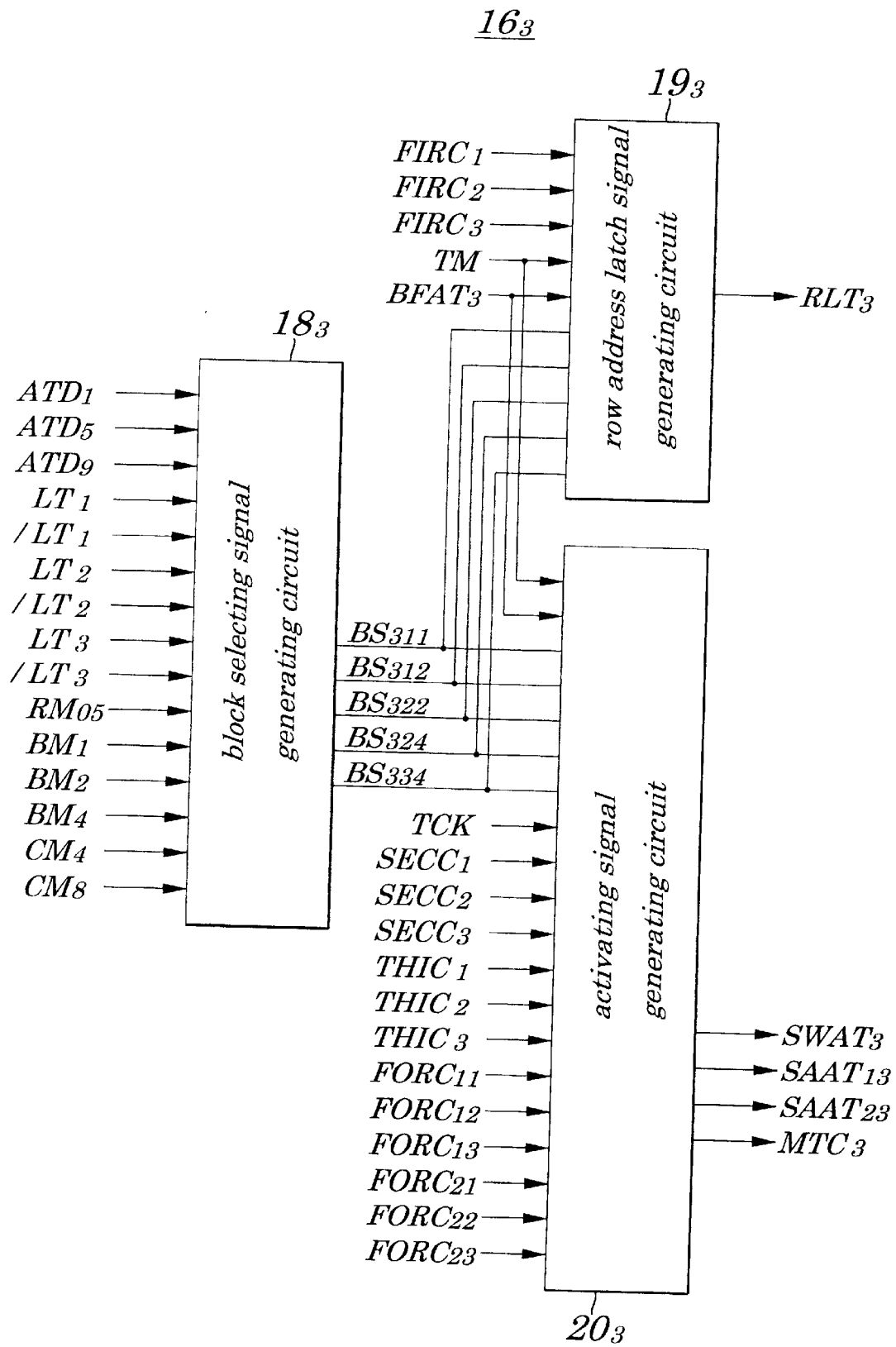
FIG. 14 is a schematic block diagram showing configurations of another block activating section employed in the memory according to the embodiment of the present invention.

The block activating section $16_3$, as shown in FIG. 14, includes a block selecting signal generating circuit $18_3$, a row address latch signal generating circuit $19_3$ and an activating signal generating circuit $20_3$.

The block selecting signal generating circuit $18_3$, based on the block activating designation signals $ATD_1$, $ATD_5$ and $ATD_9$ fed from the refresh decoder 15, latch signals $LT_1$ to $LT_3$, reversed latch signals $/LT_1$ to $/LT_3$, refresh mode signal $RM_{05}$, bank mode signals $BM_1$, $BM_2$ and $BM_4$ and capacity mode signals $CM_4$ and $CM_8$ all of which are fed from the control circuit 3, generates a block selecting signal $BS_{311}$ used to activate the third block, if the memory block 1 is made up of one bank, by using all blocks belonging to the bank being operated, a block selecting signal $BS_{312}$ used to activate the third block, if the memory block 1 is made up of two banks, by using all blocks belonging to the first bank, a block selecting signal $BS_{322}$ used to activate the third block, if the memory block 1 is made up of two banks, by using all blocks belonging to the second bank, a block selecting signal $BS_{324}$ used to activate the third block, if the memory block 1 is made up of four banks, by using all blocks belonging to the second bank and a block selecting signal $BS_{334}$ used to activate the third block, if the memory block 1 is made up of four banks, by using all blocks belonging to the second bank.

Figure 15:
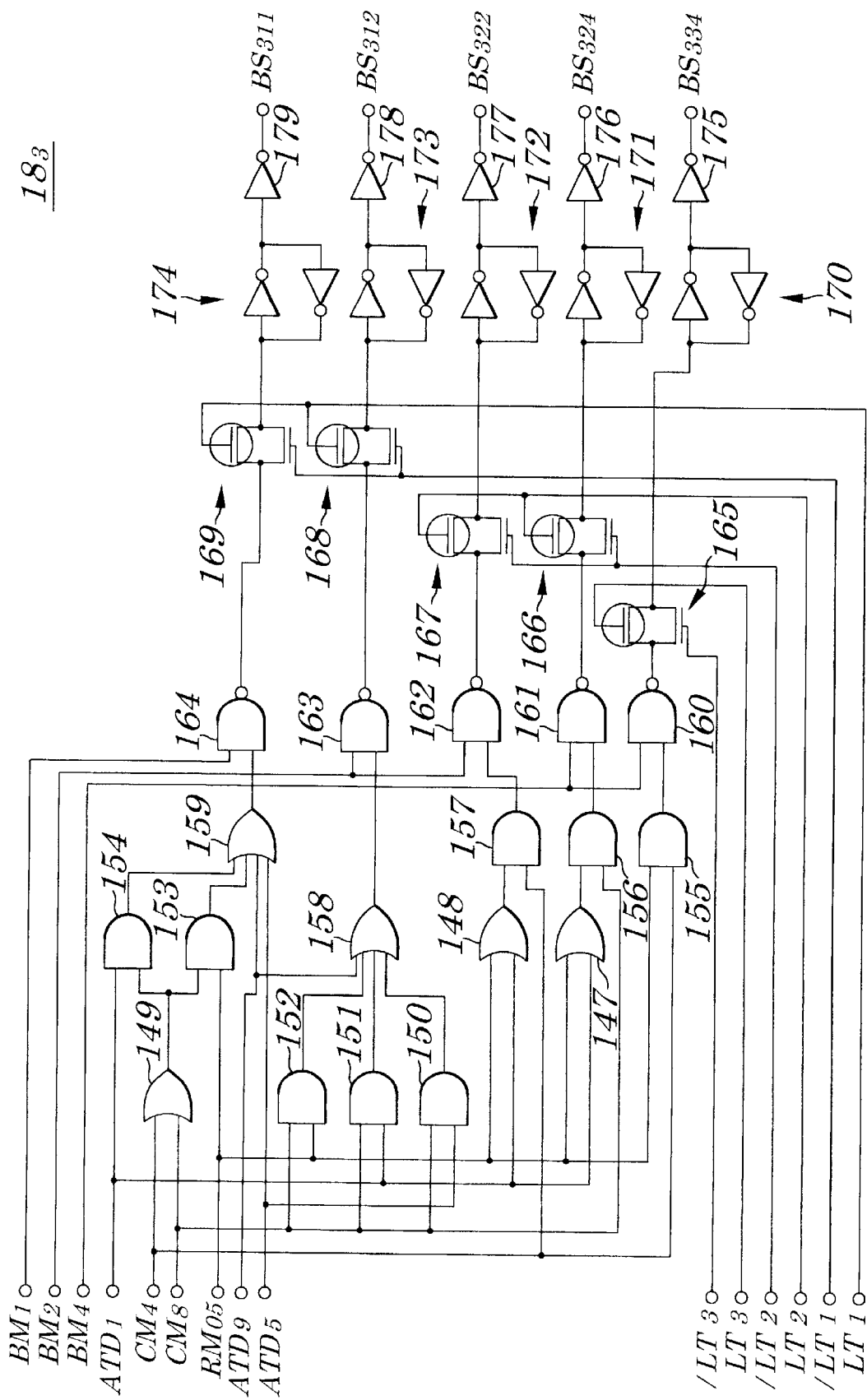
FIG. 15 is a schematic block diagram showing one example of configurations of another block selecting signal generating employed in the memory according to the embodiment of the present invention.

FIG. 15 a schematic block diagram showing one example of configurations of the block selecting signal generating $18_3$. The block selecting signal generating $18_3$ of the embodiment includes OR gates 147 to 149 each having two inputs, AND gates 150 to 157 each having two inputs, OR gates 158 and 159 each having four inputs, NAND gates 160 to 164 each having two inputs, transfer gates 165 to 169, latches 170 to 174 and inverters 175 to 179. When both the high-level refresh mode signal $RM_{05}$ which goes high when the system designer sets the number of rows of memory cell arrays to be refreshed at 512k and the capacity mode signal $CM_4$ which goes high when the system designer sets a storage capacity at 4M bits, are fed simultaneously, a high-level signal is output from the AND gate 155. Therefore, if the high-level bank mode signal $BM_4$ which has gone high because the system designer had set the number of banks at four, has been fed, a low-level signal is output from the NAND gate 160, which passes through the transfer gate 165 being turned ON and is reversed by the latch 170 to go high and is again reversed by the inverter 175 to go low and is then output as the low-level block selecting signal $BS_{334}$ used to activate the third block, if the memory block 1 is made up of four banks, by using the whole blocks belonging to the third bank. Then, when the high-level latch signal $LT_3$ and the low-level reversed latch signal $/LT_3$ used to temporarily latch the block selecting signal BS to be fed to all the blocks belonging to the third bank are fed from the control circuit 3, the transfer gate 165 is turned OFF and while it is in an OFF state, a state of the block selecting signal $BS_{334}$ obtained before being reversed is being latched by the latch 170. Moreover, an aim of temporarily holding the state of the block selecting signal $BS_{334}$ obtained before being reversed in the latch 170 by using the high-level latch signal $LT_3$ and the low-level reversed latch signal $/LT_3$ is to prevent the block being now operated from becoming inactivated even when other blocks are activated at a later time compared with the block being now operated. The latches 171 to 174 are mounted because of the same reasons as above.

When either the high-level refresh mode signal $RM_{05}$ or the block activating designation signal $ATD_1$ which is produced when the system designer sets the number of rows of memory cell arrays to be refreshed at 1k and when the high-level reversed row address higher-bit signal $/RAD_{10}$ is fed and the capacity mode signal $CM_8$ which goes high when the system designer sets a storage capacity at 8M bits, are fed simultaneously, a high-level signal is output from the AND gate 156. Therefore, if the high-level bank mode signal $BM_4$ has been fed, a low-level signal is output from the NAND gate 161, which passes through the transfer gate 166 being turned ON and is reversed by the latch 171 to go high and is again reversed by the inverter 176 to go low and is then output as the low-level block selecting signal $BS_{324}$ used to activate the third block, if the memory block 1 is made up of four banks, by using the whole blocks belonging to the second bank. Then, when the high-level latch signal $LT_1$ and the low-level reversed latch signal $/LT_1$ used to temporarily latch the block selecting signal BS to be fed to all the blocks belonging to the second bank are fed from the control circuit 3, since the transfer gate 166 is turned OFF, while it is in an OFF state, a state of the block selecting signal $BS_{324}$ obtained before being reversed is being latched by the latch 171.

When either the high-level refresh mode signal $RM_{05}$ or the high-level block activating designation signal $ATD_1$ and the high-level capacity mode $CM_4$ are fed simultaneously, a high-level signal is output from the AND gate 157. Therefore, if the high-level bank mode $BM_2$ which has gone high because the system designer had set the number of banks at 2, has been fed, a low-level signal is output from the NAND gate 162, which passes through the transfer gate 167 and is reversed by the latch 172 to become high and is again reversed by the inverter 177 to become low and is then output as the low-level block selecting signal $BS_{322}$ used to activate the third block, if the memory block 1 is made up of two banks, by using the whole blocks belonging to the second bank. Then, when the high-level latch signal $LT_2$ and the low-level reversed latch signal $/LT_2$ are fed from the control circuit 3, since the transfer gate 167 is turned OFF, while it is in an OFF state, a state of the block selecting signal $BS_{322}$ obtained before being reversed is being latched by the latch 172.

When both the block activating designation signal $ATD_5$ which is produced when the system designer sets the number of rows of memory cell arrays to be refreshed at 2k and when the high-level reversed row address higher-bit signals $/RAD_{10}$ and the high-level row address higher-bit signal $RAD_{11}$ are fed and the capacity mode signal $CM_8$ are supplied simultaneously, a high-level signal is output from an AND gate 150. When both the high-level block activating designation signal $ATD_1$ and the high-level capacity mode signal $CM_8$ are fed, a high-level signal is output from an AND gate 151. When both the high-level refresh mode signal $RM_{05}$ and the high-level capacity mode signal $CM_8$ are fed simultaneously, a high-level signal is output from the AND gate 152. Accordingly, when the block activating designation signal $ATD_9$ produced when the system designer sets the number of rows of memory cell arrays to be refreshed at 4k and when the high-level reversed row address higher-bit signal $/RAD_{10}$, high-level row address higher-bit signal $RAD_{11}$ and high-level reversed row address higher-bit signal $/RAD_{12}$ are fed, since the high-level signals are output from the all AND gates 150, 151 and 153, a high-level signal is output from the OR gate 158. Therefore, if the high-level bank mode $BM_2$ produced has been fed, a low-level signal is output from the NAND gate 162, which passes through the transfer gate 168 being turned ON and is reversed by the latch 173 to go high and is again reversed by the inverter 178 to go low and is then output as the low-level block selecting signal $BS_{312}$ used to activate the third block, if the memory block 1 is made up of two banks, by using the whole blocks belonging to the first bank. Then, when the high-level latch signal $LT_1$ and the low-level reversed latch signal $/LT_1$ used to temporarily hold the block selecting signal BS to be fed to all the block belonging to the first bank are fed from the control circuit 3, since the transfer gate 168 is turned OFF, while it is in an OFF state, a state of the block selecting signal $BS_{312}$ obtained before being reversed is being latched by the latch 173.

Moreover, in all cases where either the block activating designation signal $ATD_5$ or $ATD_9$ is fed and where the high-level refresh mode signal $RM_{05}$ is fed and where either the high-level capacity mode signal $CM_4$ or $CM_8$ and the high-level block activating designation signal $ATD_1$ are simultaneously fed, a high-level signal is output from the OR gate 159. Therefore, if the high-level bank mode $BM_1$ produced because the system designer sets the number of banks at 1 has been fed to the NAND gate 164, a high-level signal is output from the NAND gate 164, which passes through the transfer gate 169 being turned ON and is reversed by the latch 174 to go high and is again reversed by the inverter 179 to go low and is then output as the low-level block selecting signal $BS_{311}$ used to activate the third block, if the memory block 1 is made up of one bank, by using the whole blocks belonging to the bank being operated. When the high-level latch signal $LT_1$ and the low-level reversed latch signal $/LT_1$ are fed, since the transfer gate 169 is turned OFF, while the transfer gate 169 is in an OFF state, a state of the block selecting signal $BS_{311}$ obtained before being reversed is being held by the latch 174. Moreover, when the system designer sets the number of rows of memory cell arrays to be refreshed at 512, the high-level refresh mode signal $RM_{05}$ is fed and even when the system designer sets the number of banks to any value, one of the block selecting signals BS is output. This is because no block activating designation signal ATD is produced, as is understood from FIG. 5.

The row address latch signal generating circuit $19_3$ shown in FIG. 14, based on first control signals $FIRC_1$ to $FIRC_3$ and test mode signal TM, block forcedly-activating signal $BFAT_3$ all of which are output from the control circuit 3 and block selecting signals $BS_{311}$, $BS_{312}$, $BS_{322}$, $BS_{324}$ and $BS_{334}$ supplied from the block selecting signal generating circuit $18_3$, generates the row address latch signal $RLT_3$ used to temporarily hold row addresses decoded by the row decoder 10 (see FIG. 3) and feeds them to the third block.

Figure 16:
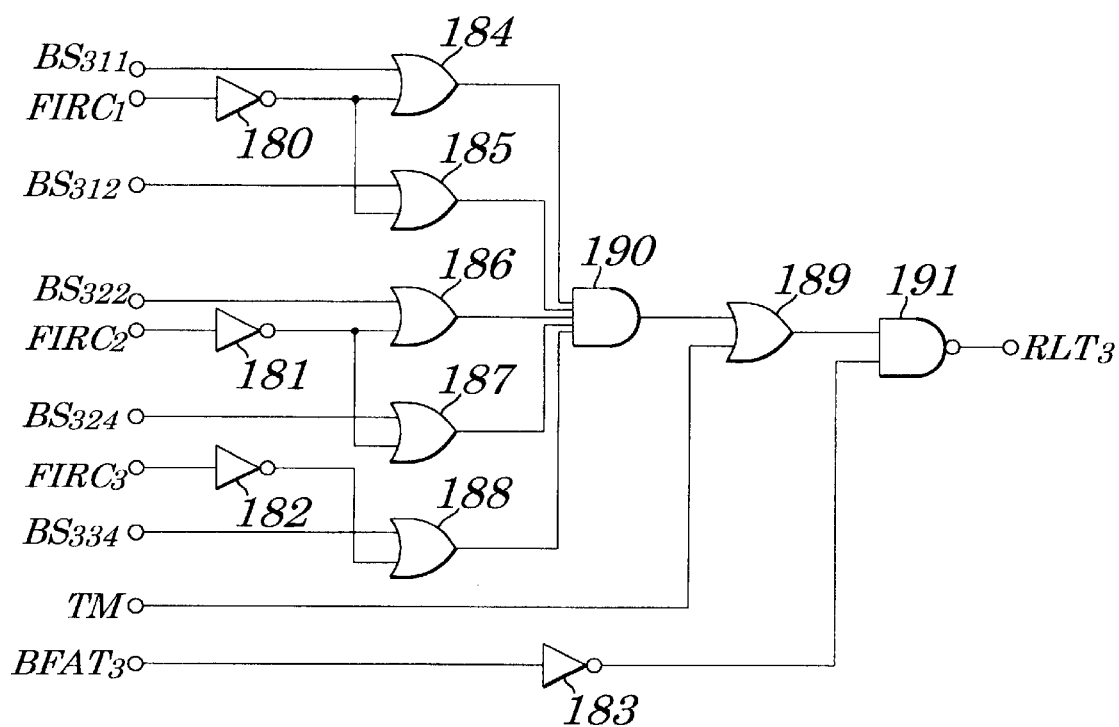
FIG. 16 is a schematic block diagram showing one example of configurations of another row address latch signal generating circuit employed in the memory according to the embodiment of the present invention.

FIG. 16 is a schematic block diagram showing one example of configurations of the row address latch signal generating circuit $19_3$ employed in the memory according to the embodiment The row address latch signal generating circuit $19_3$ of the embodiment includes inverters 180 to 183, OR gates 184 to 189 each having two inputs, an AND gate 190 and a NAND gate 191 having two inputs.

In a state where all the block selecting signals $BS_{311}$, $BS_{312}$, $BS_{322}$, $BS_{324}$ and $BS_{334}$ are fed as high-level signals from the block selecting signal generating circuit $18_3$ and, at the same time, the first control signals $FIRC_1$ to $FIRC_3$ used to control timing with which the row address latch signal RLT is output to the first to third banks, are fed as low-level signals, since a high-level signal is output from all the OR gates 184 to 188, a high-level signal is output from the AND gate 190. Normally, both the test mode signal TM and the block forcedly-activating signal $BSAT_3$ are fed as the low-level signal. Therefore, in this state, the low-level row address latch signal $RLT_3$ is output from the NAND gate 191. Next, even when either the low-level block selecting signal $BS_{311}$ or $BS_{312}$ is fed, if the first control signal $FIRC_1$ remains at a low level, no changes occur. Then, when the first control signal $FIRC_1$ changes to go high, since either of the block selecting signals $BS_{311}$ or $BS_{312}$ has changed to be at a low level, a low-level signal is output from the OR gate to which either of the block selecting signals has been fed. This causes the AND gate 190 to output a low-level signal and, therefore, the NAND gate 191 to output the high-level row address latch signal $RLT_3$, which is then fed to the third block. Similarly, even when either of the low-level block selecting signals $BS_{322}$ or $BS_{324}$ is supplied as the low-level signal, if the first control signal $FIRC_2$ remains at a low level, no changes occur. When the first control signal $FIRC_2$ changes to go high, since either of the block selecting signal $BS_{322}$ or $BS_{324}$ has been changed to be at a low level, a low-level signal is output from the OR gate to which either of the block selecting signals has been fed. This causes the AND gate 190 to output a low-level signal and, therefore, the NAND gate 191 to output the high-level row address latch signal $RLT_3$, which is then fed to the third block. Similarly, even when the low-level block selecting signal $BS_{334}$ is fed, if the first control signal $FIRC_3$ remains at a low level, no changes occur. Then, when the first control signal $FIRC_3$ goes high, since the block selecting signal $BS_{334}$ has been changed to be at a low level, a low-level signal is output from the OR gate 188. This causes the AND gate 190 to output a low-level signal and, therefore, the NAND gate 191 to output the high-level row address latch signal $RLT_3$, which is then fed to the third block. That is, after the row address latch signal generating circuit $19_3$ has been selected out of 8 pieces of the row address latch signal generating circuits $19_1$ to $19_8$ by any one of the low-level block selecting signals $BS_{311}$, $BS_{312}$, $BS_{322}$, $BS_{324}$ and $BS_{334}$, the high-level row address latch signal $RLT_3$ is output with timing in which the first control signals $FIRC_1$ and $FIRC_3$ are changed to go high, and is then fed to the third block.

Moreover, at a time of the test, since the test mode signal TM changes to go high, irrespective of supply of the block selecting signals $BS_{311}$, $BS_{312}$, $BS_{322}$, $BS_{324}$ and $BS_{334}$ and the first control signals $FIRC_1$ to $FIRC_3$, the high-level row address latch signal $RLT_3$ is output with timing in which the block forcedly-activating signal $BFAT_3$ changes to go high.

The activating signal generating circuit $20_3$ shown in FIG. 14, based on the second control signals $SECC_1$ to $SECC_3$, third control signals $THIC_1$ to $THIC_3$, fourth control signals $FORC_{11}$ to $FORC_{13}$ and $FORC_{21}$ to $FORC_{23}$ test mode signal TM, test clock TCK and block forcedly-activating signal $BFAT_3$ all of which are fed from the control circuit 3 and the block selecting signals $BS_{311}$, $BS_{312}$, $BS_{322}$, $BS_{324}$ and $BS_{334}$ fed from the block selecting signal generating circuit $18_3$, generates the sub-word activating signal $SWAT_3$ used to activate sub-word lines of the MCA making up the third block contained in the memory block 1, two kinds of SA activating signals $SAAT_{13}$ and $SAAT_{23}$ used to activate two SAs making up the third block contained in the memory block 1 and the main-word timing control signal $MTC_3$ used to control timing with which the row decoder 10 outputs the main-word activating signal MWAT, and feeds them to the third block.

Figure 17:
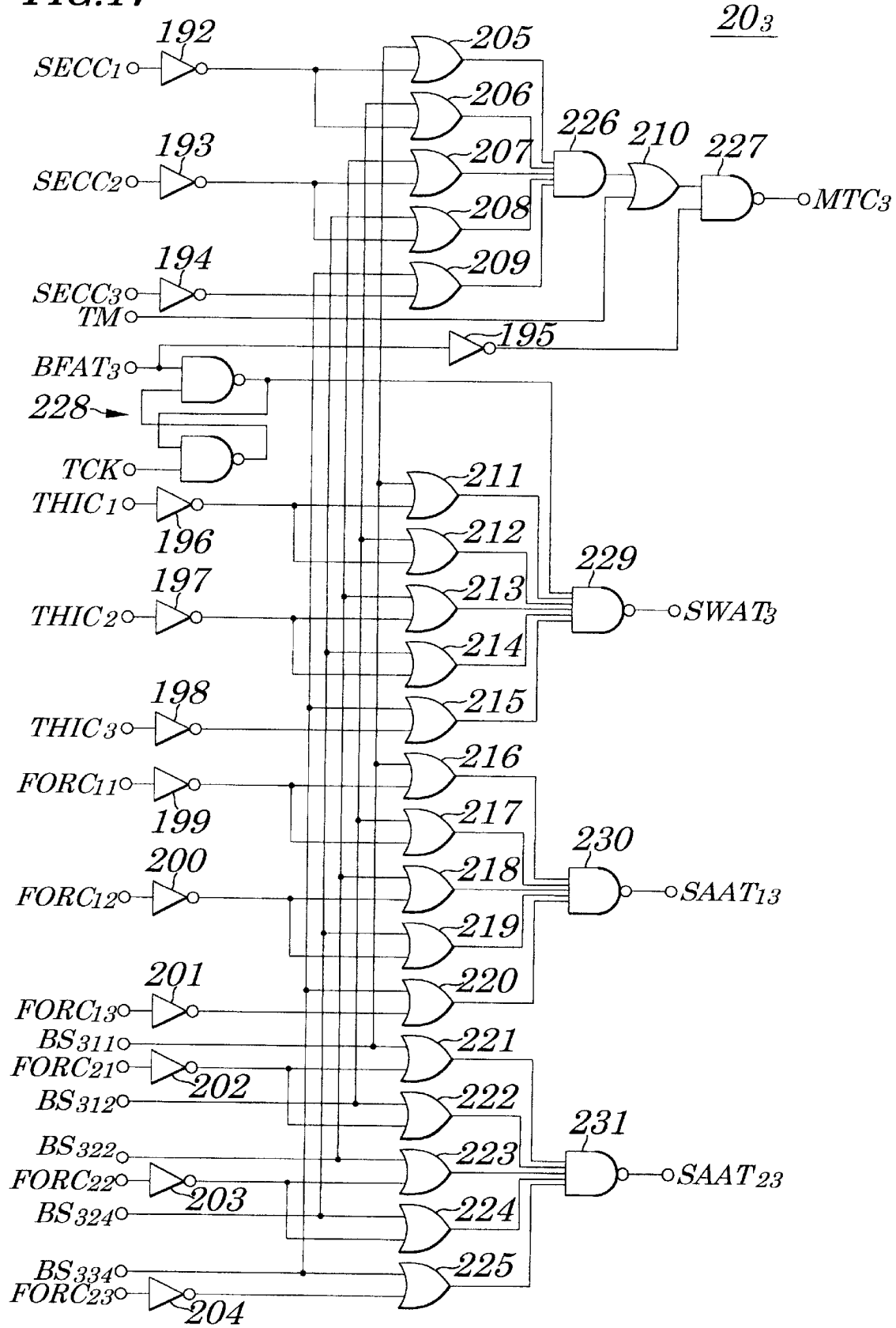
FIG. 17 is a schematic block diagram showing one example of configurations of another activating signal generating circuit employed in the memory according to the embodiment of the present invention.

FIG. 17 is a schematic block diagram showing one example of configurations of the activating signal generating circuit $20_3$ employed in the memory according to the embodiment. The activating signal generating circuit $20_3$ includes inverters 192 to 204, OR gates 205 to 225 each having two inputs, AND gate 226 having five inputs, NAND gate 227 having two inputs, SR latch 228, NAND gate 229 having six inputs and NAND gates 230 and 231 each having five inputs.

In a state where all the block selecting signals $BS_{311}$, $BS_{312}$, $BS_{322}$, $BS_{324}$ and $BS_{334}$ are fed as high-level signals from the block selecting signal generating circuit $18_3$ and, at the same time, the second control signals $SWCC_1$ to $SECC_3$ used to control timing with which the main-word timing control signal MTC is output to the first to third banks, are fed as low-level signals, since high-level signals are output from all the OR gates 205 to 209, a high-level signal is output from the AND gate 226. Moreover, normally, both the test mode signal TM and the block forcedly-activating signal $BFAT_3$ are fed as low-level signals. Therefore, in this state, the low-level main-word timing control signal $MTC_3$ is output from the NAND gate 227. Then, even if either of the low-level block selecting signal $BS_{311}$, or $BS_{312}$ is fed, if the second control signal $SECC_1$ remains at a low level, no changes occur. When the second control signal $SECC_1$ changes to go high, since either of the block selecting signal $BS_{311}$ or $BS_{312}$ has changed to be at a low level, a low-level signal is output from the OR gate to which either of the block selecting signal $BS_{311}$ or $BS_{312}$ has been fed. Since this causes the AND gate 226 to output a low-level signal, the high-level main-word timing control signal $MTC_3$ is output from the NAND gate 227 and is then fed to the third block. Similarly, even when either of the low-level block selecting signal $BS_{322}$ or $BS_{324}$ is fed, if the second control signal $SECC_2$ remains at a low level, no changes occur. When the second control signal $SECC_2$ changes to go high, since either of the block selecting signal $BS_{322}$ or $BS_{324}$ has changed to be at a low level, a low-level signal is output from the OR gate to which either of the block selecting signal $BS_{322}$ or $BS_{324}$ has been fed. This causes the AND gate 226 to output a low-level signal and, therefore, the NAND gate 227 to output the high-level main-word timing control signal $MTC_3$, which is then fed to the third block. Similarly, even when the low-level block selecting signal $BS_{334}$ is fed, if the second control signal $SECC_3$ remains at a low level, no changes occur. Then, when the second control signal $SECC_3$ goes high, since the block selecting signal $BS_{334}$ has been changed to be at a low level, a low-level signal is output from the OR gate to which the block selecting signal $BS_{334}$ has been fed. This causes the AND gate 226 to output a low-level signal and, therefore, the NAND gate 227 to output the high-level main-word timing control signal $MTC_3$, which is then fed to the third block. That is, after the row address latch signal generating circuit $20_3$ has been selected from 8 pieces of the activating signal generating circuits $20_1$ to $20_8$ by any one of the low-level block selecting signals $BS_{311}$, $BS_{312}$, $BS_{322}$, $BS_{324}$ and $BS_{334}$, the high-level main-word timing control signal MTC$_3$ is output with timing in which any one of the second control signals SECC$_1$, SECC$_2$ and SECC$_3$ is changed to go high, and is then fed to the third block. Moreover, at a time of the test, since the test mode signal TM changes to go high, irrespective of supply of the block selecting signals BS$_{311}$, BS$_{312}$, BS$_{322}$, BS$_{324}$ and BS$_{334}$ and the second control signals SECC$_1$ to SECC$_3$, with timing in which the block forcedly-activating signal BFAT$_3$ changes to go high, the high-level main-word timing control signal MTC$_3$ is output.

In a state where all the block selecting signals BS$_{311}$, BS$_{312}$, BS$_{322}$, BS$_{324}$ and BS$_{334}$ are fed as high-level signals from the block selecting signal generating circuit 18$_3$ and, at the same time, the third control signals THIC$_1$ to THIC$_3$ used to control timing in which the sub-word activating signal SWAT is output to the first to third banks, are fed as low-level signals, a high-level signal is output from all the OR gates 211 to 215. Moreover, normally, since the block forcedly-activating signal BFAT$_3$ is fed as the low-level signal and no test clock TCK is fed, a high-level signal is output from the SR latch 228. Therefore, in this state, the low-level sub-word activating signal SWAT$_3$ is output from the NAND gate 229. Then, even when either of the low-level block selecting signal BS$_{311}$ $_{or}$ $_{BS312}$ is fed, if the third control signal THIC$_1$ remains at a low level, no changes occur. When the third control signal THIC$_1$ goes high, since either of the block selecting signal BS$_{311}$ or BS$_{312}$ has been changed to be at a low level, a low-level signal is output from the OR gate to which the block selecting signal BS$_{311}$ or BS$_{312}$ has been fed. This causes the NAND gate 229 to output the high-level sub-word activating signal SWAT$_3$, which is then fed to the third block. Similarly, even when either of the low-level block selecting signal BS$_{322}$ or BS$_{324}$ is fed, if the third control signal THIC$_2$ remains at a low level, no changes occur. Then, when the third control signal THIC$_2$ goes high, since either of the block selecting signal BS$_{322}$ or BS$_{324}$ has been changed to be at a low level, a low-level signal is output from the OR gate to which either of the block selecting signal BS$_{322}$ or BS$_{324}$ has been fed. This causes the NAND gate 229 to output a low-level sub-word activating signal SWAT$_3$, which is then fed to the third block. Similarly, even when the low-level block selecting signal BS$_{334}$, is supplied, if the third control signal THIC$_3$ remains at a low level, no changes occur. Then, when the third control signal THIC$_3$ goes high, since the block selecting signal BS$_{334}$ has been changed to be at a low level, a low-level signal is output from the OR gate 215. This causes the NAND gate 229 to output a high-level sub-word activating signal SWAT$_3$, which is then fed to the third block. That is, after the activating signal generating circuit 20$_3$ has been selected from 8 pieces of the activating signal generating circuits 20$_1$ to 20$_8$ by any one of the low-level block selecting signals BS$_{311}$, BS$_{312}$, BS$_{322}$, BS$_{324}$ and BS$_{334}$, the high-level sub-word activating signal SWAT$_3$ is output with timing in which any one of the third control signals THIC$_1$, THIC$_2$ and THIC$_3$ is changed to go high, and is then fed to the third block. Moreover, at a time of the test, the test clock TCK is first fed and, after the block forcedly-activating signal BFAT$_3$ has risen to go high at a time of a third rise of the test clock TCK, an output signal from the SR latch 228 changes to go low at a time of a third fall of the test clock TCK. Therefore, a high-level sub-word activating signal SWAT$_3$ is output, irrespective of supply of the block selecting signals BS$_{311}$, BS$_{312}$ and BS$_{322}$, BS$_{324}$ and BS$_{334}$ and the third control signals THIC$_1$ to THIC$_3$, with timing in which the test clock TCK falls third.

In a state where all the block selecting signals BS$_{311}$, BS$_{312}$, BS$_{322}$, BS$_{324}$ and BS$_{334}$ are fed as high-level signals from the block selecting signal generating circuit 18$_3$ and, at the same time, the fourth control signals FORC$_{11}$ to FORC$_{13}$ and FORC$_{21}$ to FORC$_{23}$ used to control timing in which the two kinds of the SA activating signals SAAT$_1$ and SAAT$_2$ are output to the first to third banks, are fed as low-level signals, a high-level signal is output from all the OR gates 216 to 225. Therefore, in this state, low-level SA activating signals SATT$_{13}$ and SATT$_{23}$ is output from the NAND gate 230.

Next, even when either of the low-level block selecting signal BS$_{311}$ or BS$_{312}$ is fed, if both the fourth control signals FORC$_{11}$ and FORC$_{21}$ remain at a low level, no changes occur. Then, when the fourth control signal FORC$_{11}$ goes high, since either of the block selecting signal BS$_{311}$ or BS$_{312}$ has been changed to be at a low level, a low-level signal is output from the OR gate to which either of the block selecting signal BS$_{311}$ or BS$_{312}$ has been fed. This causes the NAND gate 230 to output the high-level SA activating signal SAAT$_{13}$, which is then fed to the third block. Then, when the fourth control signal FORC$_{21}$ goes high, since either of the block selecting signal BS$_{311}$ or BS$_{312}$ has been changed to be at a low level, a low-level signal is output from the OR gate to which either of the block selecting signal BS$_{311}$ or BS$_{312}$ has been fed. This causes the NAND gate 231 to output the high-level SA activating signal SAAT$_{23}$, which is then fed to the third block. Similarly, even when either of the low-level block selecting signal BS$_{322}$ or BS$_{324}$ is fed, if both the fourth control signals FORC$_{12}$ and FORC$_{22}$ remain at a low level, no changes occur. Then, when the fourth control signal FORC$_{12}$ goes high, since either of the block selecting signal BS$_{322}$ or BS$_{324}$ has been changed to be at a low level, a low-level signal is output from the OR gate to which either of the block selecting signal BS$_{322}$ or BS$_{324}$ has been fed. This causes the NAND gate 230 to output the high-level SA activating signal SAAT$_{13}$, which is then fed to the third block. Then, when the fourth control signal FORC$_{22}$ goes high, since either of the block selecting signal BS$_{322}$ or BS$_{324}$ has been changed to be at a low level, a low-level signal is output from the OR gate to which either of the block selecting signal BS$_{322}$ or BS$_{324}$ has been fed. This causes the NAND gate 231 to output the high-level SA activating signal SAAT$_{23}$, which is then fed to the third block.

Similarly, even when the low-level block selecting signal BS$_{334}$ is fed, if both the fourth control signals FORC$_{13}$ and FORC$_{23}$ remain at a low level, no changes occur. Then, when the fourth control signal FORC$_{13}$ first goes high, since the block selecting signal BS$_{334}$ has been changed to be at a low level, a low-level signal is output from the OR gate 220. This causes the NAND gate 230 to output the high-level SA activating signal SAAT$_{13}$, which is then fed to the third block. Furthermore, when the fourth control signal FORC$_{23}$ goes high, since the block selecting signal BS$_{334}$ has been changed to be at a low level, a low-level signal is output from the OR gate 225. This causes the NAND gate 231 to output the high-level SA activating signal SAAT$_{23}$, which is then fed to the third block. That is, after the activating signal generating circuit 20$_3$ has been selected from 8 pieces of the activating signal generating circuits 20$_1$ to 20$_8$ by any one of the low-level block selecting signals BS$_{311}$, BS$_{312}$, BS$_{322}$, BS$_{324}$ and BS$_{334}$, the high-level SA activating signals SAAT$_{13}$ and SAAT$_{23}$ are sequentially output with timing in which the fourth control signals FORC$_{11}$, FORC$_{12}$, FORC$_{13}$, FORC$_{22}$ and FORC$_{23}$ are sequentially changed to go high.

Figure 18:
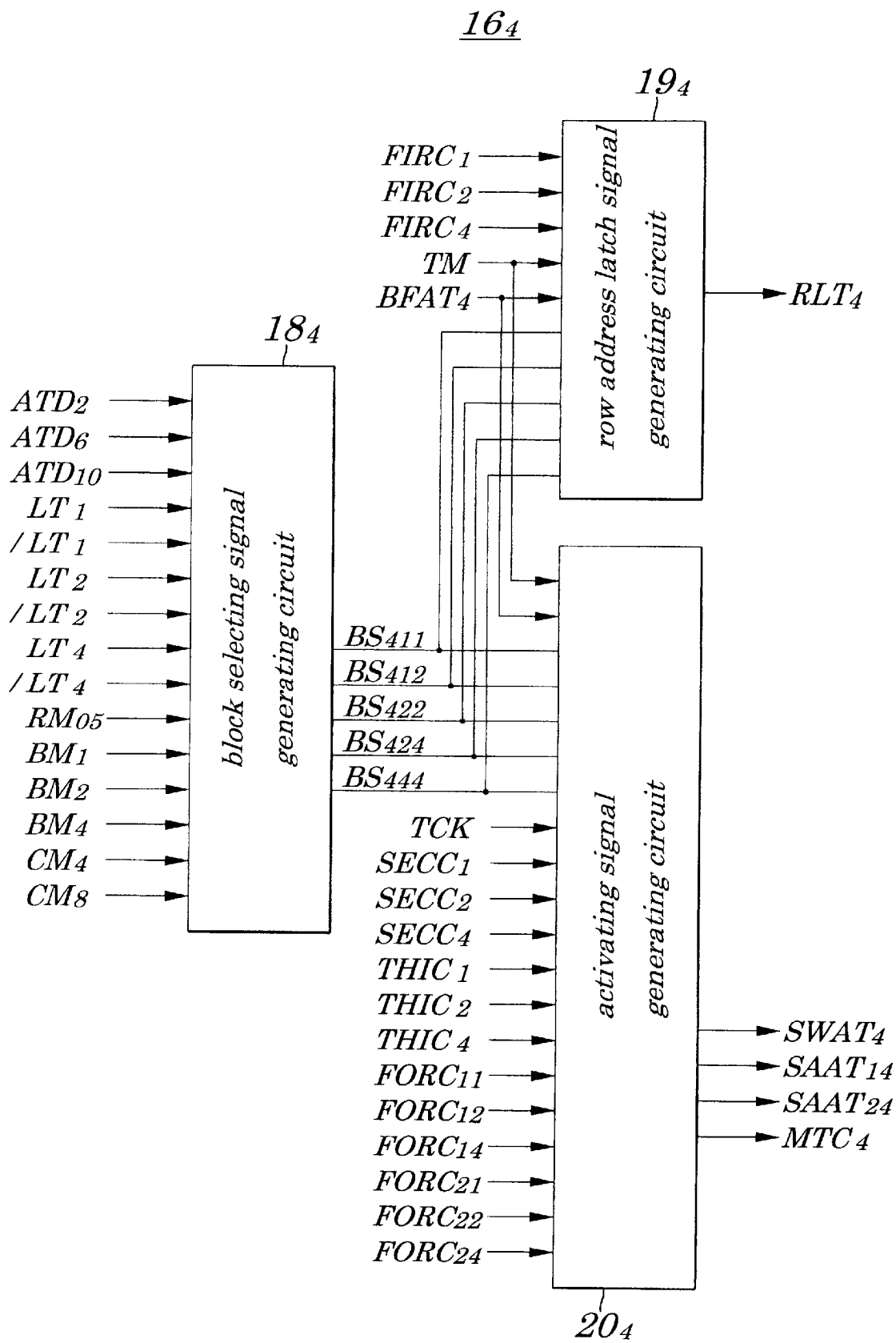
FIG. 18 is a schematic block diagram showing configurations of another block activating section employed in the memory according to the embodiment of the present invention.

The block activating section 16$_4$, as shown in FIG. 18, includes a block selecting signal generating circuit 18$_4$, a row address latch signal generating circuit $19_4$ and an activating signal generating circuit $20_4$.

The block selecting signal generating circuit $18_4$, based on the block activating designation signals $ATD_2$, $ATD_6$ and $ATD_{10}$ fed from the refresh decoder 15, latch signals $LT_1$, $LT_2$ and $LT_4$, reversed latch signals $/LT_1$, $/LT_2$ and $/LT_4$, refresh mode signal $RM_{O5}$, bank mode signals $BM_1$, $BM_2$ and $BM_4$ and capacity mode signals $CM_4$ and $CM_8$ all of which are fed from the control circuit 3, generates any one of a block selecting signal $BS_{411}$ used to activate the fourth block, if the memory block 1 is made up of one bank, by using all blocks belonging to the bank being operated, a block selecting signal $BS_{412}$ used to activate the fourth block, if the memory block 1 is made up of two banks, by using all blocks belonging to the first bank, a block selecting signal $BS_{422}$ used to activate the fourth block, if the memory block 1 is made up of two banks, by using all blocks belonging to the second bank, a block selecting signal $BS_{424}$ used to activate the fourth block, if the memory block 1 is made up of four banks, by using all blocks belonging to the second bank and a block selecting signal $BS_{444}$ used to activate the fourth block, if the memory block 1 is made up of four banks, by using all blocks belonging to the second bank.

Figure 19:
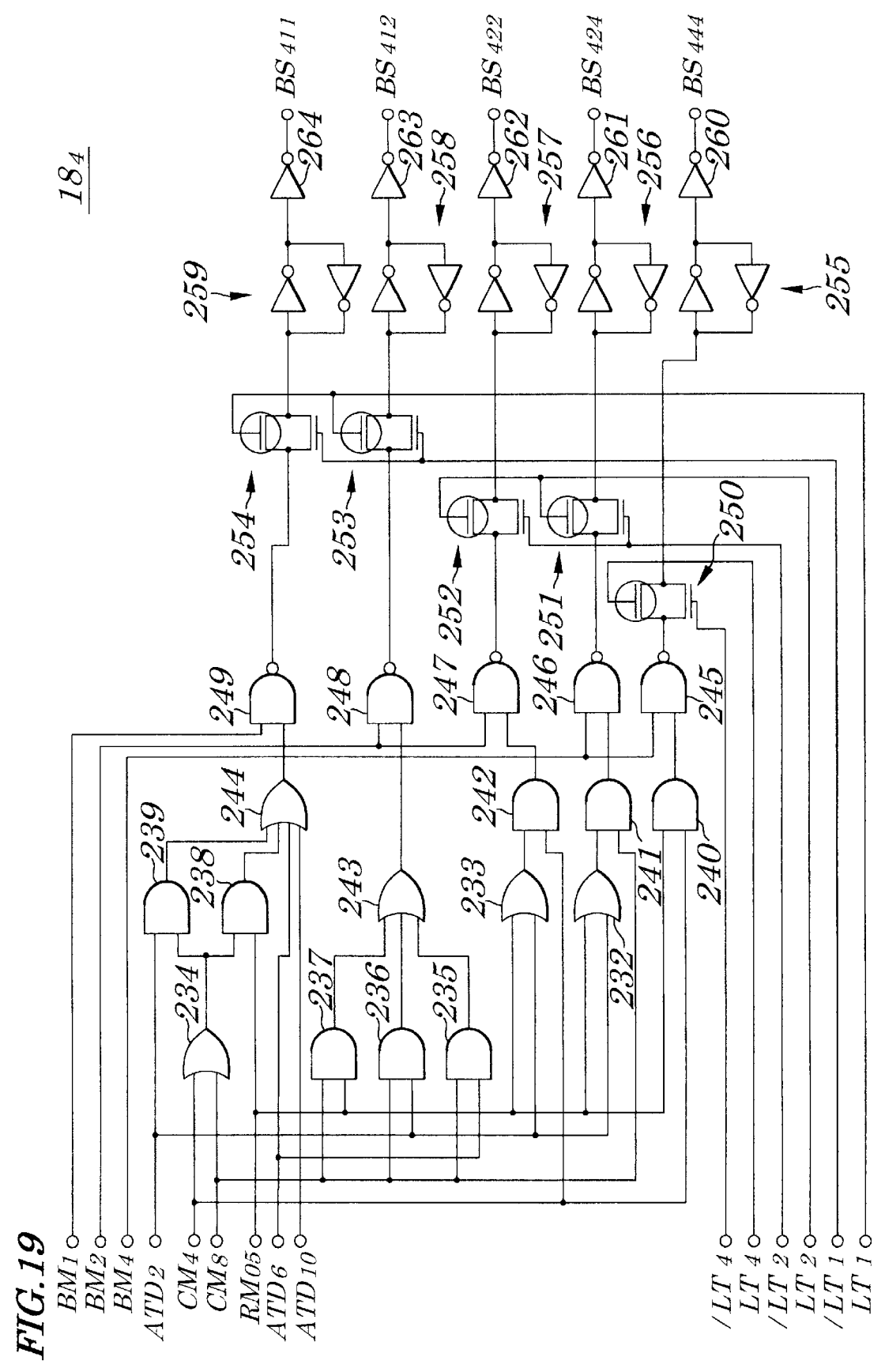

FIG. 19 is a schematic block diagram showing one example of configurations of the block selecting signal generating $18_4$ employed in the memory according to the embodiment. The block selecting signal generating 184 of the embodiment includes OR gates 232 to 243 each having two inputs, AND gates 235 to 242 each having two inputs, OR gate 243 having three inputs, OR gate 244 each having four inputs, NAND gates 245 to 249 each having two inputs, transfer gates 250 to 254, latches 255 to 259 and inverters 260 to 264.

When both the high-level refresh mode signal $RM_{O5}$ which goes high when the system designer sets the number of rows of memory cell arrays to be refreshed at 512k and the capacity mode signal $CM_4$ which goes high when the system designer sets a storage capacity at 4M bits, are fed simultaneously, a high-level signal is output from the AND gate 240. Therefore, if the high-level bank mode signal $BM_4$ which has gone high because the system designer had set the number of banks at 4, has been fed, a low-level signal is output from the NAND gate 245, which passes through the transfer gate 250 being turned ON and is reversed by the latch 255 to go high and then is again reversed by the inverter 260 to go low and is then output as the low-level block selecting signal $BS_{444}$ used to activate the fourth block, if the memory block 1 is made up of four banks, by using the whole blocks belonging to the fourth bank. Then, when the high-level latch signal $LT_4$ and the low-level reversed latch signal $/LT_4$ used to temporarily latch the block selecting signal BS to be fed to all the blocks belonging to the fourth bank are fed from the control circuit 3, the transfer gate 250 is turned OFF and while it is in an OFF state, a state of the block selecting signal $BS_{444}$ obtained before being reversed is being latched by the latch 255. Moreover, an aim of temporarily holding the state of the block selecting signal $BS_{444}$ obtained before being reversed in the latch 255 by using the high-level latch signal $LT_4$ and the low-level reversed latch signal $/LT_4$ is to prevent the block being now operated from becoming inactivated even when other blocks are activated at a later time compared with the block being now operated. The latches 256 to 257 are mounted because of the same reasons as above.

When either the high-level refresh mode signal $RM_{O5}$ or the block activating designation signal $ATD_2$ which is produced when the system designer sets the number of rows of memory cell arrays to be refreshed at 1k and when the high-level row address higher-bit signal $RAD_{10}$ is fed and the capacity mode signal $CM_8$ which goes high when the system designer sets a storage capacity at 8M bits, are fed simultaneously, a high-level signal is output from the AND gate 241. Therefore, if the high-level bank mode signal $BM_4$ has been fed, a low-level signal is output from the NAND gate 246, which passes through the transfer gate 251 being turned ON and is reversed by the latch 256 to go high and is again reversed by the inverter 261 to go low and is then output as a low-level block selecting signal $BS_{424}$ used to activate the fourth block, if the memory block 1 is made up of four banks, by using the whole blocks belonging to the second bank. Then, when the high-level latch signal $LT_2$ and the low-level reversed latch signal $/LT_2$ used to temporarily latch the block selecting signal BS to be fed to all the blocks belonging to the second bank are fed from the control circuit 3, since the transfer gate 251 is turned OFF, while it is in an OFF state, a state of the block selecting signal $BS_{324}$ obtained before being reversed is being latched by the latch 256.

When either the high-level refresh mode signal $RM_{O5}$ or the high-level block activating designation signal $ATD_2$ and the high-level capacity mode $CM_4$ are fed simultaneously, a high-level signal is output from the AND gate 242. Therefore, if the high-level bank mode $BM_2$ which has gone high because the system designer had set the number of banks at 2, has been fed, a low-level signal is output from the NAND gate 247, which passes through the transfer gate 252 and is reversed by the latch 257 to go high and is again reversed by the inverter 262 to go low and is then output as the low-level block selecting signal $BS_{422}$ used to activate the fourth block, if the memory block 1 is made up of two banks, by using the whole blocks belonging to the second bank. Then, when the high-level latch signal $LT_2$ and the low-level reversed latch signal $/LT_2$ are fed from the control circuit 3, since the transfer gate 252 is turned OFF, while it is in an OFF state, a state of the block selecting signal $BS_{422}$ obtained before being reversed is being latched by the latch 257.

When both the block activating designation signal $ATD_6$ which is produced when the system designer sets the number of rows of memory cell arrays to be refreshed at 2k and when the high-level row address higher-bit signals $RAD_{10}$ and the high-level row address higher-bit signal $RAD_{11}$ are fed and the capacity mode signal $CM_8$ are fed simultaneously, a high-level signal is output from the AND gate 235. Moreover, when both the high-level block activating designation signal $ATD_2$ and the high-level capacity mode signal $CM_8$ are fed, a high-level signal is output from the AND gate 236. When both the high-level refresh mode signal $RM_{O5}$ and the high-level capacity mode signal $CM_8$ are fed simultaneously, a high-level signal is output from the AND gate 237. Since a high-level signal is output from the OR gate 243 in any case, if the high-level bank mode signal $BM_2$ has been fed, a low-level signal is output from the NAND gate 248, which passes through the transfer gate 253 being turned ON and is reversed by the latch 258 to become high and then again reversed by the inverter 263 to become low and is output as the low-level block selecting signal $BS_{412}$ used to activate the fourth block, if the memory block 1 is made up of two banks, by using the whole blocks belonging to the first bank. Then, when the high-level latch signal $LT_1$ and the low-level reversed latch signal $/LT_1$ used to temporarily hold the block selecting signal BS to be fed to all the block belonging to the first bank are fed from the control circuit 3, since the transfer gate 253 is turned OFF, while it is in an OFF state, a state of the block selecting signal $BS_{412}$ obtained before being reversed is being latched by the latch 258.

Moreover, in all cases where either the block activating designation signal $ATD_6$ or the block activating designation signal $ATD_{10}$ produced when the system designer sets the number of rows of memory cell arrays to be refreshed at 4 k and when the high-level row address higher-bit signal $RAD_{10}$, high-level row address higher-bit signal $RAD_{11}$ and high-level reversed row address higher-bit signal $/RAD_{12}$ and where either the high-level capacity mode signal $CM_4$ or $CM_3$ and the high-level refresh mode signal $RM_{05}$ are fed simultaneously and where either the high-level capacity mode signal $CM_4$ or $CM_8$ and the high-level block activating designation signal $ATD_2$ are fed simultaneously, a high-level signal is output from the OR gate 244. Therefore, if the high-level bank mode $BM_1$ which has gone high because the system designer had set the number of banks at one, has been fed to the NAND gate 249, a low-level signal is output from the NAND gate 249, which passes through the transfer gate 169 being turned ON and is reversed by the latch 259 to go high and is again reversed by the inverter 264 to go low and is then output as the low-level block selecting signal $BS_{411}$ used to activate the fourth block, if the memory block 1 is made up of one bank, by using the whole blocks belonging to the bank being operated. When the high-level latch signal $LT_1$ and the low-level reversed latch signal $/LT_1$ are fed from the control circuit 3, since the transfer gate 254 is turned OFF, while the transfer gate 254 is in an OFF state, a state of the block selecting signal $BS_{411}$ obtained before being reversed is being held by the latch 259. Moreover, when the system designer sets the number of rows of memory cell arrays to be refreshed at 512, the high-level refresh mode signal $RM_{05}$ is fed and even when the system designer sets the number of banks to any value, one of the block selecting signals BS is output. This is because no block activating designation signal ATD is produced, as is understood from FIG. 5.

Next, the row address latch signal generating circuit $19_4$ shown in FIG. 18, based on first control signals $FIRC_1$, $FIRC_2$ and $FIRC_4$ and test mode signal TM, block forcedly-activating signal $BFAT_3$ all of which are output from the control circuit 3 and block selecting signals $BS_{411}$, $BS_{412}$, $BS_{422}$, $BS_{424}$ and $BS_{444}$ supplied from the block selecting signal generating circuit $18_4$, generates the row address latch signal $RLT_4$ used to temporarily hold row addresses decoded by the row decoder 10 (see FIG. 3) and feeds them to the fourth block.

Figure 20:
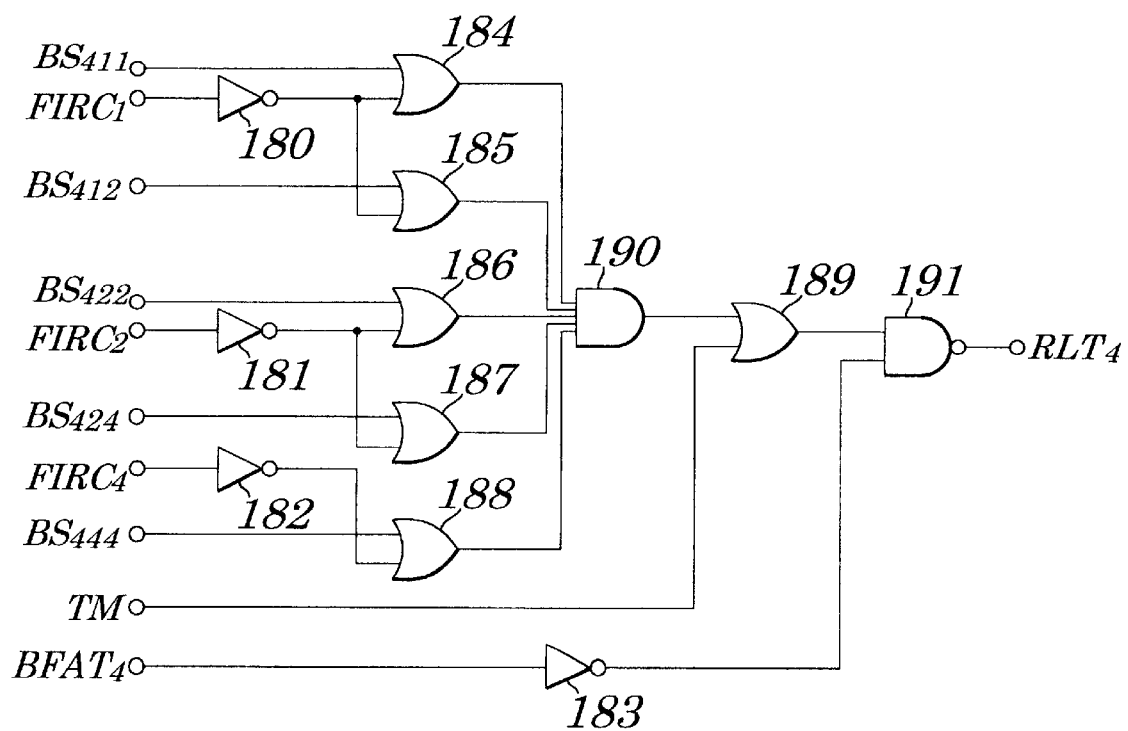
FIG. 20 is a schematic block diagram showing one example of configurations of another row address latch signal generating circuit employed in the memory according to the embodiment of the present invention.

FIG. 20 is a schematic block diagram showing one example of configurations of another row address latch signal generating circuit $19_4$. In FIG. 20, same reference numbers are assigned to corresponding parts in FIG. 16 and their descriptions are omitted accordingly. In the row address latch signal generating circuit $19_4$ shown in FIG. 20, instead of the block selecting signals $BS_{311}$, $BS_{312}$, $BS_{322}$, $BS_{324}$ and $BS_{334}$, first control signal $FIRC_3$ and block forcedly-activating signal $BFAT_3$ shown in FIG. 16, the block selecting signals $BS_{411}$, $BS_{412}$, $BS_{422}$, $BS_{424}$ and $BS_{444}$ are newly input from the block selecting signal generating circuit $18_4$ and, at the same time, a first control signal $FIRC_4$ and block forcedly-activating signal $BFAT_4$ are newly input from the control circuit 3 and, instead of the row address latch signal $RLT_3$, the row address latch signal $RLT_4$ is newly output. That is, configurations of the row address latch signal generating circuit $19_4$ are the same as those of the row address latch signal generating circuit $19_3$ except for signals input and output thereto or therefrom. Therefore, after the row address latch signal generating circuit $19_4$ has been selected out of 8 pieces of the row address latch signal generating circuits $19_1$ to $19_8$ by any one of the low-level block selecting signals $BS_{411}$, $BS_{412}$, $BS_{422}$, $BS_{424}$ and $BS_{444}$, the high-level row address latch signal $RLT_4$ is output with timing in which the first control signals $FIRC_1$, $FIRC_4$ and $FIRC_4$ are changed to go high, and is then fed to the fourth block.

Moreover, at a time of the test, since the test mode signal TM changes to go high, irrespective of supply of the block selecting signals $BS_{411}$, $BS_{412}$, $BS_{422}$, $BS_{424}$ and $BS_{444}$ and the first control signals $FIRC_1$, $FIRC_2$ and $FIRC_4$, the high-level row address latch signal $RLT_4$ is output with timing in which the block forcedly-activating signal $BFAT_4$ changes to go high.

The activating signal generating circuit $20_4$, based on the second control signals $SECC_1$, $SECC_2$ and $SECC_4$, third control signals $THIC_1$, $THIC_2$ and $THIC_4$, fourth control signals $FORC_{11}$, $FORC_{12}$, $FORC_{14}$, $FORC_{21}$, $FORC_{22}$ and $FORC_{24}$, test mode signal TM, test clock TCK and block forcedly-activating signal $BFAT_4$ all of which are fed from the control circuit 3 and the block selecting signals $BS_{411}$, $BS_{412}$, $BS_{422}$, $BS_{424}$ and $BS_{444}$ fed from the block selecting signal generating circuit $18_4$, generates the sub-word activating signal $SWAT_4$ used to activate sub-word lines of the MCA making up the fourth block contained in the memory block 1, two kinds of SA activating signals $SAAT_{14}$ and $SAAT_{24}$ used to activate two SAs making up the fourth block contained in the memory block 1 and the main-word timing control signal $MTC_4$ used to control timing with which the row decoder 10 outputs the main-word activating signal MWAT, and feeds them to the third block.

Figure 21:
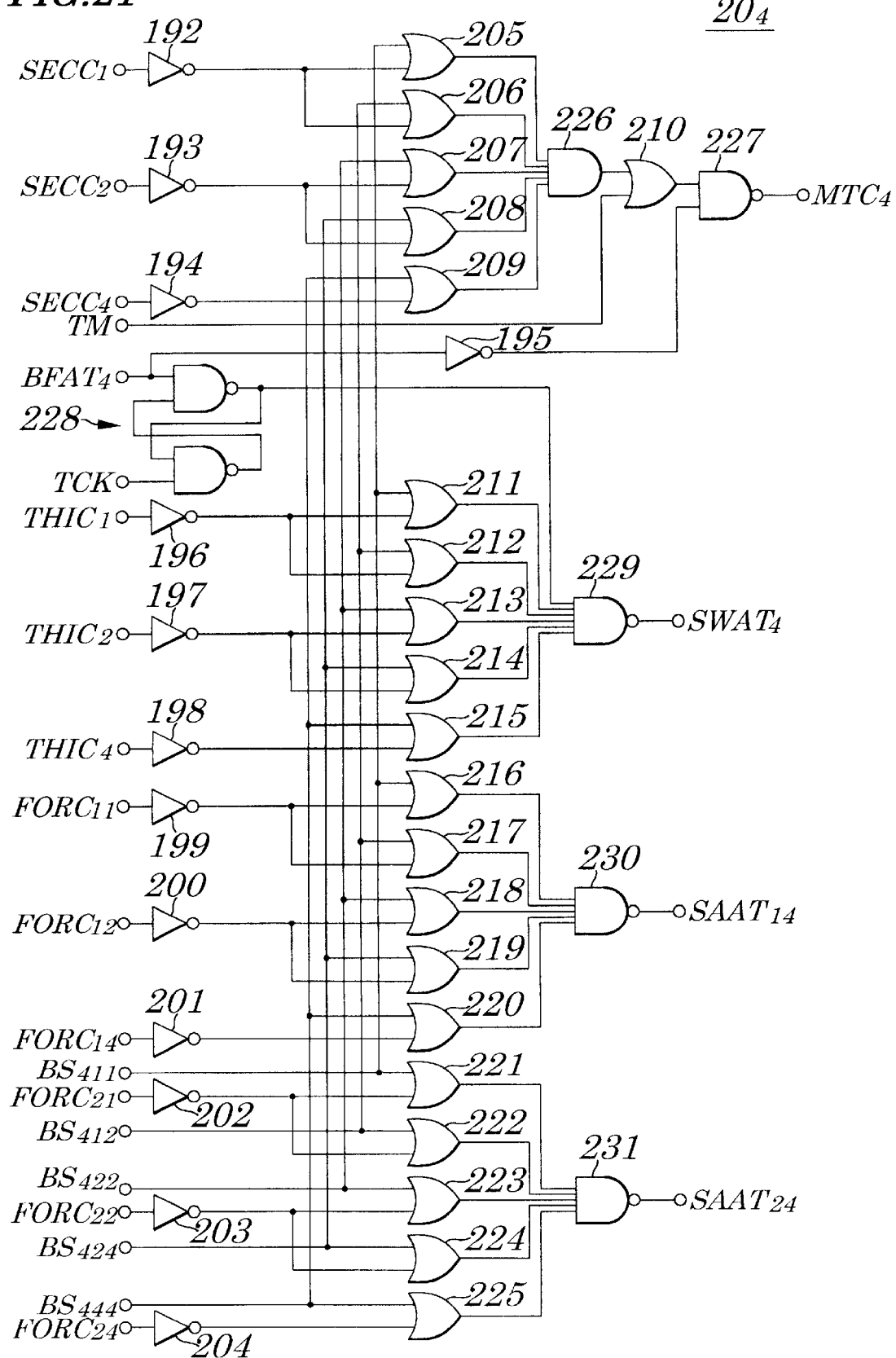
FIG. 21 is a schematic block diagram showing one example of configurations of another activating signal generating circuit employed in the memory according to the embodiment of the present invention.

FIG. 21 is a schematic block diagram showing one example of configurations of the activating signal generating circuit $20_4$. In FIG. 21, same reference numbers are assigned to corresponding parts in FIG. 17 and their descriptions are omitted accordingly. In the activating signal generating circuit $20_4$ shown in FIG. 21, instead of the block selecting signals $BS_{311}$, $BS_{312}$, $BS_{322}$, $BS_{324}$ and $BS_{334}$, second control signal $FIRC_3$, third control signal $THIC_3$, fourth control signals $FORC_{13}$ and $FORC_{23}$ and block forcedly-activating signal $BFAT_3$ shown in FIG. 17, the block selecting signals $BS_{411}$, $BS_{412}$, $BS_{422}$, $BS_{424}$ and $BS_{444}$ are newly input from the block selecting signal generating circuit $18_4$ and, at the same time, the second control signal $SECC_4$, third control signal $THIC_4$, fourth control signals $FORC_{14}$ and $FORC_{24}$ and block forcedly-activating signal $BFAT_4$ are newly input from the control circuit 3 and, instead of the sub-word activating signal $SWAT_3$, SA activating signals $SAAT_{13}$ and $SAAT_{23}$ and the main-word timing control signal $MTC_3$, the sub-word activating signal $SWAT_4$, SA activating signals $SAAT_{14}$ and $SAAT_{24}$ and main-word timing control signal $MTC_4$ are newly output. That is, configurations of the row address latch signal generating circuit $20_4$ are the same as those of the row address latch signal generating circuit $20_3$ except for signals input and output thereto or therefrom.

Therefore, after the row address latch signal generating circuit $20_4$ has been selected out of 8 pieces of the row address latch signal generating circuits $20_1$ to $20_8$ by any one of the low-level block selecting signals $BS_{411}$, $BS_{412}$, $BS_{422}$, $BS_{424}$ and $BS_{444}$, the high-level main-word timing control signal $MTC_4$ is output with timing in which any one of the second control signals $SECC_1$, $SECC_2$ and $SECC_4$ are changed to go high, and is then fed to the fourth block.

Moreover, at a time of the test, since the test mode signal TM changes to go high, irrespective of supply of the block selecting signals $BS_{411}$, $BS_{412}$, $BS_{422}$, $BS_{424}$ and $BS_{444}$ and the second control signals $SECC_1$, $SECC_2$ and $SECC_4$, the high-level main-word timing control signal $MTC_4$ is output with timing in which the block forcedly-activating signal $BFAT_4$ changes to go high.

After the activating signal generating circuit $20_4$ has been selected out of 8 pieces of the activating signal generating circuits $20_1$ to $20_8$ by any one of the low-level block selecting signals $BS_{411}$, $BS_{412}$, $BS_{422}$, $BS_{424}$ and $BS_{444}$, the high-level sub-word activating signal $SWAT_4$ is output with timing in which any one of the third control signals $THIC_1$, $THIC_2$ and $THIC_4$ is changed to go high, and is then fed to the fourth block.

Moreover, at a time of the test, the test clock TCK is first fed and, after the block forcedly-activating signal $BFAT_4$ has risen to go high at a time of a fourth rise of the test clock TCK, an output signal from the SR latch 228 changes to go low at a time of a fourth fall of the test clock TCK. Therefore, a high-level sub-word activating signal $SWAT_4$ is output, irrespective of supply of the block selecting signal $BS_{411}$, $BS_{412}$, $BS_{424}$ and $BS_{444}$ and the third control signals $THIC_1$, $THIC_2$ and $THIC_4$, with timing in which the test clock TCK falls fourth.

Moreover, after the activating signal generating circuit $20_4$ has been selected out of 8 pieces of the activating signal generating circuits $20_1$ to $20_8$ by any one of the low-level block selecting signals $BS_{411}$, $BS_{412}$, $BS_{422}$, $BS_{424}$ and $BS_{444}$, the high-level SA activating signals $SAAT_{14}$ and $SAAT_{24}$ are sequentially output with timing in which two kinds of the fourth control signals $FORC_{11}$ and $FORC_{21}$, the fourth control signals $FORC_{12}$, $FORC_{22}$, $FORC_{14}$ and $FORC_{24}$ are sequentially changed to go high.

Figure 22:
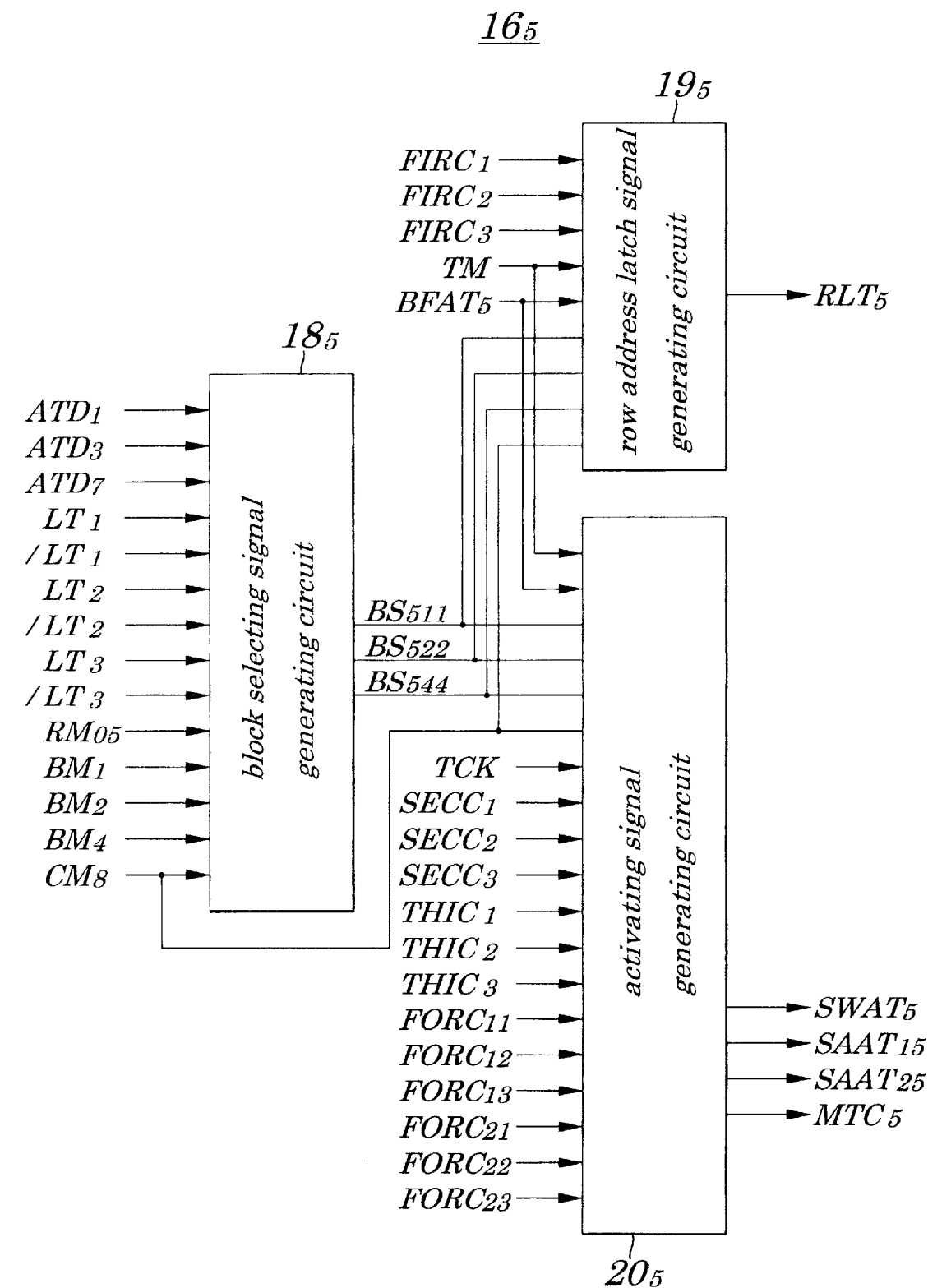
FIG. 22 is a schematic block diagram showing configurations of another block activating section employed in the memory according to the embodiment of the present invention.

The block activating section $16_5$, as shown in FIG. 22, includes a block selecting signal generating circuit $18_5$, a row address latch signal generating circuit $19_5$ and an activating signal generating circuit $20_5$.

The block selecting signal generating circuit $18_5$, based on the block activating designation signals $ATD_1$, $ATD_3$ and $ATD_7$ fed from the refresh decoder 15, latch signals $LT_1$ to $LT_3$, reversed latch signals $/LT_1$ to $/LT_3$, refresh mode signal $RM_{O5}$, bank mode signals $BM_1$, $BM_2$ and $BM_4$ and capacity mode signal $CM_8$ all of which are fed from the control circuit 3, generates any one of a block selecting signal $BS_{511}$ used to activate the fifth block, if the memory block 1 is made up of one bank, by using all blocks belonging to the bank being operated, a block selecting signal $BS_{522}$ used to activate the fifth block, if the memory block 1 is made up of two banks, by using all blocks belonging to the second bank and a block selecting signal $BS_{544}$ used to activate the fifth block, if the memory block 1 is made up of four banks, by using all blocks belonging to the third bank.

Figure 23:
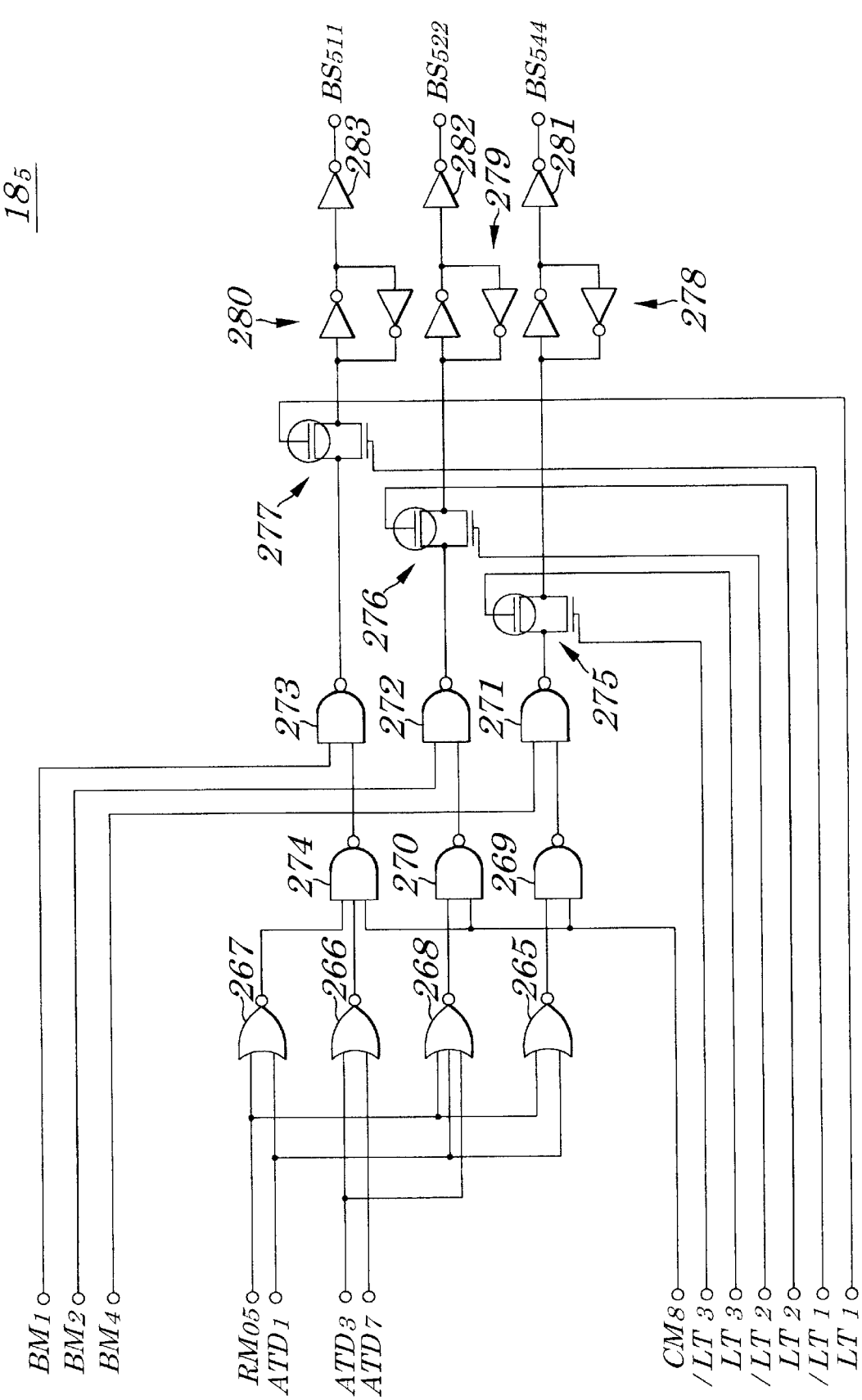
FIG. 23 is a schematic block diagram showing one example of configurations of another block selecting signal generating circuit employed in the memory according to the embodiment of the present invention.

FIG. 23 is a schematic block diagram showing one example of configurations of the block selecting signal generating $18_5$ employed in the memory according to the embodiment. The block selecting signal generating $18_5$ of the embodiment includes NOR gates 265 to 267 each having two inputs, NOR gate 268 having three inputs, NAND gates 269 to 273 each having two inputs, NAND gate 274 having three input, transfer gates 275 to 277, latches 278 to 280 and inverters 281 to 283.

When either the high-level refresh mode signal $RM_{O5}$ which goes high when the system designer sets the number of rows of memory cell arrays to be refreshed at 512k or the block activating designation signal $ATD_1$ produced when the system designer sets the number of rows of memory cell arrays to be refreshed at 1k and when the high-level reversed row address higher-bit signal $/RAD_{10}$ is fed, and when the high-level capacity mode signal $CM_4$ which goes high when the system designer sets the storage capacity at 8M bits, if the bank mode signal $BM_4$ which has gone high because the system designer sets the number of banks at 4 has been fed, a low-level signal is output from the NAND gate 271, which passes through the transfer gate 275 being turned ON and is reversed by the latch 278 to go high and then is again reversed by the inverter 281 to go low and is then output as the low-level block selecting signal $BS_{544}$ used to activate the fifth block, if the memory block 1 is made up of four banks, by using the whole blocks belonging to the third bank. Then, when the high-level latch signal $LT_3$ and the low-level reversed latch signal $/LT_3$ used to temporarily latch the block selecting signal BS to be fed to all the blocks belonging to the third bank are fed from the control circuit 3, since the transfer gate 275 is turned OFF, while it is in an OFF state, a state of the block selecting signal $BS_{544}$ obtained before being reversed is being latched by the latch 278. Moreover, an aim of temporarily holding the state of the block selecting signal $BS_{544}$ obtained before being reversed in the latch 278 by using the high-level latch signal $LT_3$ and the low-level reversed latch signal $/LT_3$ is to prevent the block being now operated from becoming inactivated even when other blocks are activated at a later time compared with the block being now operated. The latches 279 to 280 are mounted because of the same reasons as above.

When any one of the high-level refresh mode signal $RM_{O5}$, the high-level block activating designation signal $ATD_1$ and the block activating designation signal $ATD_3$ produced when the system designer sets the number of rows of memory cell arrays to be refreshed at 2k and when the high-level reversed row address higher-bit signal $/RAD_{10}$ and the high-level reversed row address higher-bit signal $/RAD_{11}$ are supplied, is fed and, at the same time, the high-level capacity mode signal $CM_8$ is fed, if the high-level bank mode signal $BM_4$ which has gone high because the system designer sets the number of banks at 2 has been fed, a low-level signal is output from the NAND gate 272, which passes through the transfer gate 276 being turned ON and is reversed by the latch 279 to go high and then is again reversed by the inverter 282 to go low and is then output as the low-level block selecting signal $BS_{522}$ used to activate the fifth block, if the memory block 1 is made up of two banks, by using the whole blocks belonging to the second bank. Then, when the high-level latch signal $LT_2$ and the low-level reversed latch signal $/LT_2$ used to temporarily latch the block selecting signal BS to be fed to all the blocks belonging to the second bank are fed from the control circuit 3, since the transfer gate 276 is turned OFF, while it is in an OFF state, a state of the block selecting signal $BS_{522}$ obtained before being reversed is being latched by the latch 279.

When either the high-level refresh mode signal $RM_{O5}$ or the high-level block activating designation signal $ATD_1$ is fed and either the high-level block activating designation signal $ATD_3$ or the block activating designation signal $ATD_7$ produced when the system designer sets the number of rows of memory cell arrays to be refreshed at 4k and when the high-level reversed row address higher-bit signal $/RAD_{10}$, the high-level reversed row address higher-bit signal $/RAD_{11}$ and the high-level reversed row address higher-bit signal $/RAD_{12}$ are supplied, is fed and, at the same time, the high-level capacity mode signal $CM_8$ is fed, if the high-level bank mode signal $BM_4$ which has gone high because the system designer had set the number of banks at 2 has been fed, a low-level signal is output from the NAND gate 273, which passes through the transfer gate 277 being turned ON and is reversed by the latch 280 to go high and then is again reversed by the inverter 283 to go low and is then output as the low-level block selecting signal $BS_{511}$ used to activate the fifth block, if the memory block 1 is made up of four banks, by using the whole blocks belonging to the third bank. Then, when the high-level latch signal $LT_1$ and the low-level reversed latch signal $/LT_1$ used to temporarily latch the block selecting signal BS to be fed to all the blocks belonging to the first bank are fed from the control circuit 3, since the transfer gate 277 is turned OFF, while it is in an OFF state, a state of the block selecting signal $BS_{511}$ obtained before being reversed is being latched by the latch 280. Moreover, when the system designer sets the number of rows of memory cell arrays to be refreshed at 512, the high-level refresh mode signal $RM_{05}$ is fed and even when the system designer sets the number of banks to any value, one of the block selecting signals BS is output. This is because no block activating designation signal ATD is produced, as is understood from FIG. 5.

Next, the row address latch signal generating circuit $19_5$ shown in FIG. 22, based on first control signals $FIRC_1$ to $FIRC_3$, test mode signal TM, block forcedly-activating signal $BFAT_5$ and capacity mode signal $CM_8$ all of which are output from the control circuit 3 and block selecting signals $BS_{511}$, $BS_{522}$, $BS_{544}$ supplied from the block selecting signal generating circuit $18_5$, generates the row address latch signal $RLT_5$ used to temporarily hold row addresses decoded by the row decoder 10 (see FIG. 3) and feeds them to the fifth block.

Figure 24:
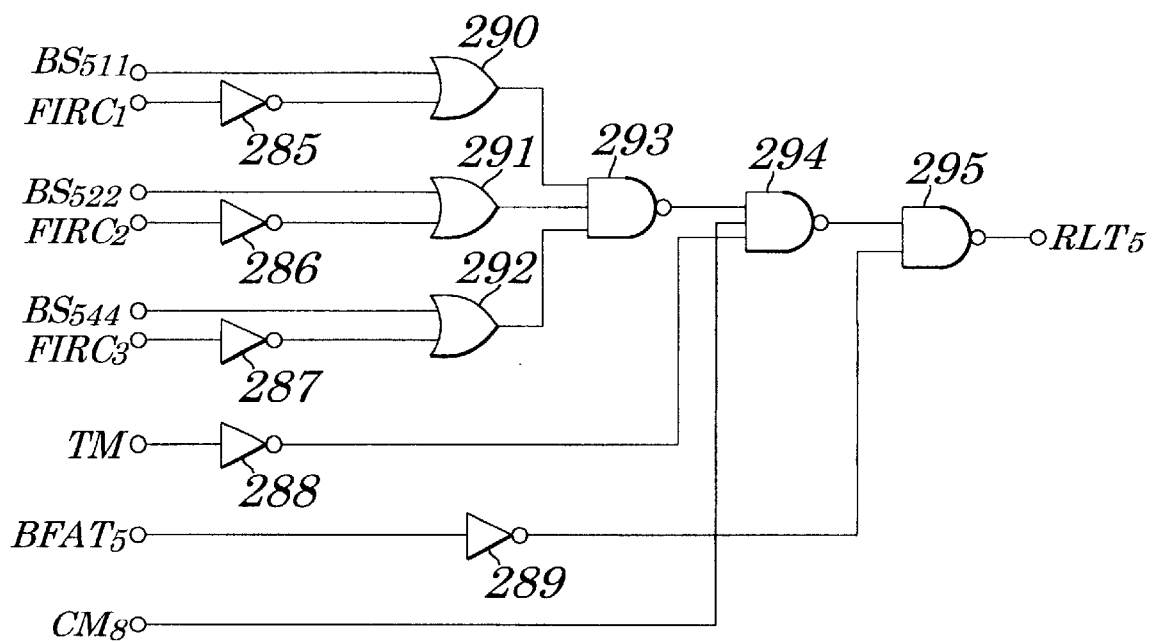
FIG. 24 is a schematic block diagram showing one example of configurations of another row address latch signal generating circuit employed in the memory according to the embodiment of the present invention.

FIG. 24 is a schematic block diagram showing one example of configurations of another row address latch signal generating circuit $19_5$ employed in the memory according to the embodiment. The row address latch signal generating circuit $19_5$ includes inverters 285 to 289, OR gates 290 to 292 each having two inputs, NAND gates 293 to 294 each having three inputs and NAND gate 295 having two inputs.

In a state where all the block selecting signals $BS_{511}$, $BS_{522}$ and $BS_{544}$ are fed as high-level signals from the block selecting signal generating circuit $18_5$ and, at the same time, the first control signals $FIRC_1$ to $FIRC_3$ used to control timing with which the row address latch signal RLT is output to the first to third banks are fed as low level signals, since a high-level signal is output from all the OR gates 290 to 292, a low-level signal is output from the NAND gate 293. Normally, the test mode TM and the block forcedly-activating signal $BFAT_5$ are fed as low-level signals. Therefore, when the capacity mode signal $CM_8$ which goes high when the system designer sets the storage capacity at 8M bits is fed, in this state, the low-level row address latch signal $RLT_5$ is output from the NAND gate 295. Next, even when the block selecting signals $BS_{511}$ is fed as the low-level signal, if the first control signal $FIRC_1$ remains at a low level, no changes occur. Then, when the first control signal $FIRC_1$ changes to go high, since the block selecting signals $BS_{511}$ has been changed to go low, a low-level signal is output from the OR gate 290. Since this causes the NAND gate 293 to output a low-level signal, the high-level row address latch signal $RLT_5$ is output from the NAND gate 295 and is then fed to the fifth block. Similarly, even if the low-level block selecting signal $BS_{522}$ is fed, if the first control signal $FIRC_2$ remains at a low level, no changes occur. Then, the first control signal $FIRC_2$ changes to go high, since the block selecting signal $BS_{522}$ has changed to go low, a low-level signal is output from the OR gate 291. Since this causes the NAND gate 293 to output a high-level signal, the high-level row address latch signal $RLT_5$ is output from the NAND gate 295, which is then fed to the fifth block. Similarly, even when the low-level block selecting signal $BS_{544}$ is fed, if the first control signal $FIRC_3$ remains at a low level, no changes occur. When the first control signal $FIRC_3$ changes to go high, since the block selecting signal $BS_{544}$ has changed to be at a low level, a low-level signal is output from the OR gate 292. Since this causes the NAND gate 293 to output a high-level signal, the high-level row address latch signal $RLT_5$ is output from the NAND gate 295, which is then fed to the fifth block. That is, after the row address latch signal generating circuit $19_5$ has been selected out of 8 pieces of the row address latch signal generating circuits $19_1$ to $19_8$ by any one of the low-level block selecting signals $BS_{511}$, $BS_{522}$ and $BS_{544}$, the high-level row address latch signal $RLT_5$ is output with timing in which the first control signals $FIRC_1$ to $FIRC_3$ changes to go high, and is then fed to the fifth block. Moreover, at a time of the test, since the test mode signal TM changes to go high, irrespective of supply of the block selecting signals $BS_{511}$, $BS_{522}$ and $BS_{544}$ and the first control signal $FIRC_1$ to $FIRC_3$, with timing in which the block forcedly-activating signal $BFAT_5$ changes to go high, the high-level row address latch signal $RLT_5$ is output.

The activating signal generating circuit $20_5$ shown in FIG. 22, based on the second control signals $SECC_1$ to $SECC_3$, third control signals $THIC_1$ to $THIC_3$, fourth control signals $FORC_{11}$ to $FORC_{13}$ and $FORC_{21}$ to $FORC_{23}$, test mode signal TM, test clock TCK, block forcedly-activating signal $BFAT_5$ and capacity mode signal $CM_8$ all of which are fed from the control circuit 3 and the block selecting signals $BS_{511}$, $BS_{522}$ and $BS_{544}$ fed from the block selecting signal generating circuit $18_5$, generates the sub-word activating signal $SWAT_5$ used to activate sub-word lines of the MCA making up the fifth block contained in the memory block 1, two kinds of SA activating signals $SAAT_{15}$ and $SAAT_{25}$ used to activate two SAs making up the fifth block contained in the memory block 1 and the main-word timing control signal $MTC_5$ used to control timing with which the row decoder 10 outputs the main-word activating signal MWAT, and feeds them to the fifth block.

Figure 25:
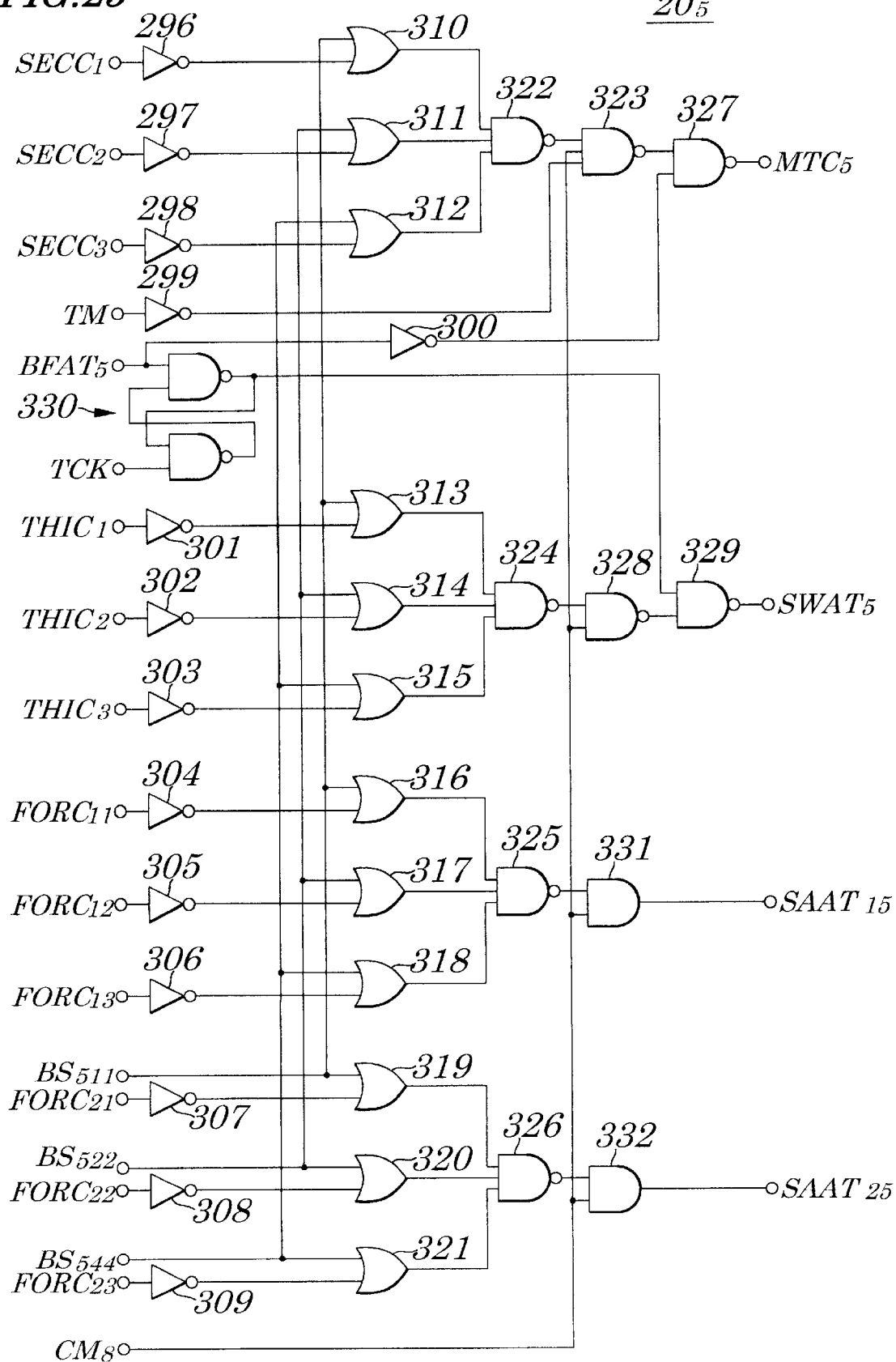
FIG. 25 is a schematic block diagram showing one example of configurations of another activating signal generating circuit employed in the memory according to the embodiment of the present invention.

FIG. 25 shows one example of configurations of the activating signal generating circuit $20_5$. The activating signal generating circuit $20_5$ of the embodiment includes inverters 296 to 309, OR gates 310 to 321 each having two inputs, NAND gates 322 to 326 each having three inputs, NAND gates 327 to 329 each having two inputs, an SR latch 330, AND gates 331 and 332 each having two inputs.

In a state where all the block selecting signals $BS_{511}$, $BS_{522}$ and $BS_{544}$ are fed as high-level signals from the block selecting signal generating circuit 18, and, at the same time, the second control signals $SECC_1$ to $SECC_3$ used to control timing with which the main-word timing control signal MTC is output to the first to third banks are fed as low level signals, since a high-level signal is output from all the OR gates 310 to 312, a low-level signal is output from the NAND gate 322. Normally, the test mode TM and the block forcedly-activating signal $BFAT_5$ are fed as low-level signals. Therefore, when the high-level capacity mode signal $CM_8$ is fed, in this state, the low-level main-word timing control signal $MTC_5$ is output from the NAND gate 327. Next, even when the block selecting signals $BS_{511}$ is fed as the low-level signal, if the second control signal $SECC_1$ remains at a low level, no changes occur. Then, when the second control signal $SECC_1$ changes to go high, since the block selecting signals $BS_{511}$ has been changed to go low, a low-level signal is output from the OR gate 310. Since this causes the NAND gate 322 to output a high-level signal, the high-level main-word timing control signal $MTC_5$ is output from the NAND gate 327 and is then fed to the fifth block. Similarly, even if the low-level block selecting signal $BS_{522}$ is fed, if the second control signal $SECC_1$ remains at a low level, no changes occur. Then, the second control signal $SECC_2$ changes to go high, since the block selecting signal $BS_{522}$ has changed to go low, a low-level signal is output from the OR gate 311. Since this causes the NAND gate 322 to output a high-level signal, the high-level main-word timing control signal $MTC_5$ is output from the NAND gate 327, which is then fed to the fifth block. Similarly, even when the low-level block selecting signal $BS_{544}$ is fed, if the second control signal $SECC_3$ remains at a low level, no changes occur. Then, the second control signal $SECC_3$ changes to go high, since the block selecting signal $BS_{544}$ has changed to go low, a low-level signal is output from the OR gate 312. Since this causes the NAND gate 322 to output a high-level signal, the high-level main-word timing control signal $MTC_5$ is output from the NAND gate 327, which is then fed to the fifth block. That is, after the activating signal generating circuit $20_5$ has been selected out of 8 pieces of the activating signal generating circuits $20_1$ to $20_8$ by any one of the low-level block selecting signals $BS_{511}$, $BS_{522}$ and $BS_{544}$, the high-level main-word timing control signal $MTC_5$ is output with timing in which any one of the second control signals $SECC_1$, $SECC_2$ and $SECC_3$ changes to go high, and is then fed to the fifth block. Moreover, at a time of the test, since the test mode signal TM changes to go high, irrespective of supply of the block selecting signals $BS_{511}$, $BS_{522}$ and $BS_{544}$ and the second control signal $SECC_1$ to $SECC_3$, with timing in which the block forcedly-activating signal $BFAT_5$ changes to go high, the high-level main-word timing control signal $MTC_5$ is output.

In a state where all the block selecting signals $BS_{511}$, $BS_{522}$ and $BS_{544}$ are fed as high-level signals from the block selecting signal generating circuit $18_5$ and, at the same time, the third control signals $THIC_1$ to $THIC_3$ used to control timing with which the sub-word activating signal SWAT is output to the first to third banks are fed as low level signals, a high-level signal is output from all the OR gates 313 to 315. Normally, since the block forcedly-activating signal $BFAT_5$ is fed as the low-level signal and the test clock TCK is not fed, a high-level signal is output from the SR latch 330. Therefore, when the high-level capacity mode signal $CM_8$ is fed, in this state, the low-level sub-word activating signal $SWAT_5$ is output from the NAND gate 329. Next, even when the low-level block selecting signals $BS_{511}$ is fed, if the third control signal $THIC_1$ remains at a low level, no changes occur. Then, when the third control signal $THIC_1$ changes to go high, since the block selecting signals $BS_{511}$ has been changed to be at a low level, a low-level signal is output from the OR gate 313. Since this causes the NAND gate 324 to output a high-level signal, the high-level sub-word activating signal $SWAT_5$ is output from the NAND gate 329 and is fed to the fifth block. Similarly, even when the low-level block selecting signal $BS_{522}$ is fed, if the third control signal $THIC_2$ remains at a low level, no changes occur. Then, the third control signal $THIC_2$ changes to go high, since the block selecting signal $BS_{522}$ has changed to go low, a low-level signal is output from the OR gate 314. Since this causes the NAND gate 324 to output a high-level signal, the high-level sub-word activating signal $SWAT_5$ is output from the NAND gate 329, which is then fed to the fifth block. Similarly, even when the low-level block selecting signal $BS_{544}$ is fed, if the third control signal $THIC_3$ remains at a low level, no changes occur. Then, when the third control signal $THIC_3$ changes to go high, since the block selecting signal $BS_{544}$ has changed to go low, a low-level signal is output from the OR gate 315. Since this causes the NAND gate 324 to output a high-level signal, the high-level sub-word activating signal $SWAT_5$ is output from the NAND gate 329, which is then fed to the fifth block. That is, after the activating signal generating circuit $20_5$ has been selected from 8 pieces of the activating signal generating circuits $20_1$ to $20_8$ by any one of the high-level block selecting signals $BS_{511}$, $BS_{522}$ and $BS_{544}$, the high-level sub-word activating signal $SWAT_5$ is output with timing in which any one of the third control signal $THIC_1$, $THIC_2$ and $THIC_3$ changes to go high and is fed to the first block. Moreover, at a time of the test, the test clock TCK is first fed and, after the block forcedly-activating signal $BFAT_5$ has risen to go high at a time of a fifth rise of the test clock TCK, an output signal from the SR latch 330 changes to go low at a time of a fifth fall of the test clock TCK. Therefore, the high-level sub-word activating signal $SWAT_5$ is output, irrespective of supply of the block selecting signals $BS_{511}$, $BS_{522}$ and $BS_{544}$ and the third control signal $THIC_1$ to $THIC_3$ with timing in which the test clock TCK falls fifth.

In a state where all the block selecting signals $BS_{511}$, $BS_{522}$ and $BS_{544}$ are fed as high-level signals from the block selecting signal generating circuit $18_5$ and, at the same time, two kinds of the fourth control signals $FORC_{11}$ to $FORC_{13}$ and $FORC_{21}$ to $FORC_{23}$ used to control timing with which two kinds of the SA activating signals $SAAT_1$ and $SAAT_2$ are output to the first to third banks are fed as low level signals, a high-level signal is output from all the OR gates 316 to 321. Therefore, if the high-level capacity mode signal $CM_8$ is fed, in this state, the low-level SA activating signal $SAAT_{15}$ and the low-level SA activating signal $SAAT_{25}$ are output from the AND gates 331 and 332 respectively.

Next, even when the low-level block selecting signals $BS_{511}$ is fed, if the fourth control signals $FORC_{11}$ and $FORC_{21}$ remain at a low level, no changes occur. Then, when the fourth control signal $FORC_{11}$ changes to go high, since the block selecting signals $BS_{511}$ has been changed to be at a low level, a low-level signal is output from the OR gate 316. Since this causes the NAND gate 325 to output a high-level signal, the high-level SA activating signal $SAAT_{15}$ is output from the NAND gate 331, which is then fed to the fifth block. Then, when the fourth control signal $FORC_{21}$ changes to go high, since the block selecting signal $BS_{511}$ has changed to go low, a low-level signal is output from the OR gate 319. Since this causes the NAND gate 326 to output a high-level signal, the high-level SA activating signal $SAAT_{25}$ is output from the NAND gate 332, which is then fed to the fifth block. Similarly, even when the low-level block selecting signal $BS_{522}$ is fed, if the fourth control signals $FORC_{12}$ and $FORC_{22}$ remain at a low level, no changes occur. Then, when the fourth control signal $FORC_{12}$ changes to go high, since the block selecting signals $BS_{522}$ has been changed to be at a low level, a low-level signal is output from the OR gate 317. Since this causes the NAND gate 325 to output a high-level signal, the high-level SA activating signal $SAAT_{15}$ is output from the NAND gate 331, which is then fed to the fifth block. Then, when the fourth control signal $FORC_{22}$ changes to go high, since the block selecting signals $BS_{522}$ has been changed to be at a low level, a low-level signal is output from the OR gate 320. Since this causes the NAND gate 326 to output a high-level signal, the high-level SA activating signal $SAAT_{25}$ is output from the NAND gate 332, which is then fed to the fifth block. Similarly, even when the low-level block selecting signals $BS_{544}$ is fed, if the fourth control signals $FORC_{13}$ and $FORC_{23}$ remain at a low level, no changes occur. Then, when the fourth control signal $FORC_{13}$ changes to go high, since the block selecting signals $BS_{544}$ has been changed to be at a low level, a low-level signal is output from the OR gate 318. Since this causes the NAND gate 325 to output a high-level signal, the high-level SA activating signal $SAAT_{15}$ is output from the NAND gate 331, which is then fed to the fifth block. Then, when the fourth control signal $FORC_{23}$ changes to go high, since the block selecting signal $BS_{544}$ has changed to go low, a low-level signal is output from the OR gate 321. Since this causes the NAND gate 326 to output a high-level signal, the high-level SA activating signal $SAAT_{25}$ is output from the NAND gate 332, which is then fed to the fifth block. That is, after the activating signal generating circuit $20_5$ has been selected from 8 pieces of the activating signal generating circuits $20_1$ to $20_8$ by any one of the low-level block selecting signals $BS_{511}$, $BS_{522}$ and $BS_{544}$, high-level SA activating signals $SAAT_{15}$ and $SAAT_{25}$ are sequentially output with timing in which the fourth control signals $FORC_{11}$, $FORC_{22}$, $FORC_{12}$ and $FORC_{22}$ sequentially change to go high.

Figure 26:
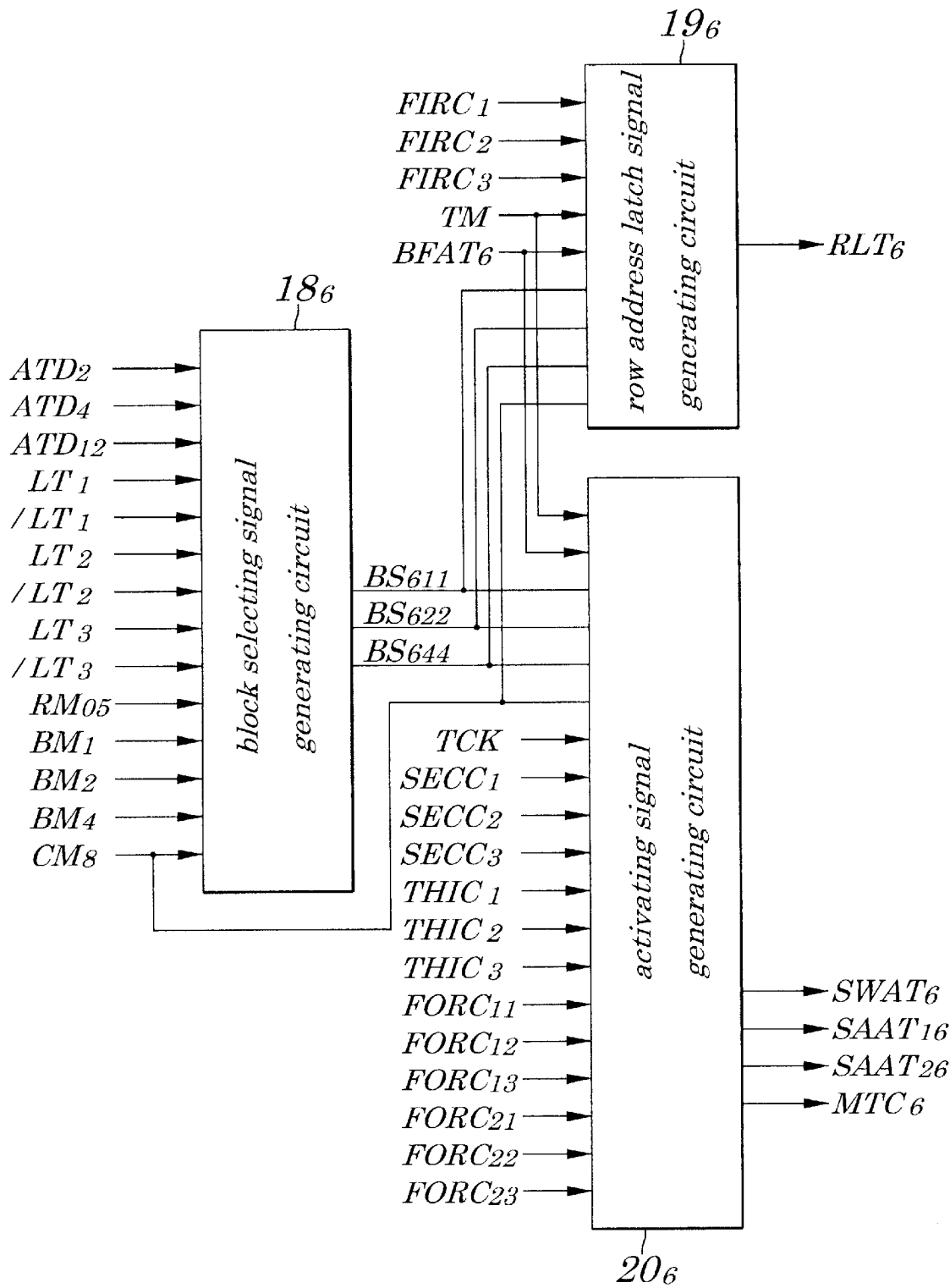
FIG. 26 is a schematic block diagram showing configurations of another block activating section employed in the memory according to the embodiment of the present invention.

The block activating section $16_6$, as shown in FIG. 26, includes a block selecting signal generating circuit $18_6$, a row address latch signal generating circuit $19_6$ and an activating signal generating circuit $20_6$.

The block selecting signal generating circuit $18_6$, based on the block activating designation signals $ATD_2$, $ATD_4$ and $ATD_{12}$ fed from the refresh decoder 15, latch signals $LT_1$ to $LT_3$, reversed latch signals $/LT_1$ to $/LT_3$, refresh mode signal $RM_{05}$, bank mode signals $BM_1$, $BM_2$ and $BM_4$ and capacity mode signal $CM_8$ all of which are fed from the control circuit 3, generates any one of a block selecting signal $BS_{611}$ used to activate the sixth block, if the memory block 1 is made up of one bank, by using all blocks belonging to the bank being operated, a block selecting signal $BS_{622}$ used to activate the sixth block, if the memory block 1 is made up of two banks, by using all blocks belonging to the second bank and a block selecting signal $BS_{644}$ used to activate the fifth block, if the memory block 1 is made up of four banks, by using all blocks belonging to the third bank.

Figure 27:
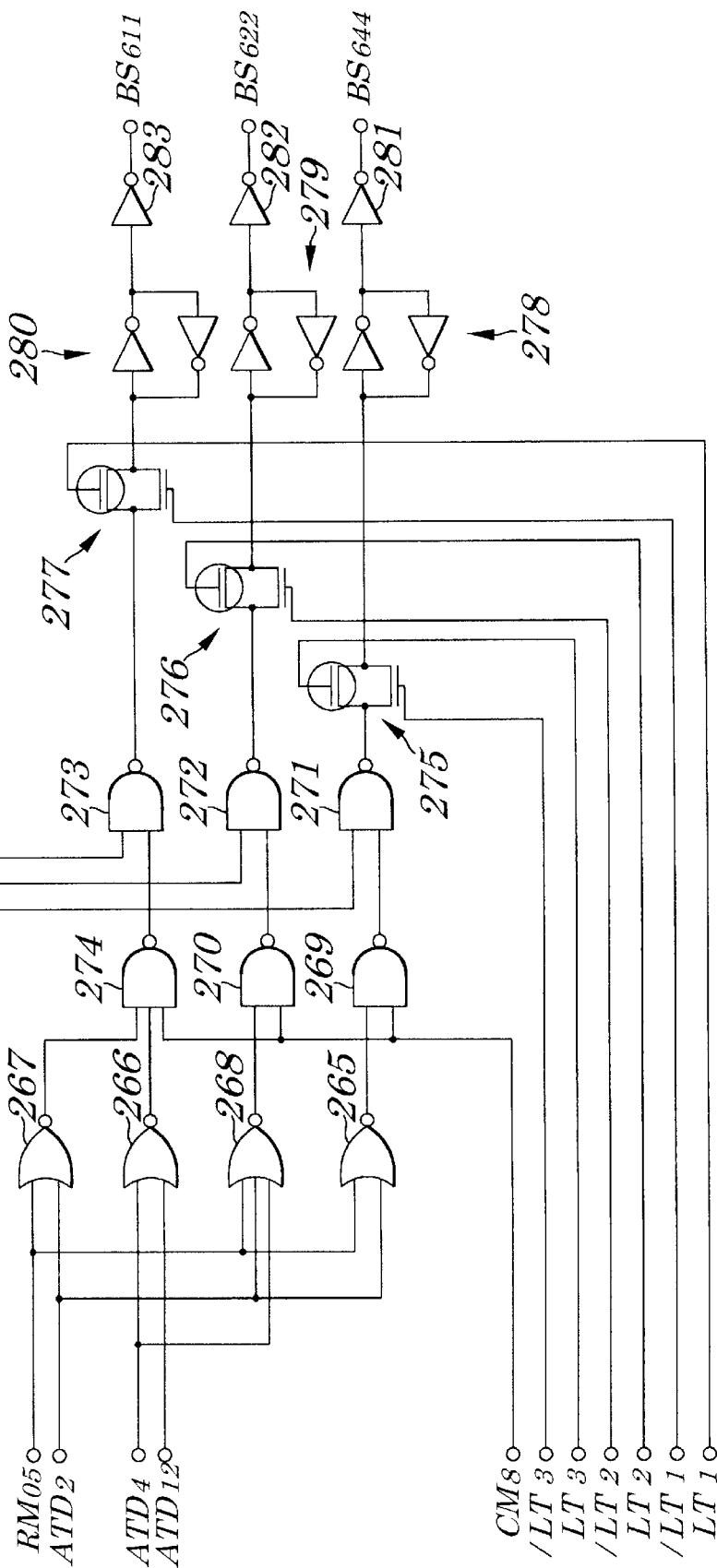
FIG. 27 is a schematic block diagram showing one example of configurations of another block selecting signal generating circuit employed in the memory according to the embodiment of the present invention.

FIG. 27 is a schematic block diagram showing one example of configurations of the block selecting signal generating $18_6$ employed in the memory according to the embodiment. In FIG. 27, same reference numbers are assigned to corresponding parts in FIG. 23 and their descriptions are omitted accordingly. In the block selecting signal generating circuit $18_6$ shown in FIG. 27, instead of the block activating designation signals $ATD_1$, $ATD_3$ and $ATD_7$ shown in FIG. 23, the block activating designation signals $ATD_2$, $ATD_4$ and $ATD_{12}$ are newly input and, instead of the block selecting signals $BS_{511}$, $BS_{522}$ and $BS_{544}$, block selecting signals $BS_{611}$, $BS_{622}$ and $BS_{644}$ are newly output. That is, configurations of the block selecting signal generating circuit $18_6$ are the same as those of the block selecting signal generating circuit $18_5$ except for signals input and output thereto or therefrom. Next, the row address latch signal generating circuit $19_6$ shown in FIG. 26, based on the first control signals $FIRC_1$ to $FIRC_3$, test mode signal TM, block forcedly-activating signal $BFAT_6$ and capacity mode signal $CM_8$ all of which are output from the control circuit 3 and block selecting signals $BS_{611}$, $BS_{622}$, $BS_{644}$ supplied from the block selecting signal generating circuit $18_6$, generates the row address latch signal $RLT_6$ used to temporarily hold row addresses decoded by the row decoder 10 (see FIG. 3) and feeds them to the sixth block.

Figure 28:
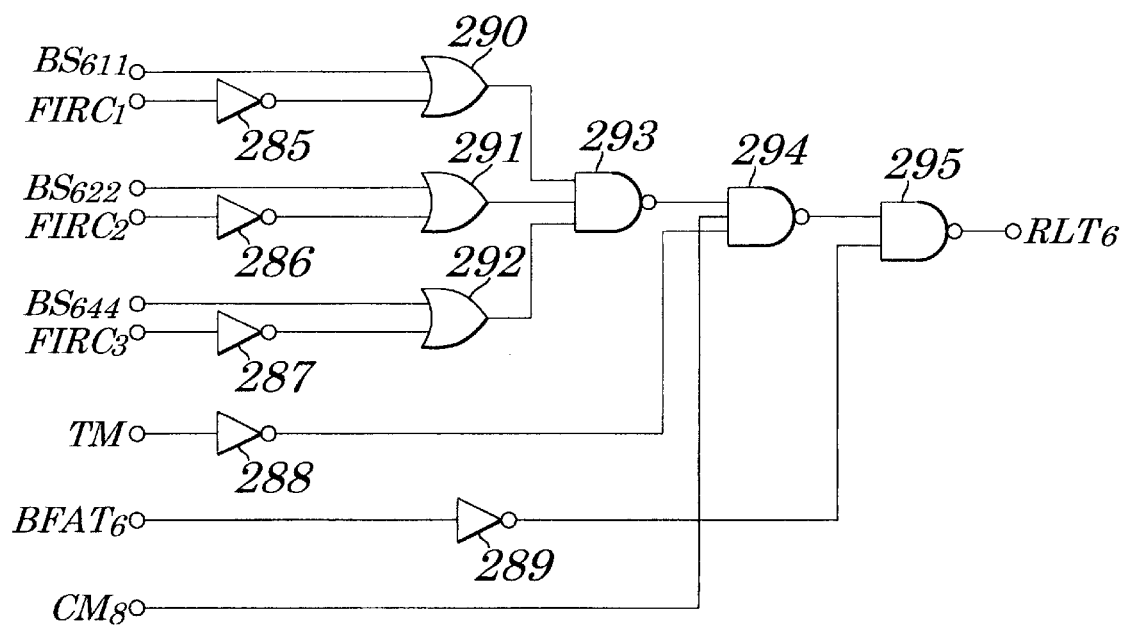
FIG. 28 is a schematic block diagram showing one example of configurations of another row address latch signal generating circuit employed in the memory according to the embodiment of the present invention.

FIG. 28 is a schematic block diagram showing one example of configurations of the row address latch signal generating circuit $19_6$. In FIG. 28, same reference numbers are assigned to corresponding parts in FIG. 24 and their descriptions are omitted accordingly. In the row address latch signal generating circuit $19_6$ shown in FIG. 28, instead of the block selecting signals $BS_{511}$, $BS_{522}$ and $BS_{544}$ and the block forcedly-activating signal $BFAT_5$, the block selecting signals $BS_{611}$, $BS_{622}$ and $BS_{644}$ are newly input from the block selecting signal generating circuit $18_6$ and the block forcedly-activating signal $BFAT_6$ is newly input from the control circuit 3 and, instead of the row address latch signal $RLT_5$, the row address latch signal $RLT_6$ is newly output. That is, configurations of the row address latch signal generating circuit $19_6$ are the same as those of the row address latch signal generating circuit $19_5$ except for signals input and output thereto or therefrom. That is, after the row address latch signal generating circuit $19_6$ has been selected out of 8 pieces of the row address latch signal generating circuits $19_1$ to $19_8$ by any one of the low-level block selecting signals $BS_{611}$, $BS_{622}$ and $BS_{644}$, the high-level row address latch signal $RLT_6$ is output with timing in which the first control signals $FIRC_1$ to $FIRC_3$ change to go high, and is then fed to the sixth block. Moreover, at a time of the test, since the test mode signal TM changes to go high, irrespective of supply of the block selecting signals $BS_{611}$, $BS_{622}$ and $BS_{644}$ and the first control signal $FIRC_1$ to $FIRC_3$, with timing in which the block forcedly-activating signal $BFAT_6$ changes to go high, the high-level row address latch signal $RLT_8$ is output.

The activating signal generating circuit $20_6$ shown in FIG. 26, based on the second control signals $SECC_1$ to $SECC_3$, third control signals $THIC_1$ to $THIC_3$, fourth control signals $FORC_{11}$ to $FORC_{13}$ and $FORC_{21}$ to $FORC_{23}$, test mode signal TM, test clock TCK, block forcedly-activating signal $BFAT_6$ and capacity mode signal $CM_8$ all of which are fed from the control circuit 3 and the block selecting signals $BS_{611}$, $BS_{622}$ and $BS_{644}$ fed from the block selecting signal generating circuit $18_6$, generates the sub-word activating signal $SWAT_6$ used to activate sub-word lines of the MCA making up the sixth block contained in the memory block 1, two kinds of SA activating signals $SAAT_{16}$ and $SAAT_{26}$ used to activate two SAs making up the, sixth block contained in the memory block 1 and the main-word timing control signal $MTC_6$ used to control timing with which the row decoder 10 outputs the main-word activating signal MWAT, and feeds them to the sixth block.

Figure 29:
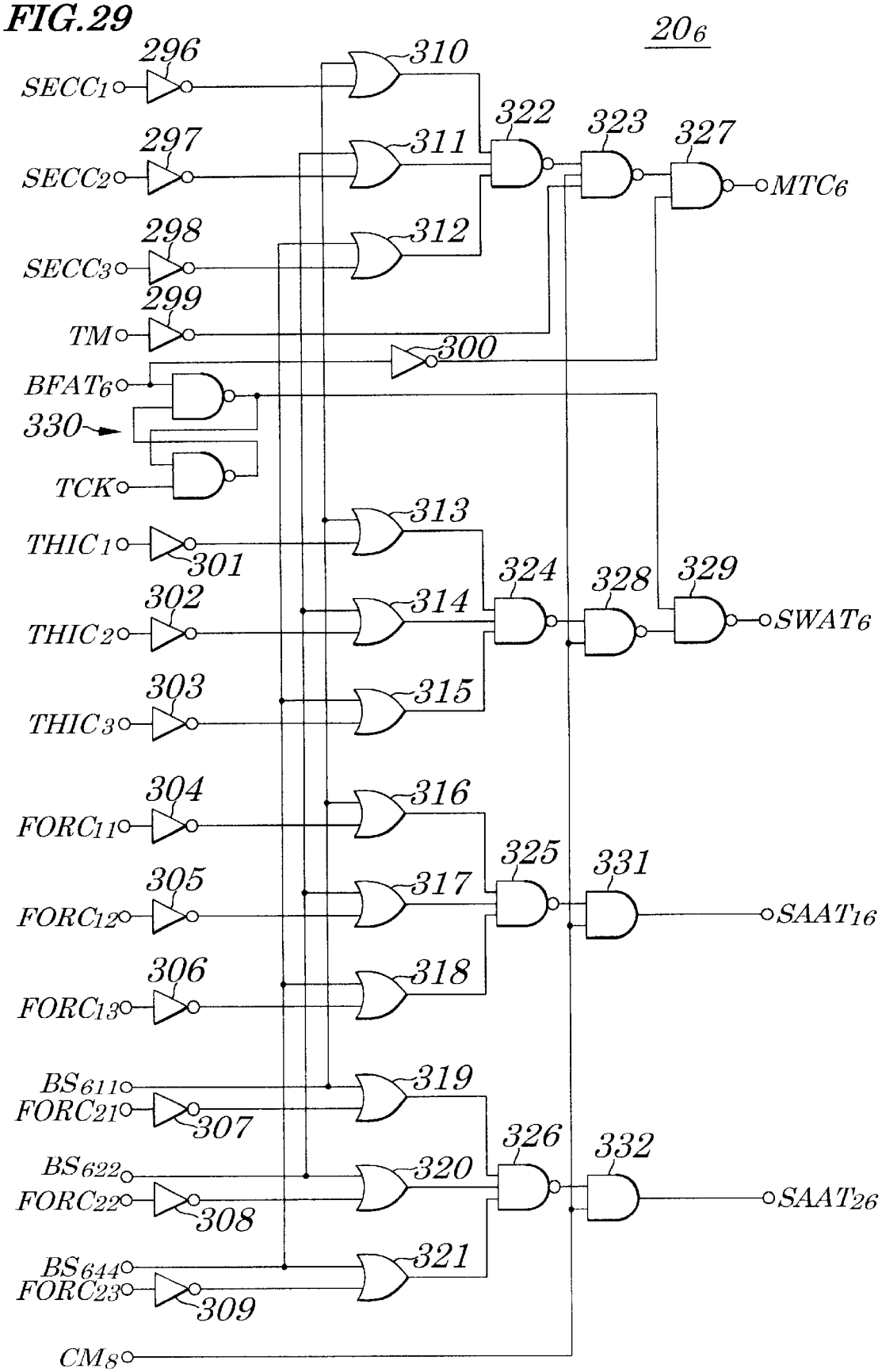
FIG. 29 is a schematic block diagram showing one example of configurations of another activating signal generating circuit employed in the memory according to the embodiment of the present invention.

FIG. 29 is a schematic block diagram showing one example of configurations of the activating signal generating circuit $20_6$. In FIG. 29, same reference numbers are assigned to corresponding parts in FIG. 25 and their descriptions are omitted accordingly. In the activating signal generating circuit $20_6$ shown in FIG. 29, instead of the block selecting signal $BS_{511}$, $BS_{522}$ and $BS_{544}$ and the block activating designation signal $BFAT_5$, the block selecting signal $BS_{611}$, $BS_{622}$ and $BS_{644}$ are newly input from the block selecting signal generating circuit $18_6$ and the block activating designation signal $BFAT_6$ from the control circuit 3 and instead of the sub-word activating signal $SWAT_5$, SA activating signals $SAAT_{15}$ and $SAAT_{25}$ and main-word timing control signal $MTC_5$, sub-word activating signal $SWAT_6$, SA activating signals $SAAT_{16}$ and $SAAT_{26}$ and the main-word timing control signal $MTC_6$ are newly output. That is, configurations of the activating signal generating circuit $20_6$ are the same as those of the activating signal generating circuit $20_5$ except for signals input and output thereto or therefrom.

Therefore, after the activating signal generating circuit $20_5$ has been selected out of 8 pieces of the activating signal generating circuits $20_1$ to $20_8$ by any one of the low-level block selecting signals $BS_{611}$, $BS_{622}$ and $BS_{644}$, the high-level main-word timing control signal $MTC_6$ is output with timing in which any one of the second control signals $SECC_1$, $SECC_2$ and $SECC_3$ changes to go high, and is then fed to the sixth block. Moreover, at a time of the test, since the test mode signal TM changes to go high, irrespective of supply of the block selecting signals $BS_{611}$, $BS_{622}$ and $BS_{644}$ and the second control signal $SECC_1$ to $SECC_3$, with timing in which the block forcedly-activating signal $BFAT_6$ changes to go high, the high-level main-word timing control signal $MTC_6$ is output.

Moreover, after the activating signal generating circuit $20_6$ has been selected out of 8 pieces of the activating signal generating circuits $20_1$ to $20_8$ by any one of the low-level block selecting signals $BS_{611}$, $BS_{622}$ and $BS_{644}$, the high-level main-word timing control signal $MTC_6$ is output with timing in which any one of the third control signals $THIC_1$, $THICS_2$ and $THIC_3$ changes to go high, and is then fed to the sixth block. Also, at a time of the test, the test clock TCK is first fed and, after the block forcedly-activating signal $BFAT_6$ has risen to go high at a time of a sixth rise of the test clock TCK, an output signal from the SR latch 330 changes to go low at a time of a sixth fall of the test clock TCK. Therefore, a high-level sub-word activating signal $SWAT_6$ is output, irrespective of supply of the block selecting signals $BS_{611}$, $BS_{622}$ and $BS_{644}$ and the third control signal $THIC_1$ to $THIC_3$ with timing in which the test clock TCK falls fifth. Furthermore, after the activating signal generating circuit $20_6$ has been selected from 8 pieces of the activating signal generating circuits $20_1$ to $20_8$ by any one of the low-level block selecting signals $BS_{611}$, $BS_{622}$ and $BS_{644}$, the high-level SA activating signals $SAAT_{16}$ and $SAAT_{26}$ are sequentially output with timing in which the fourth control signals $FORC_{11}$, $FORC_{21}$, $FORC_{12}$ and $FORC_{22}$ sequentially change to go high.

Figure 30:
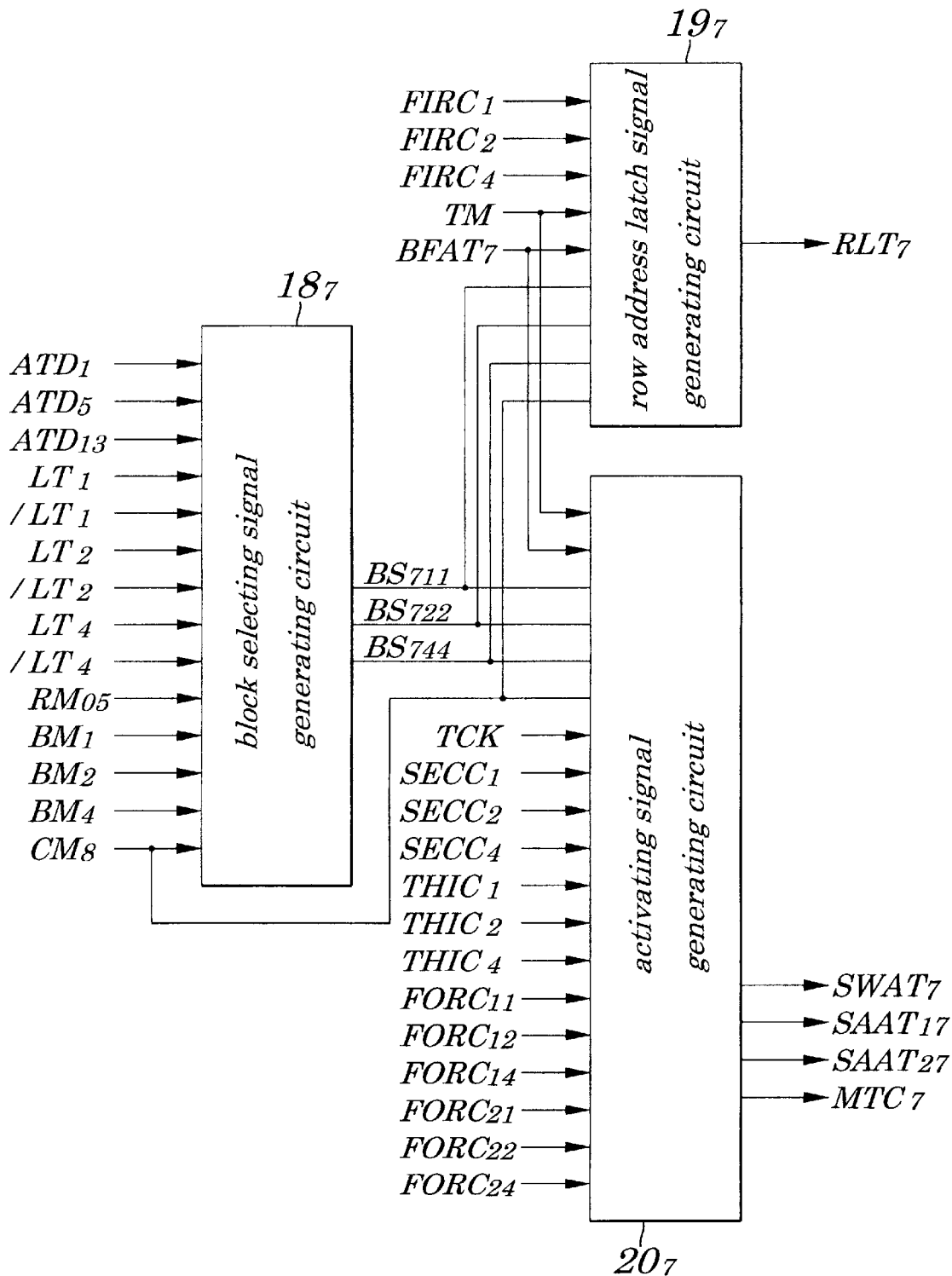
FIG. 30 is a schematic block diagram showing configurations of another block activating section employed in the memory according to the embodiment of the present invention.

The block activating section $16_7$, as shown in FIG. 30, includes a block selecting signal generating circuit $18_7$, a row address latch signal generating circuit $19_7$ and an activating signal generating circuit $20_7$.

The block selecting signal generating circuit $18_7$, based on the block activating designation signals $ATD_1$, $ATD_5$ and $ATD_{13}$ fed from the refresh decoder 15, latch signals $LT_1$, $LT_2$ and $LT_4$, reversed latch signals $/LT_1$, $/LT_2$ and $/LT_4$, refresh mode signal $RM_{05}$, bank mode signals $BM_1$, $BM_2$ and $BM_4$ and capacity mode signal $CM_8$ all of which are fed from the control circuit 3, generates any one of a block selecting signal $BS_{711}$ used to activate the seventh block, if the memory block 1 is made up of one bank, by using all blocks belonging to the bank being operated, a block selecting signal $BS_{722}$ used to activate the seventh block, if the memory block 1 is made up of two banks, by using all blocks belonging to the second bank and a block selecting signal $BS_{744}$ used to activate the seventh block, if the memory block 1 is made up of four banks, by using all blocks belonging to the fourth bank.

Figure 31:
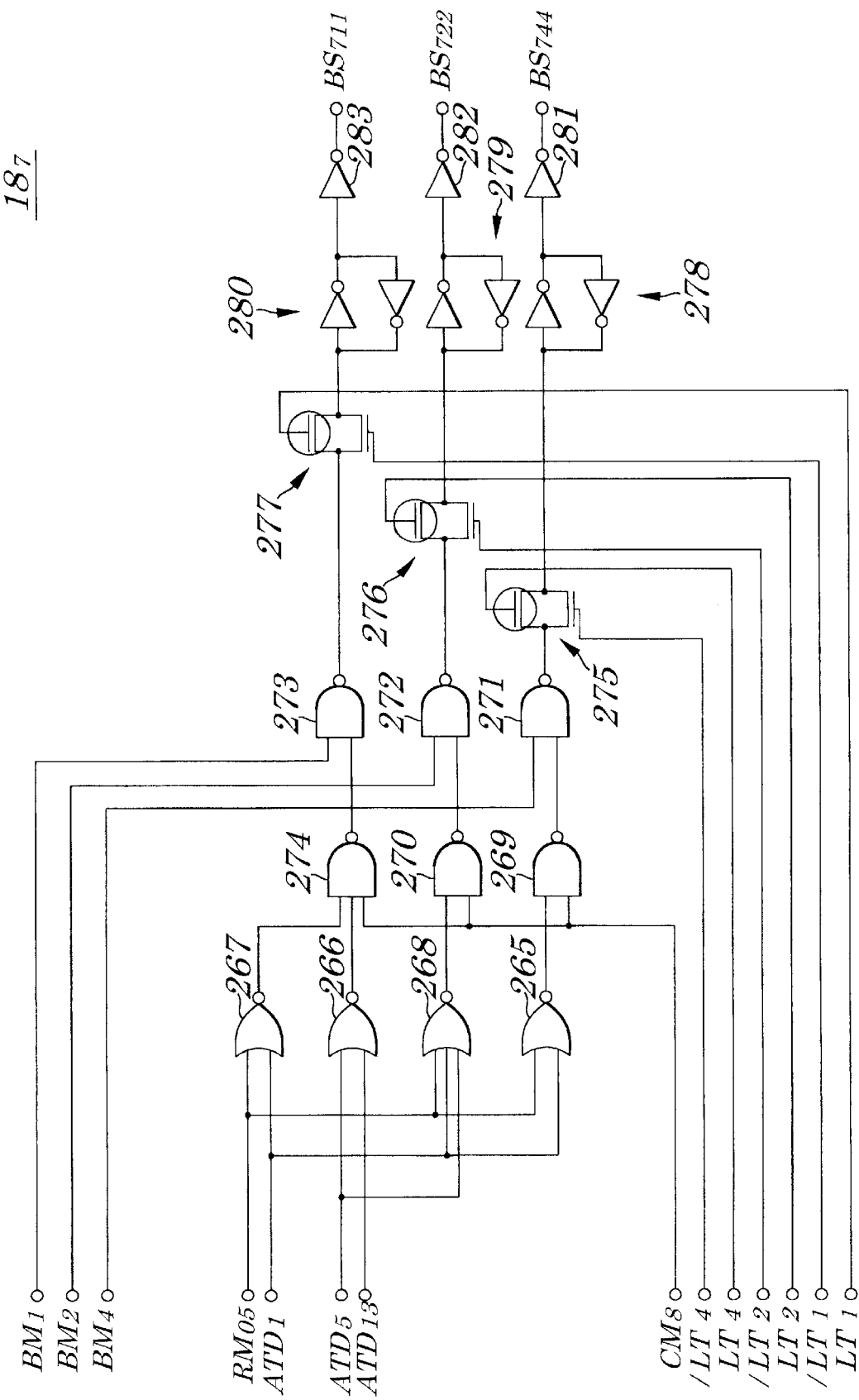
FIG. 31 is a schematic block diagram showing one example of configurations of another block selecting signal generating circuit employed in the memory according to the embodiment of the present invention.

FIG. 31 is a schematic block diagram showing one example of configurations of the block selecting signal generating circuit $18_7$. In FIG. 31, same reference numbers are assigned to corresponding parts in FIG. 23 and their descriptions are omitted accordingly. In the block selecting signal generating circuit $18_7$ shown in FIG. 31, instead of the block activating designation signals $ATD_3$ and $ATD_7$, latch signal $LT_3$ and reversed latch signal $/LT_3$ shown in FIG. 23, the block activating designation signals $ATD_5$ and $ATD_{13}$ are newly input and, instead of the block selecting signals $BS_{511}$, $BS_{522}$ and $BS_{544}$, block selecting signals $BS_{711}$, $BS_{722}$ and $BS_{744}$ are newly output. That is, configurations of the block selecting signal generating circuit $18_7$ are the same as those of the block selecting signal generating circuit $18_5$ except for signals input and output thereto or therefrom.

Next, the row address latch signal generating circuit $19_7$ shown in FIG. 30, based on the first control signals $FIRC_1$, $FIRT_2$ and $FIRC_3$, test mode signal TM, block forcedly-activating signal $BFAT_7$ and capacity mode signal $CM_8$ all of which are output from the control circuit 3 and block selecting signals $BS_{711}$, $BS_{722}$, $BS_{744}$ supplied from the block selecting signal generating circuit $18_7$, generates the row address latch signal $RLT_7$ used to temporarily hold row addresses decoded by the row decoder 10 (see FIG. 3) and feeds them to the seventh block.

Figure 32:
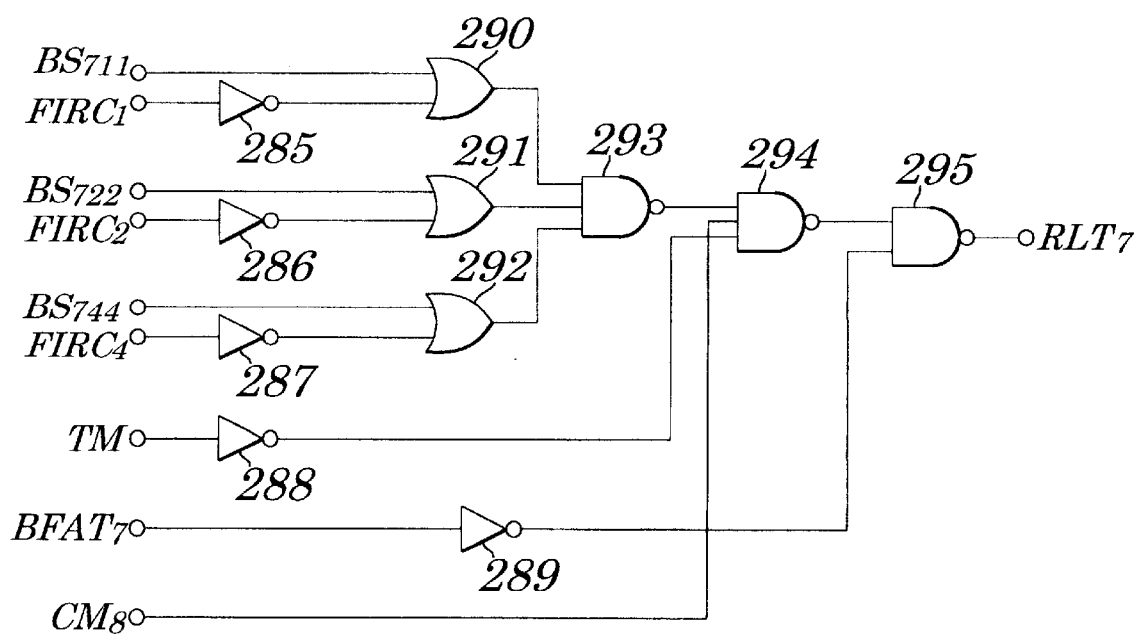
FIG. 32 is a schematic block diagram showing one example of configurations of another row address latch signal generating circuit employed in the memory according to the embodiment of the present invention.

FIG. 32 is a schematic block diagram showing one example of configurations of the row address latch signal generating circuit $19_7$. In FIG. 32, same reference numbers are assigned to corresponding parts in FIG. 24 and their descriptions are omitted accordingly. In the row address latch signal generating circuit $19_7$ shown in FIG. 32, instead of the block selecting signals $BS_{511}$, $BS_{522}$ and $BS_{544}$ and the block forcedly-activating signal $BFAT_5$ shown in FIG. 24, the block selecting signals $BS_{711}$, $BS_{722}$ and $BS_{744}$ are newly input from the block selecting signal generating circuit $18_7$ and, at the same time, the block forcedly-activating signal $BFAT_7$ is newly input from the control circuit 3 and, instead of the row address latch signal $RLT_5$, the row address latch signal $RLT_7$ is newly output. That is, configurations of the row address latch signal generating circuit $19_7$ are the same as those of the row address latch signal generating circuit $19_5$ except for signals input and output thereto or therefrom. That is, after the row address latch signal generating circuit $19_7$ has been selected out of 8 pieces of the row address latch signal generating circuits $19_1$ to $19_8$ by any one of the low-level block selecting signals $BS_{711}$, $BS_{722}$ and $BS_{744}$, the high-level row address latch signal $RLT_7$ is output with timing in which the first control signals $FIRC_1$, $FIRC_2$ and $FIRC_4$ change to go high, and is then fed to the seventh block. Moreover, at a time of the test, since the test mode signal TM changes to go high, irrespective of supply of the block selecting signals $BS_{711}$, $BS_{722}$ and $BS_{744}$ and the first control signal $FIRC_1$, $FIRC_2$ and $FIRC_4$, with timing in which the block forcedly-activating signal $BFAT_7$ changes to go high, the high-level row address latch signal $RLT_7$ is output.

The activating signal generating circuit $20_7$ shown in FIG. 30, based on the second control signals $SECC_1$, $SECC_2$ and $SECC_4$, third control signals $THIC_1$, $THIC_2$ and $THIC_4$, fourth control signals $FORC_{11}$, $FORC_{12}$, $FORC_{14}$, $FORC_{21}$, $FORC_{22}$, $FORC_{24}$, test mode signal TM, test clock TCK, block forcedly-activating signal $BFAT_7$ and capacity mode signal $CM_8$ all of which are fed from the control circuit 3 and the block selecting signals $BS_{711}$, $BS_{722}$ and $BS_{744}$ fed from the block selecting signal generating circuit $18_7$, generates the sub-word activating signal $SWAT_7$ used to activate sub-word lines of the MCA making up the seventh block contained in the memory block 1, two kinds of SA activating signals $SAAT_{17}$ and $SAAT_{27}$ used to activate two SAs making up the seventh block contained in the memory block 1 and the main-word timing control signal $MTC_7$ used to control timing with which the row decoder 10 outputs the main-word activating signal MWAT, and feeds them to the seventh block.

Figure 33:
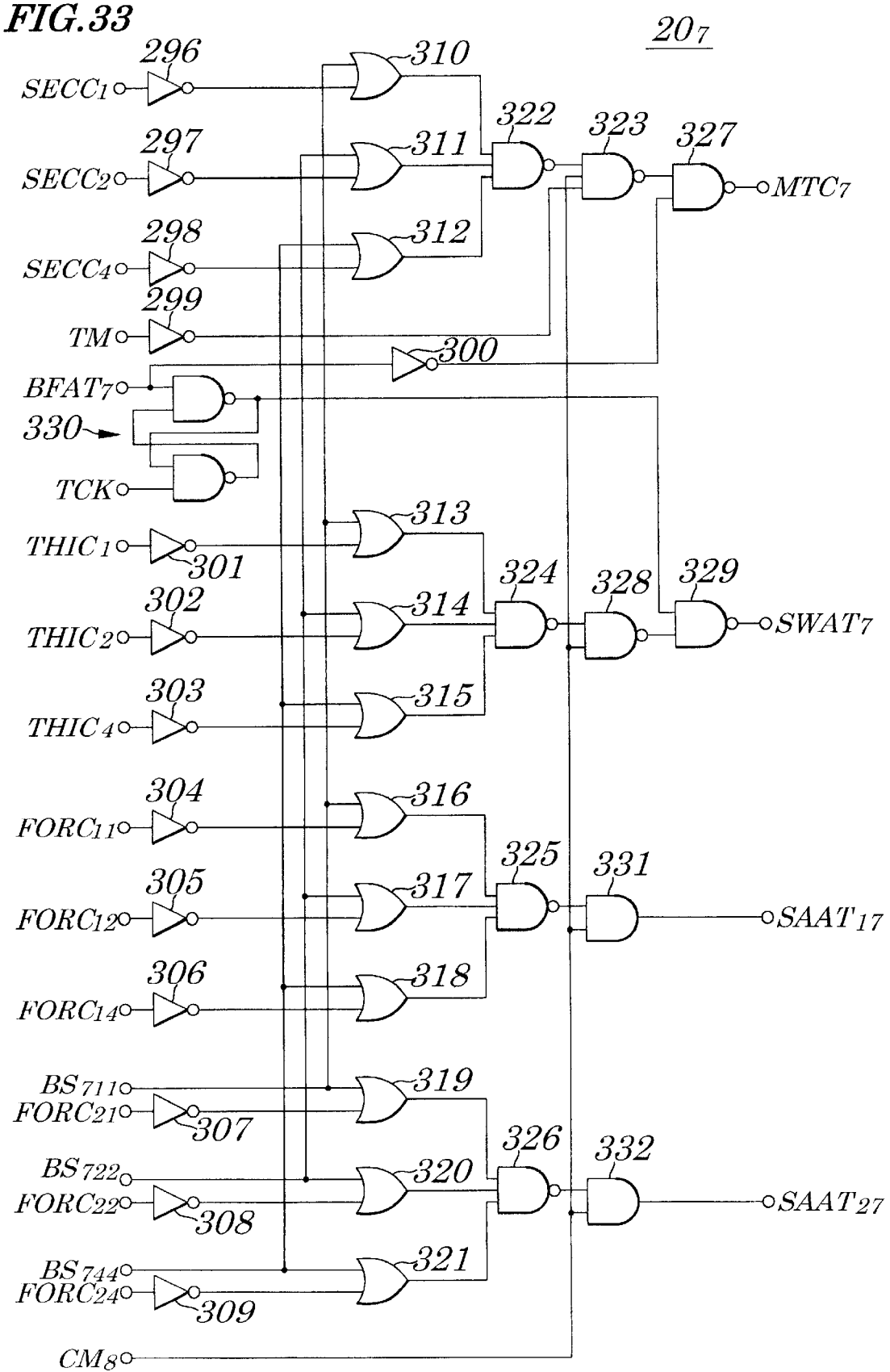
FIG. 33 is a schematic block diagram showing one example of configurations of another activating signal generating circuit employed in the memory according to the embodiment of the present invention.

FIG. 33 is a schematic block diagram showing one example of configurations of the activating signal generating circuit $20_7$. In FIG. 33, same reference numbers are assigned to corresponding parts in FIG. 25 and their descriptions are omitted accordingly. In the activating signal generating circuit $20_7$ shown in FIG. 33, instead of the block selecting signal $BS_{511}$, $BS_{522}$ and $BS_{544}$, second control signal $SECC_3$, third control signal $THIC_3$, fourth control signals $FORC_{13}$ and $FORC_{23}$ and block forcedly-activating signal $BFAT_5$ shown in FIG. 25, the block selecting signal $BS_{711}$, $BS_{722}$ and $BS_{744}$ are newly input from the block selecting signal generating circuit $18_7$ and, at the same time, the second control signal $SECC_4$, third control signal $THIC_4$, fourth control signals $FORC_{14}$ and $FORC_{24}$ and block forcedly-activating signal $BFAT_7$ are newly input from the control circuit 3 and, instead of the sub-word activating signal $SWAT_5$, SA activating signals $SAAT_{15}$ and $SATT_{25}$ and main-word timing control $MTC_5$, sub-word activating signal $SWAT_7$, SA activating signals $SAAT_{17}$ and $SATT_{27}$ and main-word timing control $MTC_7$ are newly output. That is, configurations of the activating signal generating circuit $20_7$ are the same as those of the activating signal generating circuit $20_5$ except for signals input and output thereto or therefrom.

Therefore, after the activating signal generating circuit $20_7$ has been selected out of 8 pieces of the activating signal generating circuits $20_1$ to $20_8$ by any one of the low-level block selecting signals $BS_{711}$, $BS_{722}$ and $BS_{744}$, the high-level main-word timing control signal $MTC_7$ is output with timing in which any one of the second control signals $SECC_1$, $SECC_2$ and $SECC_4$ changes to go high, and is then fed to the seventh block. Moreover, at a time of the test, since the test mode signal TM changes to go high, irrespective of supply of the block selecting signals $BS_{711}$, $BS_{722}$ and $BS_{744}$ and the second control signal $SECC_1$, $SECC_2$ and $SECC_4$, with timing in which the block forcedly-activating signal $BFAT_7$ changes to go high, the high-level main-word timing control signal $MTC_7$ is output.

Moreover, after the activating signal generating circuit $20_7$ has been selected out of 8 pieces of the activating signal generating circuits $20_1$ to $20_8$ by any one of the low-level block selecting signals $BS_{711}$, $BS_{722}$ and $BS_{744}$, the high-level sub-word timing control signal $SWAT_7$ is output with timing in which any one of the third control signals $THIC_1$, $THICS_2$ and $THIC_4$ changes to go high, and is then fed to the seventh block. Also, at a time of the test, the test clock TCK is first fed and, after the block forcedly-activating signal $BFAT_7$ has risen to go high at a time of a seventh rise of the test clock TCK, an output signal from the SR latch 330 changes to go low at a time of a seventh fall of the test clock TCK. Therefore, a high-level sub-word activating signal $SWAT_7$ is output, irrespective of supply of the block selecting signals $BS_{711}$, $BS_{722}$ and $BS_{744}$ and the third control signal $THIC_1$, $THIC_2$ and $THIC_4$ with timing in which the test clock TCK falls seventh.

Moreover, after the activating signal generating circuit $20_7$ has been selected out of 8 pieces of the activating signal generating circuits $20_1$ to $20_8$ by any one of the low-level block selecting signals $BS_{711}$, $BS_{722}$ and $BS_{744}$, the high-level SA activating signals $SAAT_{17}$ and $SAAT_{27}$ are sequentially output with timing in which the fourth control signals $FORC_{11}$, $FORC_{21}$, $FORC_{12}$ and $FORC_{22}$ sequentially change to go high.

Figure 34:
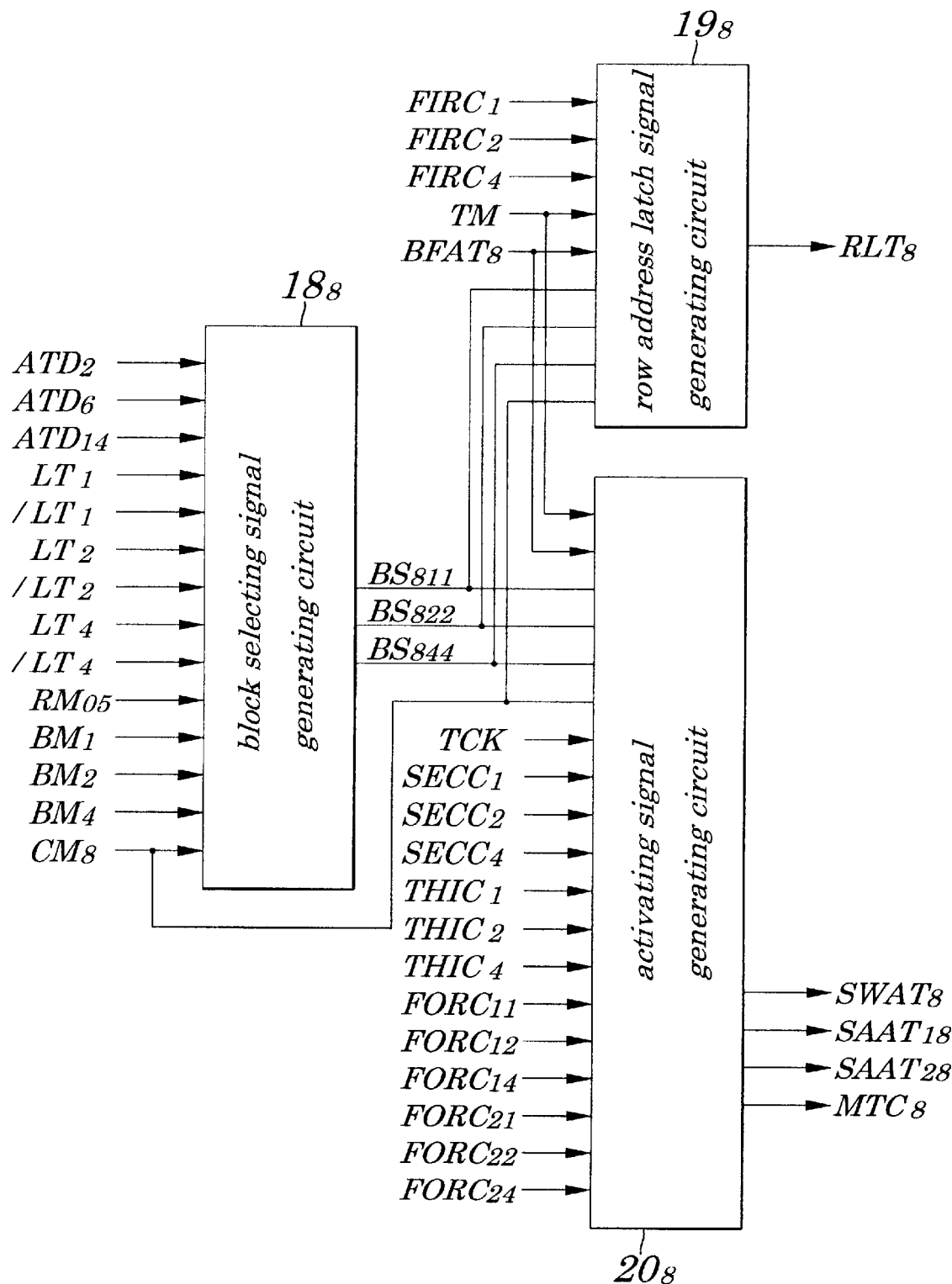
FIG. 34 is a schematic block diagram showing configurations of another block activating section employed in the memory according to the embodiment of the present invention.

The block activating section $16_8$, as shown in FIG. 34, includes a block selecting signal generating circuit $18_8$, a row address latch signal generating circuit $19_8$ and an activating signal generating circuit $20_8$. The block selecting signal generating circuit $18_8$, based on the block activating designation signals $ATD_2$, $ATD_6$ and $ATD_{14}$ fed from the refresh decoder 15, latch signals $LT_1$, $LT_2$ and $LT_4$, reversed latch signals $/LT_1$, $/LT_2$ and $/LT_4$, refresh mode signal $RM_{O5}$, bank mode signals $BM_1$, $BM_2$ and $BM_4$ and capacity mode signal $CM_8$ all of which are fed from the control circuit 3, generates any one of a block selecting signal $BS_{811}$ used to activate the eighth block, if the memory block 1 is made up of one bank, by using all blocks belonging to the bank being operated, a block selecting signal $BS_{822}$ used to activate the eighth block, if the memory block 1 is made up of two banks, by using all blocks belonging to the second bank and a block selecting signal $BS_{844}$ used to activate the eighth block, if the memory block 1 is made up of four banks, by using all blocks belonging to the fourth bank.

Figure 35:
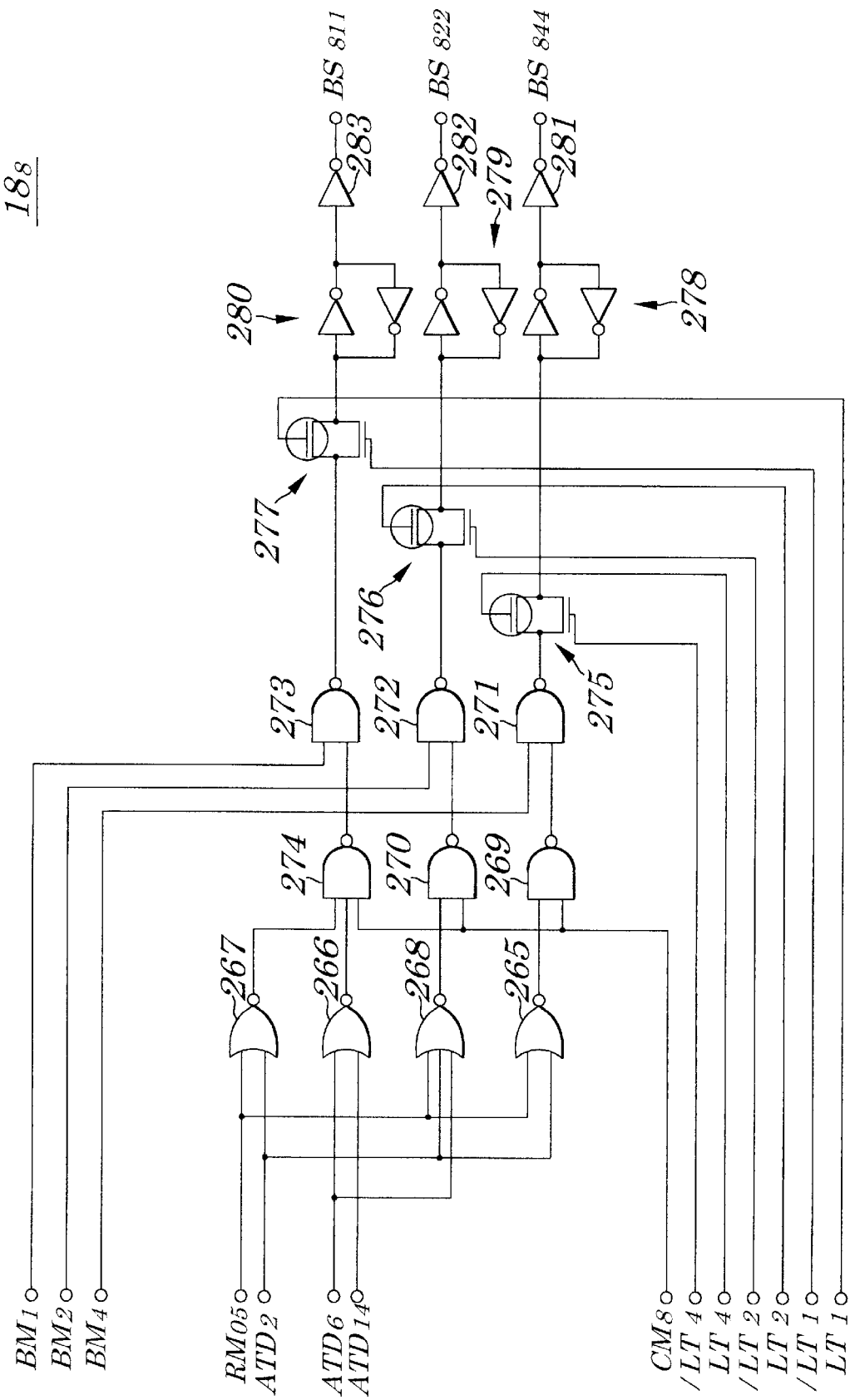
FIG. 35 is a schematic block diagram showing one example of configurations of another block selecting signal generating circuit employed in the memory according to the embodiment of the present invention.

FIG. 35 is a schematic block diagram showing one example of configurations of the block selecting signal generating circuit $18_8$. In FIG. 35, same reference numbers are assigned to corresponding parts in FIG. 23 and their descriptions are omitted accordingly. In the block selecting signal generating circuit $18_8$ shown in FIG. 35, instead of the block activating designation signals $ATD_1$, $ATD_3$ and $ATD_7$, latch signal $LT_3$ and reversed latch signal $/LT_3$ shown in FIG. 23, the block activating designation signals $ATD_2$, $ATD_6$ and $ADT_{14}$, latch signal $LT_4$ and reversed latch signal $/LT_4$ are newly input and, instead of the block selecting signals $BS_{511}$, $BS_{522}$ and $BS_{544}$, the block selecting signals $BS_{811}$, $BS_{822}$ and $BS_{844}$ are newly output. That is, configurations of the block selecting signal generating circuit $18_8$ are the same as those of the block selecting signal generating circuit $18_5$ except for signals input and output thereto or therefrom.

Next, the row address latch signal generating circuit $19_8$ shown in FIG. 34, based on the first control signals $FIRC_1$, $FIRT_2$ and $FIRC_4$, test mode signal TM, block forcedly-activating signal $BFAT_8$ and capacity mode signal $CM_8$ all of which are output from the control circuit 3 and block selecting signals $BS_{811}$, $BS_{822}$, $BS_{844}$ supplied from the block selecting signal generating circuit $18_8$, generates the row address latch signal $RLT_8$ used to temporarily hold row addresses decoded by the row decoder 10 (see FIG. 3) and feeds them to the eighth block.

Figure 36:
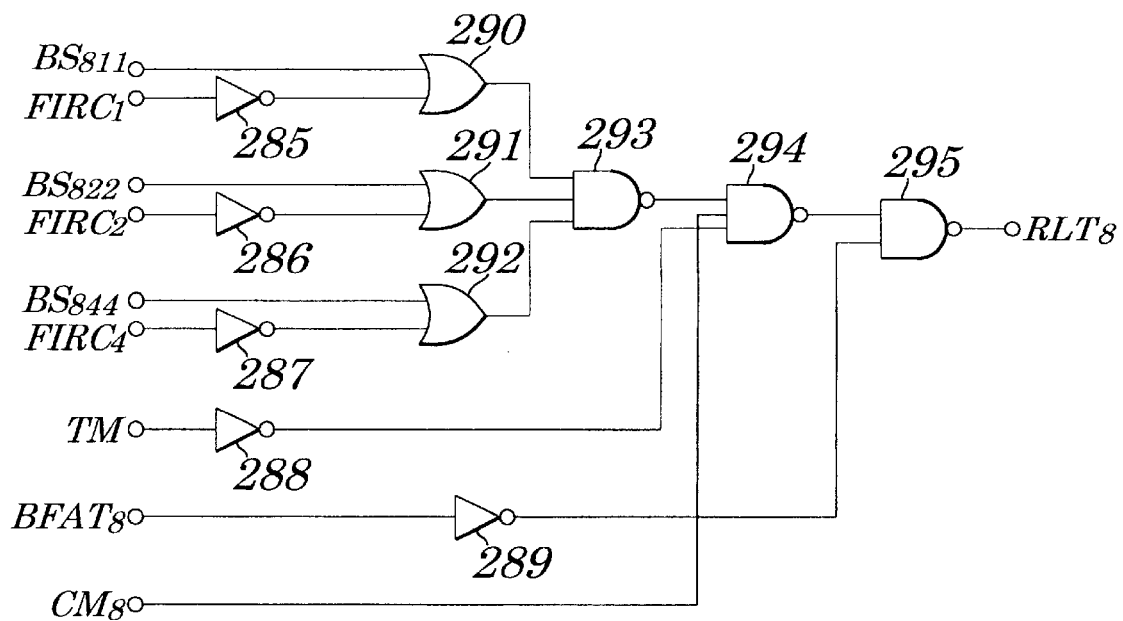
FIG. 36 is a schematic block diagram showing one example of configurations of another row address latch signal generating circuit employed in the memory according to the embodiment of the present invention.

FIG. 36 is a schematic block diagram showing one example of configurations of the row address latch signal generating circuit $19_8$. In FIG. 36, same reference numbers are assigned to corresponding parts in FIG. 24 and their descriptions are omitted accordingly. In the row address latch signal generating circuit $19_8$ shown in FIG. 36, instead of the block selecting signals $BS_{511}$, $BS_{522}$ and $BS_{544}$ and the block forcedly-activating signal $BFAT_5$ shown in FIG. 24, the block selecting signals $BS_{811}$, $BS_{822}$ and $BS_{844}$ are newly input from the block selecting signal generating circuit $18_8$ and, at the same time, the block forcedly-activating signal $BFAT_8$ is newly input from the control circuit 3 and, instead of the row address latch signal $RLT_5$, the row address latch signal $RLT_8$ is newly output. That is, configurations of the row address latch signal generating circuit $19_8$ are the same as those of the row address latch signal generating circuit $19_5$ except for signals input and output thereto or therefrom. That is, after the row address latch signal generating circuit $19_8$ has been selected out of 8 pieces of the row address latch signal generating circuits $19_1$ to $19_8$ by any one of the low-level block selecting signals $BS_{811}$, $BS_{822}$ and $BS_{844}$, the high-level row address latch signal $RLT_8$ is output with timing in which the first control signals $FIRC_1$, $FIRC_2$ and $FIRC_4$ change to go high, and is then fed to the eighth block. Moreover, at a time of the test, since the test mode signal TM changes to go high, irrespective of supply of the block selecting signals $BS_{811}$, $BS_{822}$ and $BS_{844}$ and the first control signal $FIRC_1$, $FIRC_2$ and $FIRC_4$, with timing in which the block forcedly-activating signal $BFAT_8$ changes to go high, the high-level row address latch signal $RLT_8$ is output.

The activating signal generating circuit $20_8$ shown in FIG. 34, based on the second control signals $SECC_1$, $SECC_2$ and $SECC_4$, third control signals $THIC_1$, $THIC_2$ and $THIC_4$, fourth control signals $FORC_{11}$, $FORC_{12}$, $FORC_{14}$, $FORC_{21}$, $FORC_{22}$, $FORC_{24}$, test mode signal TM, test clock TCK, block forcedly-activating signal $BFAT_8$ and capacity mode signal $CM_8$ all of which are fed from the control circuit 3 and block selecting signals $BS_{811}$, $BS_{822}$ and $BS_{844}$ fed from the block selecting signal generating circuit $18_8$, generates the sub-word activating signal $SWAT_8$ used to activate sub-word lines of the MCA making up the eighth block contained in the memory block 1, two kinds of SA activating signals $SAAT_{18}$ and $SAAT_{28}$ used to activate two SAs making up the eighth block contained in the memory block 1 and the main-word timing control signal $MTC_8$ used to control timing with which the row decoder 10 outputs the main-word activating signal MWAT, and feeds them to the eighth block.

Figure 37:
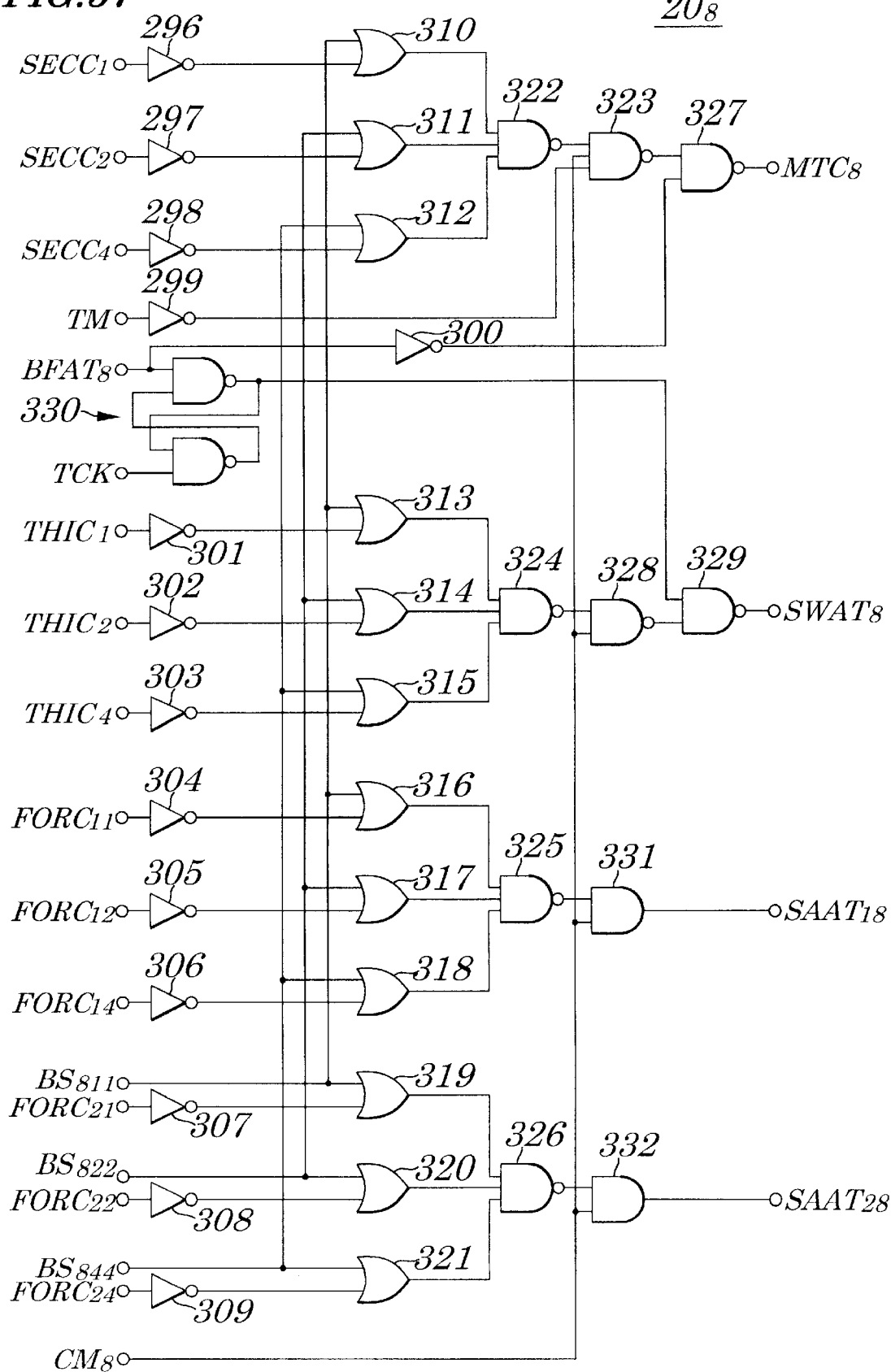
FIG. 37 is a schematic block diagram showing one example of configurations of another activating signal generating circuit employed in the memory according to the embodiment of the present invention.

FIG. 37 is a schematic block diagram showing one example of configurations of the activating signal generating circuit $20_8$. In FIG. 37, same reference numbers are assigned to corresponding parts in FIG. 25 and their descriptions are omitted accordingly. In the activating signal generating circuit $20_8$ shown in FIG. 37, instead of the block selecting signal $BS_{511}$, $BS_{522}$ and $BS_{544}$, second control signal $SECC_3$, third control signal $THIC_3$, fourth control signals $FORC_{13}$ and $FORC_{23}$ and block forcedly-activating signal $BFAT_5$ shown in FIG. 25, the block selecting signal $BS_{811}$, $BS_{822}$ and $BS_{844}$ are newly input from the block selecting signal generating circuit $18_8$ and, at the same time, the second control signal $SECC_4$, third control signal $THIC_4$, fourth control signals $FORC_{14}$ and $FORC_{24}$ and block forcedly-activating signal $BFAT_7$ are newly input from the control circuit 3 and, instead of the sub-word activating signal $SWAT_5$, SA activating signals $SAAT_{15}$ and $SATT_{25}$ and main-word timing control $MTC_5$, the sub-word activating signal $SWAT_8$, SA activating signals $SAAT_{18}$ and $SATT_{28}$ and main-word timing control $MTC_8$ are newly output. That is, configurations of the activating signal generating circuit $20_8$ are the same as those of the activating signal generating circuit $20_5$ except for signals input and output thereto or therefrom.

Therefore, after the activating signal generating circuit $20_8$ has been selected out of 8 pieces of the activating signal generating circuits $20_1$ to $20_8$ by any one of the low-level block selecting signals $BS_{811}$, $BS_{822}$ and $BS_{844}$, the high-level main-word timing control signal $MTC_8$ is output with timing in which any one of the second control signals $SECC_1$, $SECC_2$ and $SECC_4$ changes to go high, and is then fed to the eighth block. Moreover, at a time of the test, since the test mode signal TM changes to go high, irrespective of supply of the block selecting signals $BS_{811}$, $BS_{822}$ and $BS_{844}$ and the second control signal $SECC_1$, $SECC_2$ and $SECC_4$, with timing in which the block forcedly-activating signal $BFAT_8$ changes to go high, the high-level main-word timing control signal $MTC_8$ is output.

Moreover, after the activating signal generating circuit $20_8$ has been selected out of 8 pieces of the activating signal generating circuits $20_1$ to $20_8$ by any one of the low-level block selecting signals $BS_{811}$, $BS_{822}$ and $BS_{844}$, the high-level sub-word timing control signal $SWAT_8$ is output with timing in which any one of the third control signals $THIC_1$, $THICS_2$ and $THIC_4$ changes to go high, and is then fed to the eighth block. Also, at a time of the test, the test clock TCK is first fed and, after the block forcedly-activating signal $BFAT_8$ has risen to go high at a time of an eighth rise of the test clock TCK, an output signal from the SR latch 330 changes to go low at a time of an eighth fall of the test clock TCK. Therefore, the high-level sub-word activating signal $SWAT_8$ is output, irrespective of supply of the block selecting signals $BS_{811}$, $BS_{822}$ and $BS_{844}$ and the third control signal $THIC_1$, $THIC_2$ and $THIC_4$ with timing in which the test clock TCK falls eighth.

Moreover, after the activating signal generating circuit $20_8$ has been selected from 8 pieces of the activating signal generating circuits $20_1$ to $20_8$ by any one of the high-level block selecting signals $BS_{811}$, $BS_{822}$ and $BS_{844}$, high-level SA activating signals $SAAT_{18}$ and $SAAT_{28}$ are sequentially output with timing in which the fourth control signals $FORC_{11}$, $FORC_{21}$, $FORC_{12}$ and $FORC_{22}$ change sequentially to go high.

Figure 38:
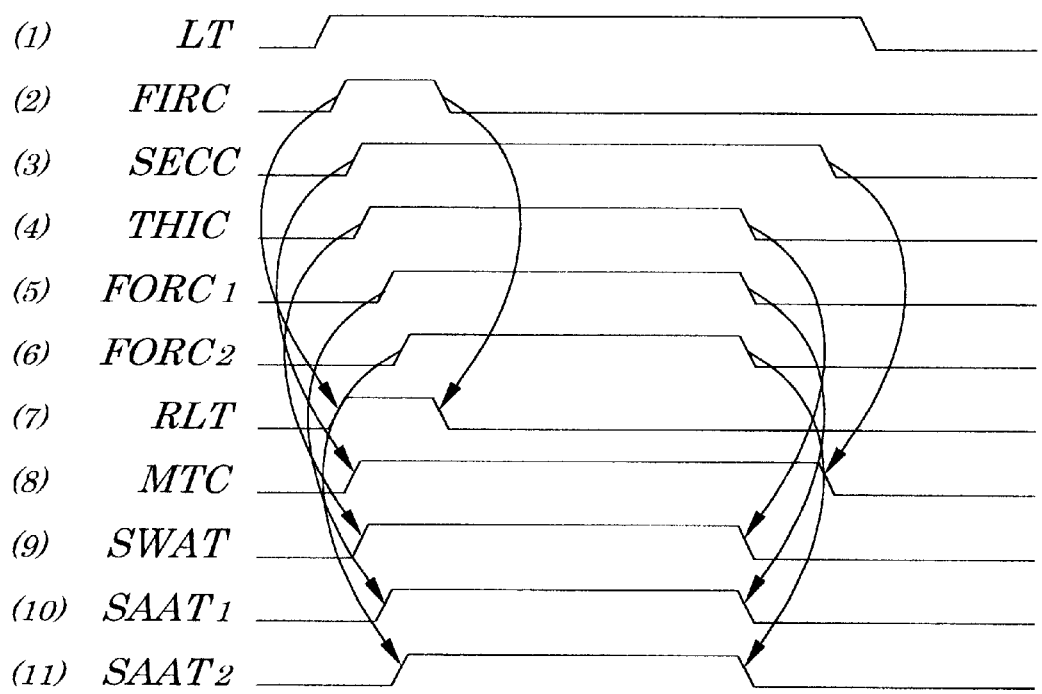
FIG. 38 is a timing chart briefly explaining normal operations of a DRAM according to the embodiment of the present invention.

Next, operations of the DRAM having configurations described above are explained below by referring to FIG. 38 to FIG. 45. First, a brief description of the DRAM will be given by referring to FIG. 38. The control circuit 3, by causing the latch signals $LT_1$ to $LT_4$, the number of which corresponds to storage capacity, numbers of banks and numbers of rows of memory cell arrays to be refreshed which are all set by the system designer, to sequentially rise to go high (see FIG. 38) and by causing each of corresponding reversed latch signals /LT to simultaneously and sequentially fall to go low (not shown), temporarily holds each of corresponding block selecting signals BS obtained before being reversed in each of block selecting signal generating circuits $18_1$ to $18_8$ making up each of the block activating sections $16_1$ to $16_8$. Then, the control circuit 3 causes the first control signals $FIRC_1$ to $FIRC_4$, second control signals $SECC_1$ to $SECC_4$, third control signals $THIC_1$ to $THIC_4$, 2 kinds of the fourth control signals $FORC_1$ to $FORC_{14}$ and $FORC_{21}$ to $FORC_{24}$, the number and kind of which correspond to storage capacity, the number of banks and the number of rows of memory cell arrays to be refreshed which are set by the system designer, to sequentially rise to go high (see FIG. 38 to [6]).

As a result, each of the block selecting signal generating circuits $18_1$ to $18_8$, since the transfer gate is turned OFF in response to the rise of each of the corresponding latch signals $LT_1$ to $LT_4$ and the fall of the reversed latch signal /LT, while the transfer gate is in the OFF state, latches the block selecting signal BS obtained before being reversed. Therefore, since the corresponding selecting signal BS is fed as a low level, each of the selected row address latch signal generating circuits $19_1$ to $19_8$, while each of the corresponding first control signals $FIRC_1$ to $FIRC_4$ remains at a high level (see FIG. 38), generates each of the corresponding row address latch signals $RLT_1$ to $RLT_8$ (see FIG. 38) and then feeds it to the row decoder 10 making up the corresponding row decoder group 6 (see FIG. 3). Similarly, since the corresponding block selecting signal BS is fed as a low level, each of the activating signal generating circuits $20_1$ to $20_8$, while each of the corresponding second control signals $SECC_1$ to $SECC_4$ remains at a high level (see FIG. 38), generates each of the corresponding main-word timing control signals $MTC_1$ to $MTC_8$ (see FIG. 38) and feeds them to the row decoder 10 making up the corresponding row decoder group 6 (see FIG. 3) and, while each of the third control signals $THIC_1$ to $THIC_4$ remains at a high level (see FIG. 38), generates each of the corresponding sub-word activating signals $SWAT_1$ to $SWAT_8$ (see FIG. 38) and then feeds them to each of the sub-word lines of the corresponding MCA and further, while the two kinds of the fourth control signals $FORC_{11}$ to $FORC_{14}$ and $FORC_{21}$ to $FORC_{24}$ (see FIG. 38 and [6]) remain at a high level, generates the corresponding two kinds of the SA activating signals $SAAT_{11}$ to $SAAT_{18}$ and $SAAT_{21}$ to $SAAT_{28}$ (see FIG. 38 and [11]) and then feeds them to two SAs making up the corresponding block.

Figure 39:
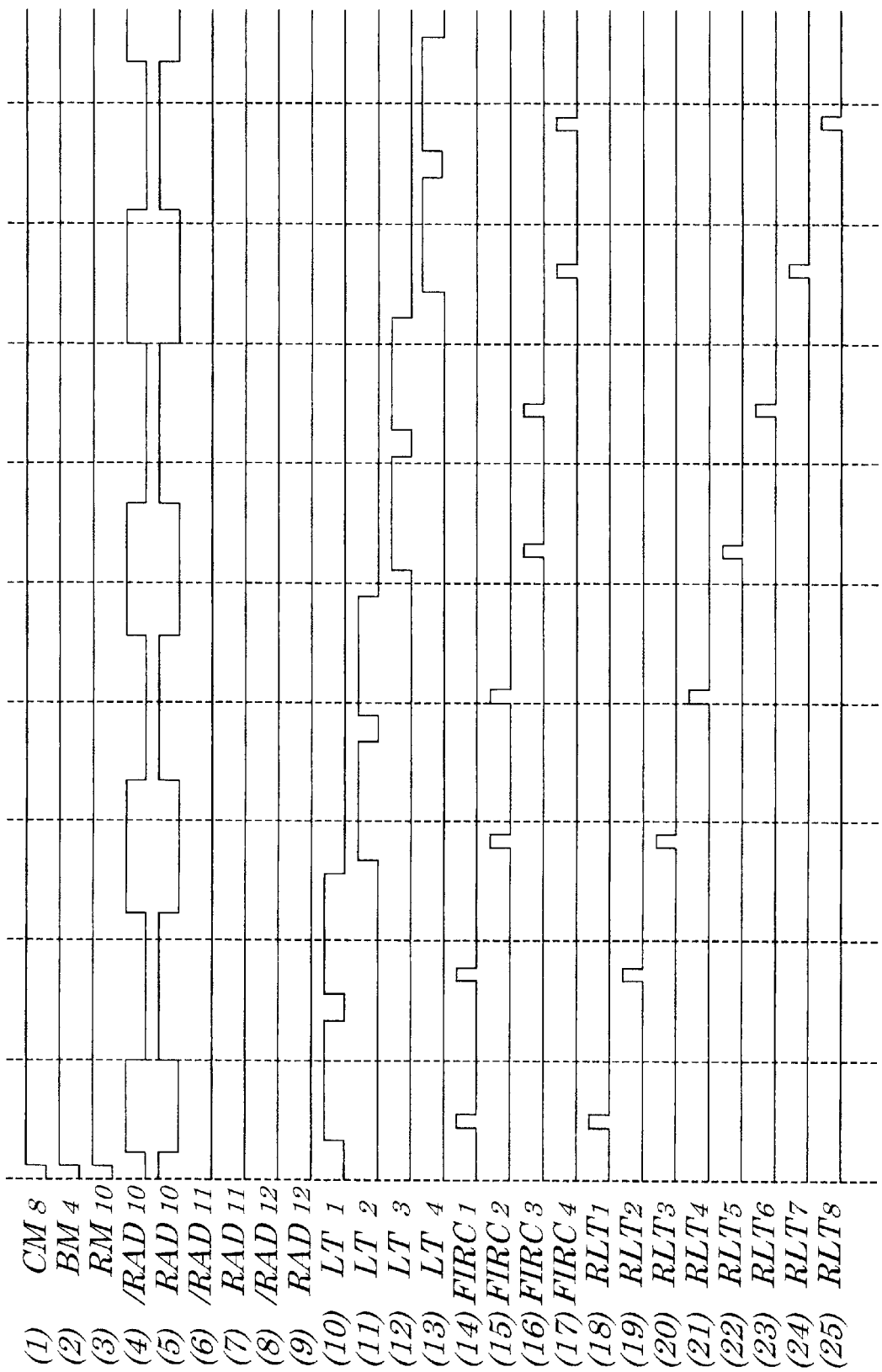
FIG. 39 is a timing chart explaining, in detail, normal operations of the DRAM in which 8M bits are set as storage capacity, 4 is set as number of banks and 1K is set as number of rows of memory cell arrays to be refreshed according to the embodiment of the present invention.

Next, normal operations of the DRAM will be described in detail by referring to FIG. 39 to FIG. 41. First, in the embodiment, since the system designer sets the storage capacity at 8M bits, numbers of banks at 4 and numbers of rows of memory cell arrays to be refreshed at 1K, the control circuit 3 outputs all the capacity mode signal $CM_8$, bank mode signal $BM_4$ and refresh mode signal $RM_{10}$ as high-level signals as shown in FIG. 39 to [3] and all the capacity mode signals $CM_2$ and $CM_4$, bank mode signals $BM_1$ and $BM_2$, refresh mode signals $RM_{05}$, $RM_{20}$ and $RM_{40}$ as low level signals (not shown). Moreover, the control circuit 3, since the number of rows of memory cell arrays to be refreshed is set at 1K, feeds the row address higher-bit signal $RAD_{10}$ and the reversed row address higher-bit signal $/RAD_{10}$ out of address signals AD supplied from outside to the activating circuit 4, however, does not feed the row address higher-bit signals $RAD_{11}$ and $RAD_{12}$ and the reversed row address higher-bit signals $/RAD_{11}$ and $/RAD_{12}$ (see FIG. 39 to [9]) to the activating circuit 4. Furthermore, the control circuit 3, since it is in a normal operation, keeps the test mode signal TM and the block forcedly-activating signals $BFAT_1$ to $BFAT_8$ at a low level and does not supply the test clock TCK. Next, the control circuit 3, after specified time has elapsed following the supply of the high-level reversed row address higher-bit signal $/RAD_{10}$, makes the latch signal $LT_1$ rise to go high (see FIG. 39) and, at the same time, makes the reversed latch signal $/LT_1$ fall to go low (not shown). On the other hand, the refresh decoder 15 shown in FIG. 5, though not shown, based on the high-level refresh mode signal $RM_{10}$ and high-level reversed row address higher-bit signal $/RAD_{10}$, generates the block activating designation signal $ATD_1$ and feeds it to the block selecting signal generating circuits $18_1$, $18_3$, $18_5$ and $18_7$. This causes the block selecting signal generating circuit $18_1$ to output the block selecting signal $BS_{114}$ as a low level and, while the latch signal $LT_1$ remains at a high level, holds the block selecting signal $BS_{114}$ as the low-level signal (not shown), however, since neither the high-level latch signals $LT_2$ to $LT_4$ nor low-level reversed latch signals $/LT_2$ to $/LT_4$ are fed, each of the block selecting signals $BS_{324}$, $BS_{544}$ and $BS_{744}$ is output as a low level from each of the block selecting signal generating circuits $18_3$, $18_5$ and $18_7$ respectively, only while the block activating designation $ATD_1$ is being supplied, that is, only while the high-level reversed row address higher-bit signal $/RAD_{10}$ is being supplied (not shown).

Figure 40:
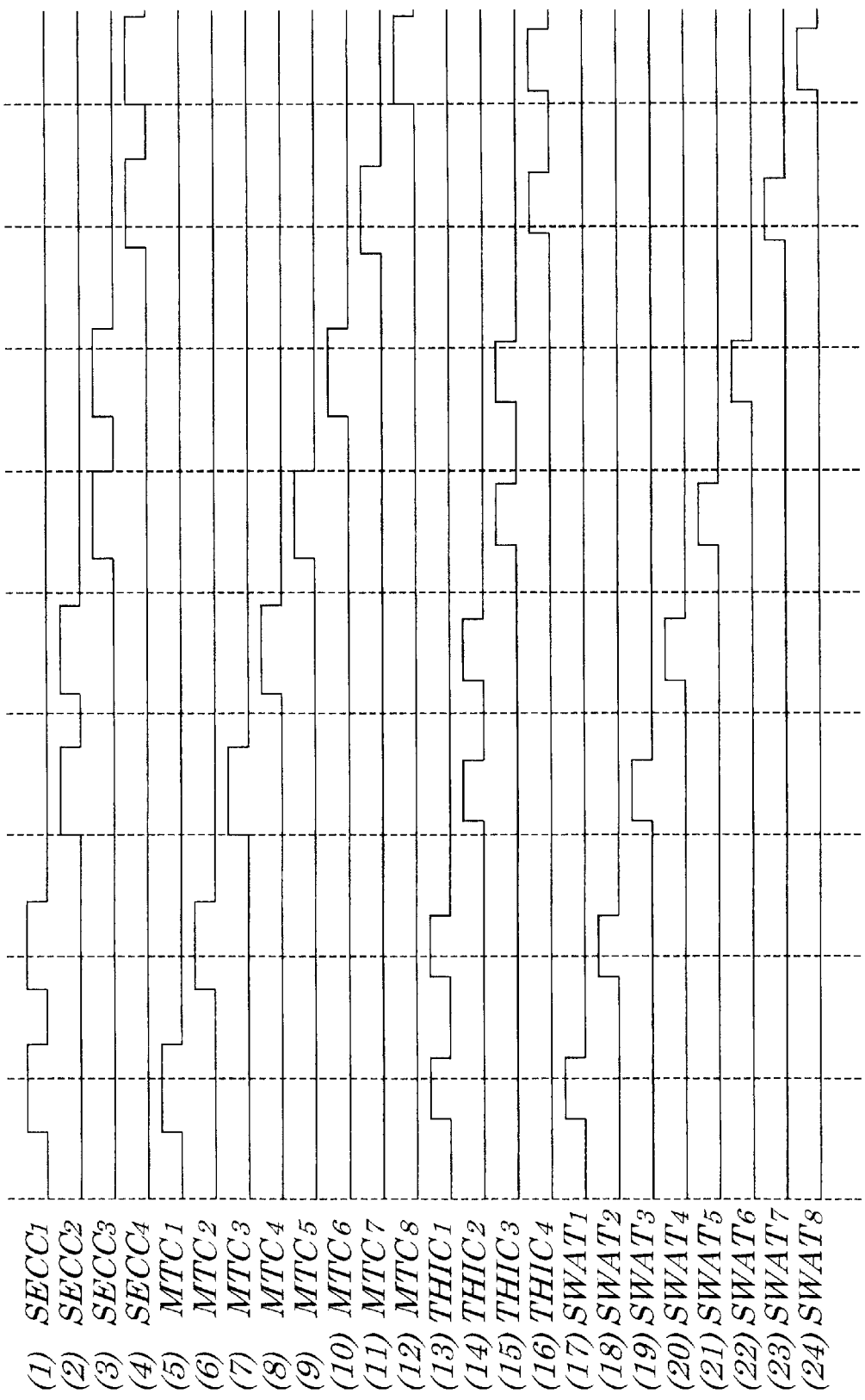
FIG. 40 is a timing chart explaining, in detail, normal operations of the DRAM in which 8M bits are set as the storage capacity, 4 is set as the number of banks and 1K is set as the number of rows of memory cell arrays to be refreshed according to the embodiment of the present invention.
Figure 41:
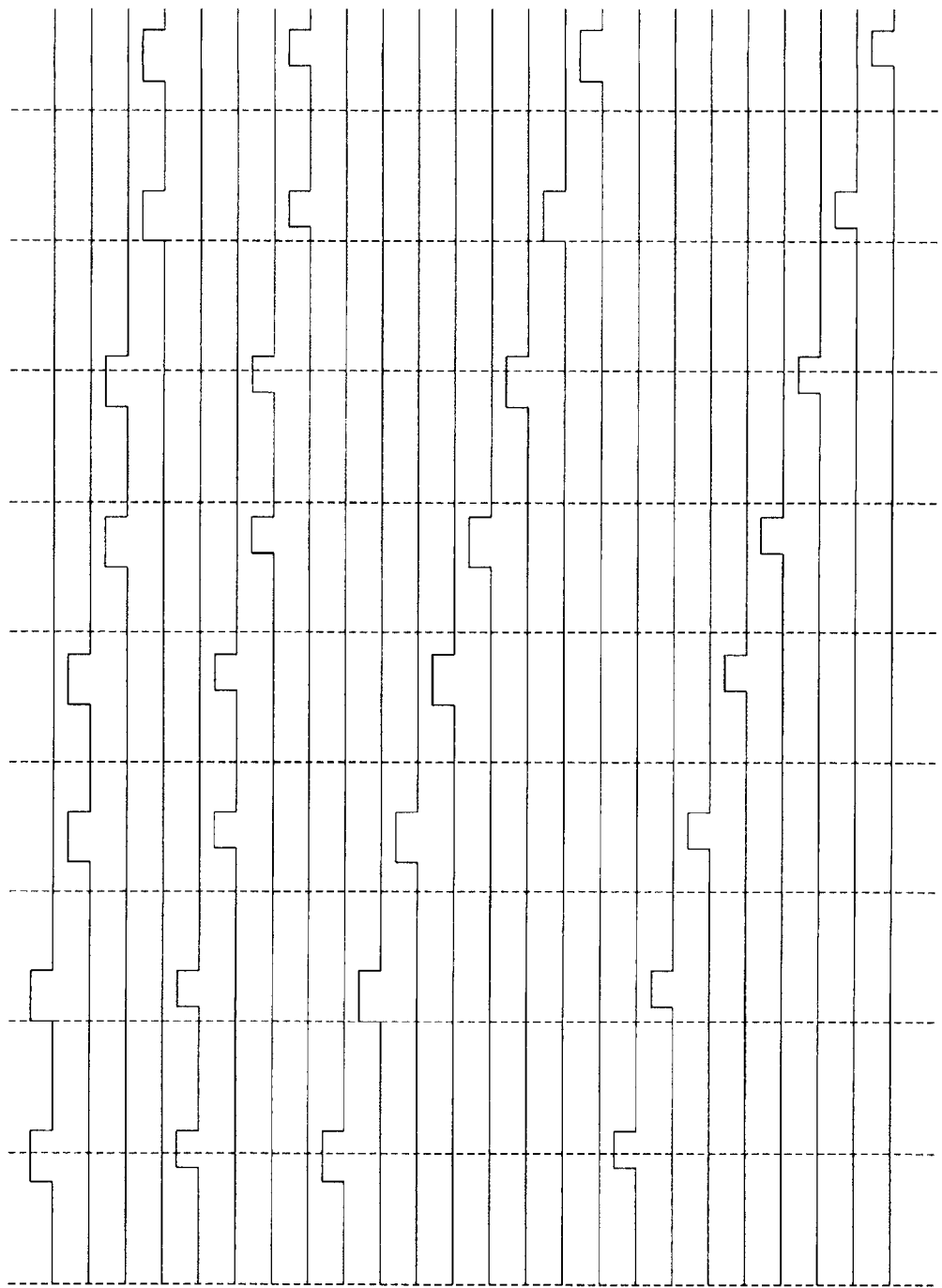
FIG. 41 is a timing chart explaining, in detail, normal operations of the DRAM in which 8M bits are set as the storage capacity, 4 is set as the number of banks and 1K is set as the number of rows of memory cell arrays to be refreshed according to the embodiment of the present invention.

Next, the control circuit 3, after specified time has elapsed, makes the first control signal $FIRC_1$, second control signal $SECC_1$, third control signal $THIC_1$ and two kinds of fourth control signals $FORC_{11}$ and $FORC_{21}$ sequentially rise to go high and holds them at a high level for specified time (see FIG. 40 and [13] and FIG. 41 and [5]). As a result, the row address latch signal generating circuit $19_1$ generates the high-level row address latch signal $RLT_1$ while the first control signal $FIRC_1$ remains at a high level (see FIG. 39) and then feeds it to the row decoder 10 making up the corresponding row decoder group 6. On the other hand, though each of the row address latch signal generating circuits $19_3$, $19_5$ and $19_7$ is fed respectively with each of the low-level block selecting signal $BS_{324}$, $BS_{544}$ and $BS_{744}$ only while the high-level reversed row address higher-bit signal $/RAD_{10}$ is being fed, since the high-level control signals $FIRC_2$ to $FIRC_4$ are not fed, each of the row address latch signal generating circuits $19_3$, $19_5$ and $19_7$ does not output the high-level row address latch signals $RLT_3$, $RLT_5$ and $RLT_7$ (see FIG. 39, [22] and [24]. Similarly, the activating signal generating circuit $20_1$, while the second control signal $SECC_1$ remains at a high level (see FIG. 40), generates the main-word timing control signal $MTC_1$ (see FIG. 40) and then feeds it to the row decoder 10 making up the corresponding row decoder group 6 (see FIG. 3) and, while the third control signal $THIC_1$ remains at a high level (see FIG. 40), generates the sub-word activating signal $SWAT_1$ (see FIG. 40) and then feeds it to sub-word lines of corresponding MCA and, while the two kinds of the corresponding control signals $FORC_{11}$ and $FORC_{21}$ remain at a high level (see FIG. 41 and [5]), generates the two kinds of the SA activating signals $SAAT_{11}$ and $SAAT_{21}$ (see FIG. 41 and [17]) and then feeds them to two pieces of the SAs $9_{11}$ and $9_{12}$ making up the first block using all blocks belonging to the bank $7_1$ shown in FIG. 2. On the other hand, though each of the activating signal generating circuits $20_3$, $20_5$ and $20_7$ is fed with each of the low-level block selecting signals $BS_{324}$, $BS_{544}$ and $BS_{744}$ only while the high-level reversed row address higher-bit signal $/RAD_{10}$ is supplied, since high-level second control signals $SECC_2$ to $SECC_4$, high-level third control signals $THIC_2$ to $THIC_4$ and high-level fourth control signals $FORC_{12}$ to $FORC_{14}$ and $FORC_{22}$ to $FORC_{24}$ are not supplied, each of the activating signal generating circuits $20_3$, $20_5$ and $20_7$ does not output the high-level main-word timing control signal $MTC_3$, $MTC_5$ and $MTC_7$, high-level sub-word activating signal $SWAT_3$, $SWAT_5$ and $SWAT_7$ and high-level SA activating signals $SAAT_{13}$, $SAAT_{23}$ and $SAAT_{15}$, $SAAT_{25}$, $SAAT_{17}$ and $SAAT_{27}$ (see FIG. 40, [9], [11], [19], [21] and [23], and FIG. 41, [13], [15], [19], [21] and [23]).

The control circuit 3, after having made the first control signal $FIRC_1$ fall to go low (see FIG. 39), by causing the third control signal $THIC_1$, two kinds of the fourth control signals $FORC_{11}$ and $FORC_{21}$ to fall simultaneously to go low (see FIG. 40 and FIG. 41 and [5]), makes both the sub-word activating signal $SWAT_1$ and two kinds of SA activating signals $SAAT_{11}$ and $SAAT_{21}$ simultaneously fall (see FIG. 40 and see FIG. 41). Then, the control circuit 3, by making the second control signal $SECC_1$ fall to go low (see FIG. 40), after completion of the activation of the first block by using all blocks belonging to the bank $7_1$, makes the latch signal $LT_1$ fall to go low (see FIG. 39) and the reversed latch signal $/LT_1$ rise to go high (not shown).

Next, the control circuit 3, after specified time has elapsed following the supply of the high-level row address higher-bit signal $RAD_{10}$, makes the latch signal $LT_1$ rise to go high (see FIG. 39) and, at the same time, makes the reversed latch signal $/LT_1$ fall to go low (not shown). On the other hand, the refresh decoder 15 shown in FIG. 5, though not shown, based on the high-level refresh mode signal $RM_{10}$ and high-level row address higher-bit signal $RAD_{10}$, generates the block activating designation signal $ATD_2$ and feeds it to the block selecting signal generating circuits $18_2$, $18_4$, $18_6$ and $18_8$. This causes the block selecting signal generating circuit $18_2$ to output the block selecting signal $BS_{214}$ as a low level and, while the latch signal $LT_1$ remains at a high level, holds the block selecting signal $BS_{214}$ as the low-level signal (not shown), however, since neither the high-level latch signals $LT_2$ to $LT_4$ nor low-level reversed latch signals $/LT_2$ to $/LT_4$ are fed, each of the block selecting signals $BS_{424}$, $BS_{644}$ and $BS_{844}$ is output as a low level from each of the block selecting signal generating circuits $18_4$, $18_6$ and $18_8$ respectively, only while the block activating designation ATD$_2$ is being supplied, that is, only while the high-level row address higher-bit signal RAD$_{10}$ is being supplied (not shown).

Next, the control circuit 3, after specified time has elapsed, makes the first control signal FIRC$_1$, second control signal SECC$_1$, third control signal THIC$_1$ and two kinds of fourth control signals FORC$_{11}$ and FORC$_{21}$ sequentially rise to go high (see FIG. 39, FIG. 40 and [13] and FIG. 41 and [5]). As a result, the row address latch signal generating circuit 19$_2$ generates the high-level row address latch signal RLT$_2$ (see FIG. 39) while the first control signal FIRC$_1$ remains at a high level (see FIG. 39) and then feeds it to the row decoder 10 making up the corresponding row decoder group 6 (see FIG. 3). On the other hand, though each of the row address latch signal generating circuits 19$_4$, 19$_6$ and 19$_8$ is fed respectively with each of the low-level block selecting signal BS$_{424}$, BS$_{644}$ and BS$_{844}$ only while the high-level row address higher-bit signal RAD$_{10}$ is being fed, since the high-level control signals FIRC$_2$ to FIRC$_4$ are not fed, each of the row address latch signal generating circuits 19$_4$, 19$_6$ and 19$_8$ does not output the high-level row address latch signals RLT$_4$, RLT$_6$ and RLT$_8$ (see FIG. 39, [23] and [25]). Similarly, the activating signal generating circuit 20$_2$, while the second control signal SECC$_1$ remains at a high level (see FIG. 40), generates the main-word timing control signal MTC$_2$ (see FIG. 40) and then feeds it to the row decoder 10 making up the corresponding row decoder group 6 (see FIG. 3) and, while the third control signal THIC$_1$ remains at a high level (see FIG. 40), generates the sub-word activating signal SWAT$_2$ (see FIG. 40) and then feeds it to sub-word lines of corresponding MCA and, while the two kinds of the corresponding control signals FORC$_{11}$ and FORC$_{21}$ remain at a high level (see FIG. 41 and [5]), generates the two kinds of the SA activating signals SAAT$_{12}$ and SAAT$_{22}$ (see FIG. 41 and [18]) and then feeds them to two pieces of the SAs 9$_{21}$ and 9$_{22}$ making up the second block using all blocks belonging to the bank 7$_1$ shown in FIG. 2. On the other hand, though each of the activating signal generating circuits 20$_4$, 20$_6$ and 20$_8$ is fed with each of the low-level block selecting signals BS$_{424}$, BS$_{644}$ and BS$_{844}$ only while the high-level row address higher-bit signal RAD$_{10}$ is supplied, since high-level second control signals SECC$_2$ to SECC$_4$, high-level third control signals THIC$_2$ to THIC$_4$ and high-level fourth control signals FORC$_{12}$ to FORC$_{14}$ and FORC$_{22}$ to FORC$_{24}$ are not supplied, each of the activating signal generating circuits 20$_4$, 20$_6$ and 20$_8$ does not output the high-level main-word timing control signal MTC$_4$, MTC$_6$ and MTC$_8$, high-level sub-word activating signal SWAT$_4$, SWAT$_6$ and SWAT$_8$ and high-level SA activating signals SAAT$_{24}$, SAAT$_{16}$ and SAAT$_{26}$, SAAT$_{18}$ and SAAT$_{28}$ (see FIG. 40, [10], [12], [20], [22] and [24], and FIG. 41, [14], [16], [20], [22] and [24]). Then, the control circuit 3, after having made the first control signal FIRC$_1$ fall to go low (see FIG. 39), by causing the third control signal THIC$_1$, two kinds of the fourth control signals FORC$_{11}$ and FORC$_{21}$ to fall simultaneously to go low (see FIG. 40 and FIG. 41 and [5]), makes both the sub-word activating signal SWAT$_2$ and two kinds of SA activating signals SAAT$_{12}$ and SAAT$_{22}$ simultaneously fall (see FIG. 40 and see FIG. 41). Then, the control circuit 3, by making the second control signal SECC$_1$ fall to go low (see FIG. 40), after completion of the activation of the second block by using all blocks belonging to the bank 7$_1$, makes the latch signal LT$_1$ fall to go low (see FIG. 39) and the reversed latch signal /LT$_1$ rise to go high (not shown).

Thereafter, every time the high-level reversed row address higher-bit signal /RAD$_{10}$ and high-level row address higher-bit signal RAD$_{10}$ are supplied, by repeating the same operations as described above on the latch signals LT$_2$ to LT$_4$, reversed latch signals /LT$_2$ to /LT$_4$, first control signals FIRC$_2$ to FIRC$_4$, second control signals SECC$_2$ to SECC$_4$, third control signals THIC$_2$ to THIC$_4$ and two kinds of the fourth control signals FORC$_{12}$ to FORC$_{14}$ and FORC$_{22}$ to FORC$_{24}$, the third to eighth blocks are sequentially activated. Moreover, operations of writing and reading of data, of refreshing or a like are almost the same as those of the conventional DRAM and their descriptions are omitted accordingly.

Figure 42:
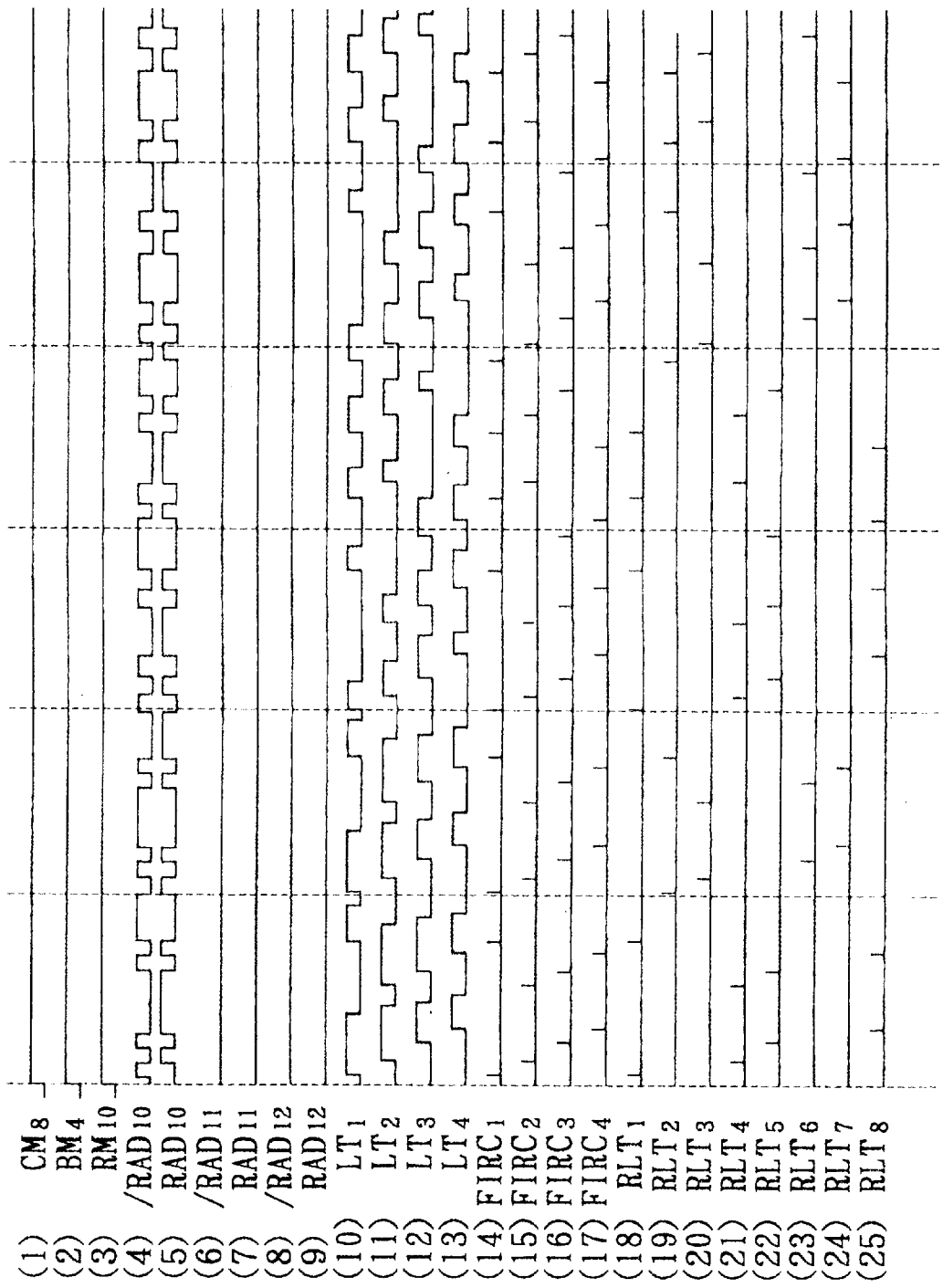
FIG. 42 is a timing chart explaining, in detail, multi-banking operations of the DRAM in which 8M bits are set as the storage capacity, 4 is set as the number of banks and 1K is set as the number of rows of memory cell arrays to be refreshed according to the embodiment of the present invention.

Next, operations in which a plurality of blocks belonging to a plurality of banks of the DRAM are almost simultaneously activated will be described by referring to FIG. 42 to FIG. 44. First, in the embodiment, since the system designer sets the storage capacity at 8M bits, numbers of banks at 4 and numbers of rows of memory cell arrays to be refreshed at 1K, the control circuit 3 outputs all the capacity mode signal CM$_8$, bank mode signal BM$_4$ and refresh mode signal RM$_{10}$ as a high-level as shown in FIG. 42 to [3] and all the capacity mode signals CM$_2$ and CM$_4$, bank mode signals BM$_1$ and BM$_2$, refresh mode signals RM$_{05}$, RM$_{20}$ and RM$_{40}$ as a low level (not shown). Moreover, the control circuit 3, since the number of rows of memory cell arrays to be refreshed is set at 1K, feeds the row address higher-bit signal RAD$_{10}$ and reversed row address higher-bit signal /RAD$_{10}$ out of address signals AD supplied from outside to the activating circuit 4 and does not feed the row address higher-bit signal RAD$_{11}$, RAD$_{12}$ and reversed row address higher-bit signal /RAD$_{11}$ and /RAD$_{12}$ (see FIG. 42 to [9]). Furthermore, the control circuit 3, since it is in a normal operation, keeps the test mode signal TM and the block forcedly-activating signals BFAT$_1$ to BFAT$_6$ at a low level and does not supply the test clock TCK.

Next, the control circuit 3, after specified time has elapsed following the supply of the high-level reversed row address higher-bit signal /RAD$_{10}$, makes the latch signal LT$_1$ rise to go high (see FIG. 40) and, at the same time, makes the reversed latch signal /LT$_1$ fall to go low (not shown). On the other hand, the refresh decoder 15 shown in FIG. 5, though not shown, based on the high-level refresh mode signal RM$_{10}$ and high-level reversed row address higher-bit signal /RAD$_{10}$, generates the block activating designation signal ATD$_1$ and feeds it to the block selecting signal generating circuits 18$_1$, 18$_3$, 18$_5$ and 18$_7$. This causes the block selecting signal generating circuit 18$_1$ to output the block selecting signal BS$_{114}$ as a low level and, while the latch signal LT$_1$ remains at a high level, holds the block selecting signal BS$_{114}$ as the low-level signal (not shown), however, since neither the high-level latch signals LT$_2$ to LT$_4$ nor low-level reversed latch signals /LT$_2$ to /LT$_4$ are fed, each of the block selecting signals BS$_{324}$, BS$_{544}$ and BS$_{744}$ is output as a low level from each of the block selecting signal generating circuits 18$_3$, 18$_5$ and 18$_8$ respectively, only while the block activating designation ATD$_1$ is being supplied, that is, only while the high-level reversed row address higher-bit signal /RAD$_{10}$ is being supplied (not shown).

Next, the control circuit 3, after specified time has elapsed, makes the first control signal FIRC$_1$, second control signal SECC$_1$, third control signal THIC$_1$ and two kinds of fourth control signals FORC$_{11}$ and FORC$_{21}$ sequentially rise to go high (see FIG. 42). (see FIG. 42, FIG. 43 and [13] and FIG. 44 and [5]). As a result, the row address latch signal generating circuit 19$_1$ generates the high-level row address latch signal RLT$_1$ (see FIG. 42)

while the first control signal $FIRC_1$ remains at a high level (see FIG. 42) and then feeds it to the row decoder 10 making up the corresponding row decoder group 6 (see FIG. 3). On the other hand, though each of the row address latch signal generating circuits $19_3$, $19_5$ and $19_7$ is fed respectively with each of the low-level block selecting signal $BS_{324}$, $BS_{544}$ and $BS_{744}$ only while the high-level reversed row address higher-bit signal $/RAD_{10}$ is being fed, since the high-level first control signals $FIRC_2$ to $FIRC_4$ are not fed, each of the row address latch signal generating circuits $19_3$, $19_5$ and $19_7$ does not output the high-level row address latch signals $RLT_3$, $RLT_5$ and $RLT_7$ (see FIG. 42, [22] and [24]. Similarly, the activating signal generating circuit $20_1$, while the second control signal $SECC_1$ remains at a high level (see FIG. 43), generates the main-word timing control signal $MTC_1$ (see FIG. 43) and then feeds it to the row decoder 10 making up the corresponding row decoder group 6 (see FIG. 3) and, while the third control signal $THIC_1$ remains at a high level (see FIG. 43), generates the sub-word activating signal $SWAT_1$ (see FIG. 43) and then feeds it to sub-word lines of corresponding MCA and, while the two kinds of the corresponding fourth control signals $FORC_{11}$ and $FORC_{21}$ remain at a high level (see FIG. 41 and [5]), generates two kinds of the SA activating signals $SAAT_{11}$ and $SAAT_{21}$ (see FIG. 44 and [17]) and then feeds them to two SAs $9_{11}$ and $9_{12}$ making up the first block by using all the blocks belonging to the bank $7_1$ shown in FIG. 2. On the other hand, though each of the activating signal generating circuits $20_3$, $20_5$ and $20_7$ is fed with each of the low-level block selecting signals $BS_{324}$, $BS_{544}$ and $BS_{744}$ only while the high-level reversed row address higher-bit signal $/RAD_{10}$ is supplied, since high-level second control signals $SECC_2$ to $SECC_4$, high-level third control signals $THIC_2$ to $THIC_4$ and high-level fourth control signals $FORC_{12}$ to $FORC_{14}$ and $FORC_{22}$ to $FORC_{24}$ are not supplied, each of the activating signal generating circuits $20_3$, $20_5$ and $20_7$ does not output the high-level main-word timing control signal $MTC_3$, $MTC_5$ and $MTC_7$, high-level sub-word activating signal $SWAT_3$, $SWAT_5$ and $SWAT_7$ and high-level SA activating signals $SAAT_{13}$, $SAAT_{23}$ and $SAAT_{15}$, $SAAT_{25}$, $SAAT_{17}$ and $SAAT_{27}$ (see FIG. 43, [9], [11], [19], [21] and [23], and FIG. 44, [13], [15], [19], [21] and [23]).

While the first block is activated by all blocks belonging to the bank $7_1$ described above, the control circuit 3, after specified time has elapsed following supply of the high-level row address higher-bit signal $RAD_{10}$, makes the latch signal $LT_2$ rise to go high (see FIG. 42) and the reversed latch signal $/LT_2$ simultaneously fall to go low (not shown). On the other hand, the refresh decoder 15 shown in FIG. 5, though not shown, based on the high-level refresh mode signal $RM_{10}$ and high-level row address higher-bit signal $RAD_{10}$, generates the block activating designation signal $ATD_2$ and feeds it to the block selecting signal generating circuits $18_2$, $18_4$, $18_6$ and $18_8$. Moreover, the high-level latch signal $LT_1$ and the low-level reversed latch signal $/LT1$ continue to be supplied (see FIG. 42). This causes the block selecting signal generating circuit $18_1$ to output the low-level block selecting signal $BS_{114}$ (not shown). On the other hand, in the block selecting signal generating circuit $18_2$, though the block activating designation signal $ATD_2$ is supplied, since the transfer gate 87 remains in an OFF state due to the high-level latch signal $LT_1$ and low-level reversed latch signal $/LT_1$, the block selecting signal $BS_{214}$ is output as a high-level signal (not shown). Furthermore, this causes the block selecting signal generating circuit $18_4$ to output the block selecting signal $BS_{424}$ as a low level and, while the latch signal $LT_2$ remains at a high level, holds the block selecting signal $BS_{424}$ as the low-level signal (not shown), however, since neither the high-level latch signals $LT_3$ and $LT_4$ nor low-level reversed latch signals $/LT_3$ and $/LT_4$ are fed, each of the block selecting signals $BS_{634}$ and $BS_{844}$ is output as a low level from each of the block selecting signal generating circuits $18_6$ and $18_8$ respectively, only while the block activating designation $ATD_2$ is being supplied, that is, only while the high-level row address higher-bit signal $RAD_{10}$ is being supplied (not shown).

Figure 43:
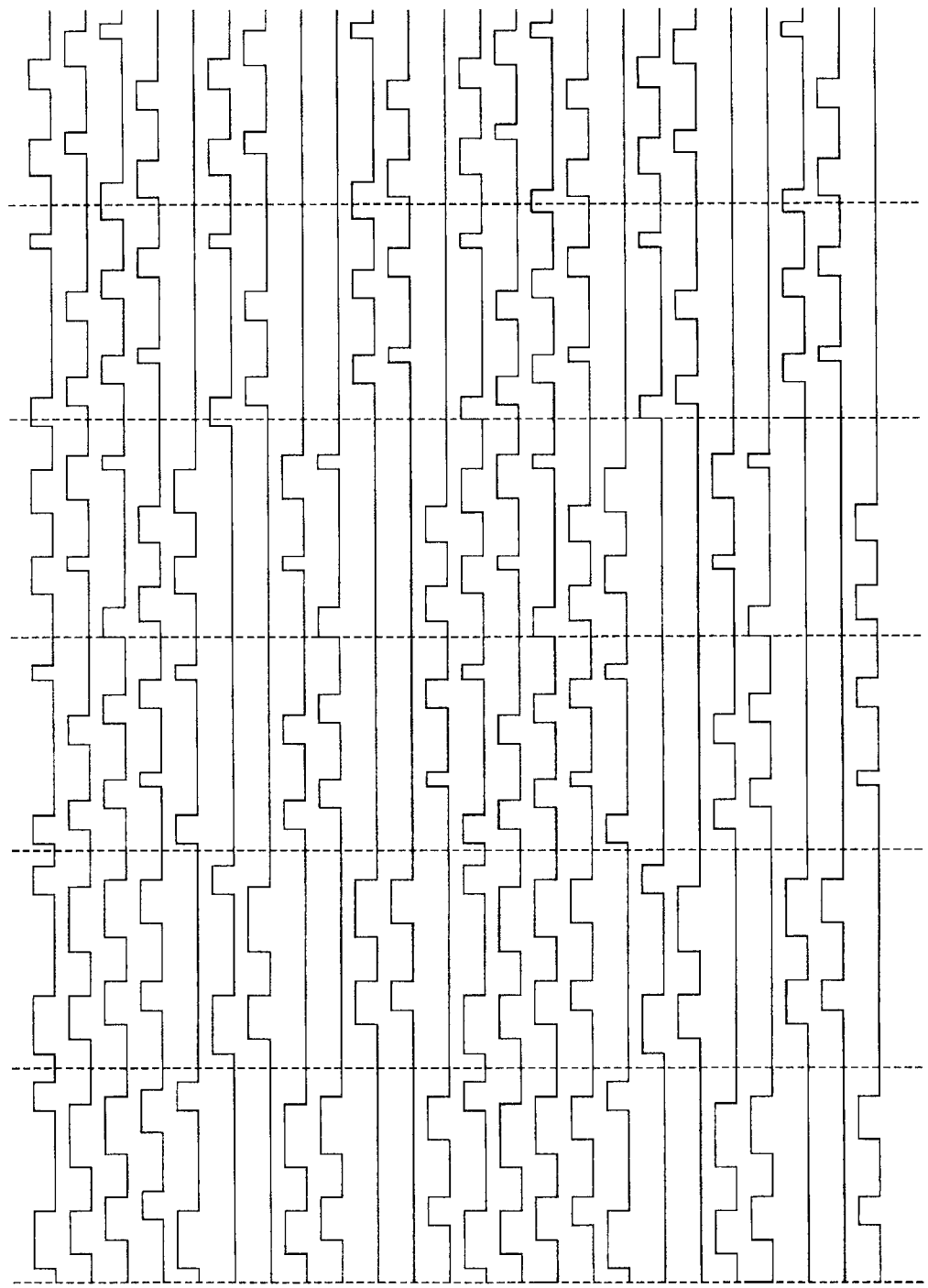
FIG. 43 is a timing chart explaining, in detail, multi-banking operations of the DRAM in which 8M bits are set as the storage capacity, 4 is set as the number of banks and 1K is set as the number of rows of memory cell arrays to be refreshed according to the embodiment of the present invention.
Figure 44:
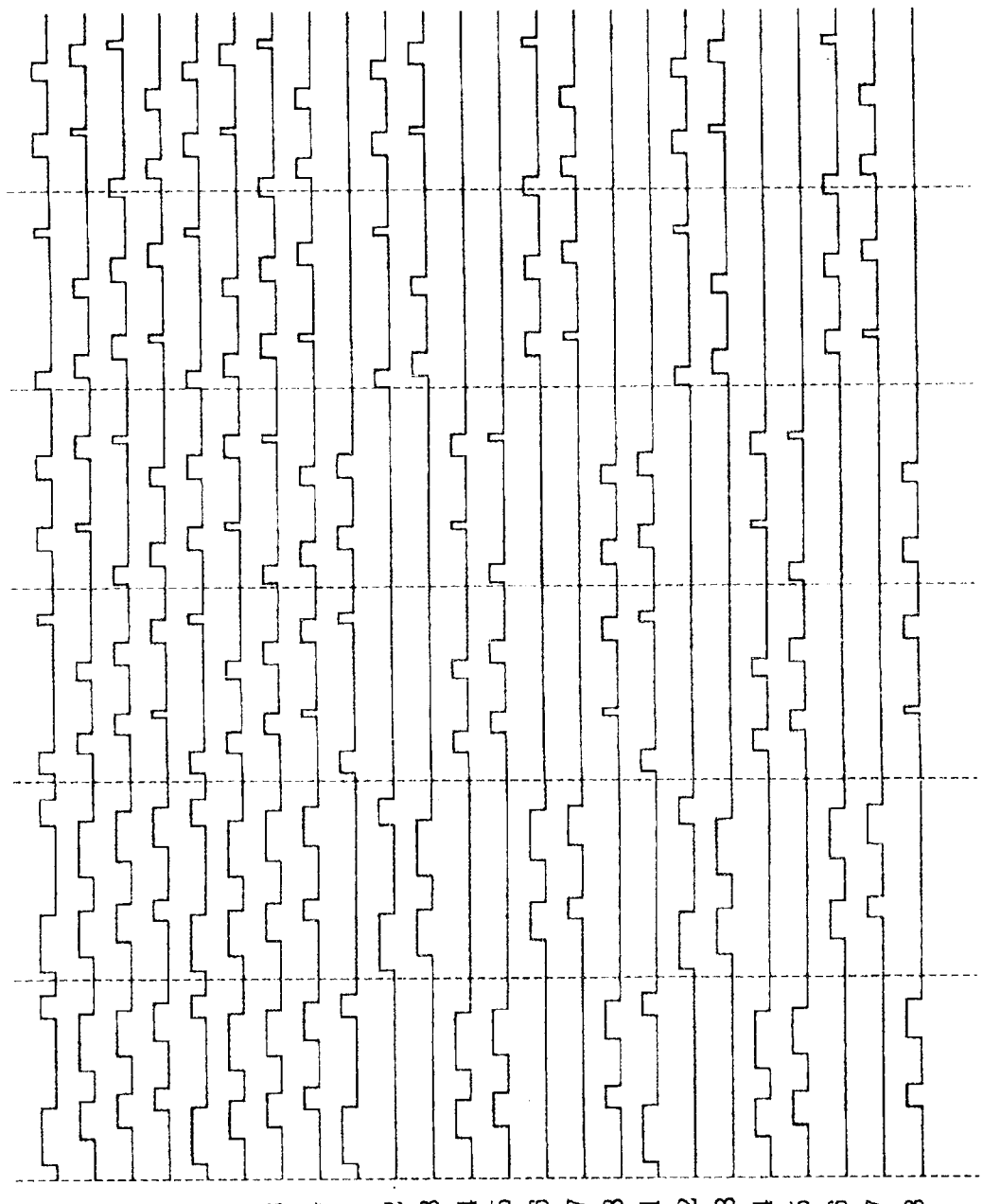
FIG. 44 is a timing chart explaining, in detail, multi-banking operations of the DRAM in which 8M bits are set as the storage capacity, 4 is set as the number of banks and 1K is set as the number of rows of memory cell arrays to be refreshed according to the embodiment of the present invention.

Next, the control circuit 3, after specified time has elapsed, makes the first control signal $FIRC_2$, second control signal $SECC_2$, third control signal $THIC_2$ and two kinds of fourth control signals $FORC_{12}$ and $FORC_{22}$ sequentially rise to go high (see FIG. 42, FIG. 43, [14] and FIG. 44 and [6]). As a result, the row address latch signal generating circuit $19_4$ generates the row address latch signal $RLT_1$ (see FIG. 42) while the first control signal $FIRC_2$ remains at a high level (see FIG. 42) and then feeds it to the row decoder 10 making up the corresponding row decoder group 6 (see FIG. 3). On the other hand, though each of the row address latch signal generating circuits $19_6$ and $19_8$ is fed respectively with each of the low-level block selecting signal $BS_{644}$ and $BS_{844}$ only while the high-level row address higher-bit signal $RAD_{10}$ is being fed, since the high-level first control signals $FIRC_3$ and $FIRC_4$ are not fed, each of the row address latch signal generating circuits $19_6$ and $19_8$ does not output the high-level row address latch signals $RLT_6$ and $RLT_8$ (see FIG. 42 and [25]). Similarly, the activating signal generating circuit $20_4$, while the second control signal $SECC_2$ remains at a high level (see FIG. 43), generates the main-word timing control signal $MTC_4$ (see FIG. 43) and then feeds it to the row decoder 10 making up the corresponding row decoder group 6 (see FIG. 3) and, while the third control signal $THIC_2$ remains at a high level (see FIG. 43), generates the sub-word activating signal $SWAT_4$ (see FIG. 43) and then feeds it to sub-word lines of corresponding MCA and, while two kinds of the corresponding fourth control signals $FORC_{12}$ and $FORC_{22}$ remain at a high level (see FIG. 44 and [6]), generates two kinds of the SA activating signals $SAAT_{14}$ and $SAAT_{24}$ (see FIG. 44 and [20]) and then feeds them to the two SAs $9_{21}$ and $9_{22}$ making up the first block by using all the blocks belonging to the bank $7_1$ shown in FIG. 2. On the other hand, though each of the activating signal generating circuits $20_6$ and $20_8$ is fed with each of the low-level block selecting signals $BS_{644}$ and $BS_{844}$ only while the high-level row address higher-bit signal $RAD_{10}$ is supplied, since high-level second control signals $SECC_3$ and $SECC_4$, high-level third control signals $THIC_3$ and $THIC_4$ and high-level fourth control signals $FORC_{13}$ and $FORC_{14}$ and $FORC_{23}$ to $FORC_{24}$ are not supplied, each of the activating signal generating circuits $20_6$ and $20_8$ does not output the high-level main-word timing control signal $MTC_6$ and $MTC_8$, high-level sub-word activating signal $SWAT_6$ and $SWAT_8$ and high-level SA activating signals $SAAT_{16}$, $SAAT_{26}$, $SAAT_{18}$, and $SAAT_{28}$ (see FIG. 43, [12], [22] and [24] and FIG. 41, [16], [22] and [24]).

While the first block is activated by all blocks belonging to the bank $7_1$ and the fourth block is activated by all blocks belonging to the bank $7_2$ described above, the control circuit 3, after specified time has elapsed following supply of the high-level reversed row address higher-bit signal $/RAD_{10}$, makes the latch signal $LT_3$ rise to go high (see FIG. 42) and the reversed latch signal $/LT_2$ simultaneously fall to go low (not shown). On the other hand, the refresh decoder 15 shown in FIG. 5, though not shown, based on the high-level refresh mode signal $RM_{10}$ and high-level reversed row address higher-bit signal $/RAD_{10}$, generates the block activating designation signal $ATD_1$ and feeds it to the block selecting signal generating circuits $18_1$, $18_3$, $18_5$ and $18_7$. Moreover, the high-level latch signal $LT_1$ and $LT_2$ and the low-level reversed latch signal $/LT_1$ and $/LT_2$ continue to be supplied (see FIG. 42). This causes the block selecting signal generating circuit $18_1$ and $18_4$ to output the low-level block selecting signal $BS_{114}$ and $BS_{424}$ (not shown). On the other hand, in the block selecting signal generating circuit $18_3$, though the block activating designation signal $ATD_1$ is supplied, since the transfer gate 166 remains in an OFF state due to the high-level latch signal $LT_1$ and low-level reversed latch signal $/LT_1$, the block selecting signal $BS_{324}$ is output as a high-level signal (not shown). Furthermore, this causes the block selecting signal generating circuit $18_5$ to output the block selecting signal $BS_{544}$ as a low level and, while the latch signal $LT_3$ remains at a high level, holds the block selecting signal $BS_{544}$ as the low-level signal (not shown), however, since neither the high-level latch signal $LT_4$ nor low-level reversed latch signal $/LT_4$ are fed, each of the block selecting signal $BS_{744}$ is output as a low level from each of the block selecting signal generating circuits $18_7$, only while the block activating designation $ATD_1$ is being supplied, that is, only while the high-level reversed row address higher-bit signal $/RAD_{10}$ is being supplied (not shown).

Next, the control circuit 3, after specified time has elapsed, makes the first control signal $FIRC_3$, second control signal $SECC_3$, third control signal $THIC_3$ and two kinds of fourth control signals $FORC_{13}$ and $FORC_{23}$ sequentially rise to go high (see FIG. 42, FIG. 43, [15] and FIG. 44 and [7]). As a result, the row address latch signal generating circuit $19_5$ generates the row address latch signal $RLT_5$ (see FIG. 42) while the first control signal $FIRC_5$ remains at a high level (see FIG. 42) and then feeds it to the row decoder 10 making up the corresponding row decoder group 6 (see FIG. 3). On the other hand, though the row address latch signal generating circuits $19_7$ is fed with the low-level block selecting signal $BS_{744}$ only while the high-level reversed row address higher-bit signal $/RAD_{10}$ is being fed, since the high-level first control signal $FIRC_4$ is not fed, the row address latch signal generating circuits $19_7$ does not output the high-level row address latch signals $RLT_7$ (see FIG. 42). Similarly, the activating signal generating circuit $20_5$, while the second control signal $SECC_3$ remains at a high level (see FIG. 43), generates the main-word timing control signal $MTC_5$ (see FIG. 43) and then feeds it to the row decoder 10 making up the corresponding row decoder group 6 (see FIG. 3) and, while the third control signal $THIC_3$ remains at a high level (see FIG. 43), generates the sub-word activating signal $SWAT_5$ (see FIG. 43) and then feeds it to sub-word lines of corresponding MCA and, while two kinds of the corresponding fourth control signals $FORC_{13}$ and $FORC_{23}$ remain at a high level (see FIG. 44 and [7]), generates two kinds of the SA activating signals $SAAT_{15}$ and $SAAT_{25}$ (see FIG. 44 and [21]) and then feeds them to two pieces of the SAs $9_{11}$ and $9_{12}$ making up the fifth block by using all the blocks belonging to the bank $7_3$ shown in FIG. 2. On the other hand, though the activating signal generating circuits $20_7$ is fed with the low-level block selecting signals $BS_{744}$ only while the high-level reversed row address higher-bit signal $/RAD_{10}$ is supplied, since high-level second control signals $SECC_4$, high-level third control signals $THIC_4$ and high-level fourth control signals $FORC_{14}$ and $FORC_{24}$ are not supplied, the activating signal generating circuits $20_6$ and $20_8$ do not output the high-level main-word timing control signal $MTC_7$, high-level sub-word activating signal $SWAT_7$ and high-level SA activating signals $SAAT_{17}$ and $SAAT_{27}$ (see FIG. 43 and [23] and FIG. 44 and [23]).

While the first block is activated by all blocks belonging to the bank $7_1$, the fourth block is activated by all blocks belonging to the bank $7_2$ and the fifth block is activated by all blocks belonging to the bank $7_3$ described above, the control circuit 3, after specified time has elapsed following supply of the high-level row address higher-bit signal $RAD_{10}$, makes the latch signal $LT_4$ rise to go high (see FIG. 42) and the reversed latch signal $/LT_4$ simultaneously fall to go low (not shown). On the other hand, the refresh decoder 15 shown in FIG. 5, though not shown, based on the high-level refresh mode signal $RM_{10}$ and high-level row address higher-bit signal $RAD_{10}$, generates the block activating designation signal $ATD_2$ and feeds it to the block selecting signal generating circuits $18_2$, $18_4$, $18_6$ and $18_8$. Moreover, the high-level latch signals $LT_1$ to $LT_3$ and the low-level reversed latch signal $/LT_1$ and $/LT_2$ continue to be supplied (see FIG. 42 to [12]). This causes the block selecting signal generating circuit $18_1$, $18_4$ and $18_5$ to output the low-level block selecting signal $BS_{114}$ and $BS_{424}$ and $BS_{544}$ (not shown). On the other hand, in the block selecting signal generating circuit $18_2$, though the block activating designation signal $ATD_2$ is supplied, since the transfer gate 87 remains in an OFF state due to the high-level latch signal $LT_1$ and low-level reversed latch signal $/LT_1$, the block selecting signal $BS_{214}$ is output as a high-level signal (not shown). In the block selecting signal generating circuit $18_6$ shown in FIG. 27, though the block activating designation signal $ATD_2$ is supplied, since the transfer gate 275 remains in an OFF state due to the high-level latch signal $LT_3$ and low-level reversed latch signal $/LT_3$, the block selecting signal $BS_{644}$ is output as the high-level signal (not shown). Furthermore, the block selecting signal generating circuit $18_8$ outputs the block selecting signal $BS_{844}$ as a low level and, while the latch signal $LT_4$ remains at a high level, holds the block selecting signal $BS_{644}$ as the low-level signal (not shown).

Next, the control circuit 3, after specified time has elapsed, makes the first control signal $FIRC_4$, second control signal $SECC_4$, third control signal $THIC_4$ and two kinds of fourth control signals $FORC_{14}$ and $FORC_{24}$ sequentially rise to go high (see FIG. 42, FIG. 43, [16] and FIG. 44 and [8]). As a result, the row address latch signal generating circuit $19_9$ generates the row address latch signal $RLT_8$ (see FIG. 42) while the first control signal $FIRC_4$ remains at a high level (see FIG. 42) and then feeds it to the row decoder 10 making up the corresponding row decoder group 6 (see FIG. 3). Similarly, the activating signal generating circuit $20_8$, while the second control signal SECC, remains at a high level (see FIG. 43), generates the main-word timing control signal $MTC_8$ (see FIG. 43) and then feeds it to the row decoder 10 making up the corresponding row decoder group 6 (see FIG. 3) and, while the third control signal $THIC_4$ remains at a high level (see FIG. 43), generates the sub-word activating signal $SWAT_8$ (see FIG. 43) and then feeds it to sub-word lines of corresponding MCA and, while two kinds of the corresponding fourth control signals $FORC_{14}$ and $FORC_{24}$ remain at a high level (see FIG. 44 and [8]), generates two kinds of the SA activating signals $SAAT_{18}$ and $SAAT_{28}$ (see FIG. 44 and [24]) and then feeds them to two pieces of the SAs $9_{21}$ and $9_{22}$ making up the eighth block by using all the blocks belonging to the bank $7_4$ shown in FIG. 2.

The control circuit 3, after having made the first control signal $FIRC_1$ fall to go low (see FIG. 42), by causing the third control signal $THIC_1$, two kinds of the fourth control signals $FORC_{11}$ and $FORC_{21}$ to fall simultaneously to go low (see FIG. 43 and FIG. 44 and [5]), makes both the sub-word activating signal $SWAT_1$ and two kinds of SA activating signals $SAAT_{11}$ and $SAAT_{21}$ simultaneously fall (see FIG. 43 and see FIG. 44 and [17]). Then, the control circuit 3, by making the second control signal $SECC_1$ fall to go low (see FIG. 43), after completion of the activation of the first block by using all blocks belonging to the bank $7_1$, makes the latch signal $LT_1$ fall to go low (see FIG. 42) and the reversed latch signal $/LT_1$ simultaneously rise to go high (not shown). Then, the control circuit 3, after having made the first control signal $FIRC_2$ fall to go low (see FIG. 42), by causing the third control signal $THIC_2$, two kinds of the fourth control signals $FORC_{12}$ and $FORC_{22}$ to fall simultaneously to go low (see FIG. 43 and FIG. 44 and [6]), makes both the sub-word activating signal $SWAT_4$ and two kinds of SA activating signals $SAAT_{14}$ and $SAAT_{24}$ simultaneously fall (see FIG. 43 and see FIG. 44 and [20]). Then, the control circuit 3, by making the second control signal $SECC_2$ fall to go low (see FIG. 43), after completion of the activation of the fourth block by using all blocks belonging to the bank $7_2$, makes the latch signal $LT_2$ fall to go low (see FIG. 42) and the reversed latch signal $/LT_2$ simultaneously rise to go high (not shown). Then, the control circuit 3, after having made the first control signal $FIRC_3$ fall to go low (see FIG. 42), by causing the third control signal $THIC_3$, two kinds of the fourth control signals $FORC_{13}$ and $FORC_{23}$ to fall simultaneously to go low (see FIG. 43 and FIG. 44 and [7]), makes both the sub-word activating signal $SWAT_5$ and two kinds of SA activating signals $SAAT_{15}$ and $SAAT_{25}$ simultaneously fall (see FIG. 43 and FIG. 44 and [21]). Then, the control circuit 3, by making the second control signal $SECC_3$ fall to go low (see FIG. 43), after completion of the activation of the fifth block by using all blocks belonging to the bank $7_3$, makes the latch signal $LT_3$ fall to go low (see FIG. 42) and the reversed latch signal $/LT_3$ simultaneously rise to go high (not shown). Then, the control circuit 3, after having made the first control signal $FIRC_4$ fall to go low (see FIG. 42), by causing the third control signal $THIC_4$, two kinds of the fourth control signals $FORC_{14}$ and $FORC_{24}$ to fall simultaneously to go low (see FIG. 43 and FIG. 44 and [8]), makes both the sub-word activating signal $SWAT_8$ and two kinds of SA activating signals $SAAT_{18}$ and $SAAT_{28}$ simultaneously fall (see FIG. 43 and FIG. 44 and [24]). Then, the control circuit 3, by making the second control signal $SECC_4$ fall to go low (see FIG. 43), after completion of the activation of the eighth block by using all blocks belonging to the bank $7_4$, makes the latch signal $LT_4$ fall to go low (see FIG. 42) and the reversed latch signal $/LT_4$ simultaneously rise to go high (not shown).

Thereafter, every time the high-level reversed row address higher-bit signal $/RAD_{10}$ and high-level row address higher-bit signal $RAD_{10}$ are supplied, by repeating the same operations as described above on latch signals $LT_1$ to $LT_4$, reversed latch signals $/LT_1$ to $/LT_4$, first control signals $FIRC_1$ to $FIRC_4$, second control signals $SECC_1$ to $SECC_4$, third control signals $THIC_1$ to $THIC_4$ and two kinds of the fourth control signals $FORC_{11}$ to $FORC_{14}$ and $FORC_{21}$ to $FORC_{24}$, a plurality of blocks is activated at the same time. Moreover, operations of writing and reading of data, of refreshing or a like are almost the same as those of the conventional DRAM and their descriptions are omitted accordingly.

Figure 45:
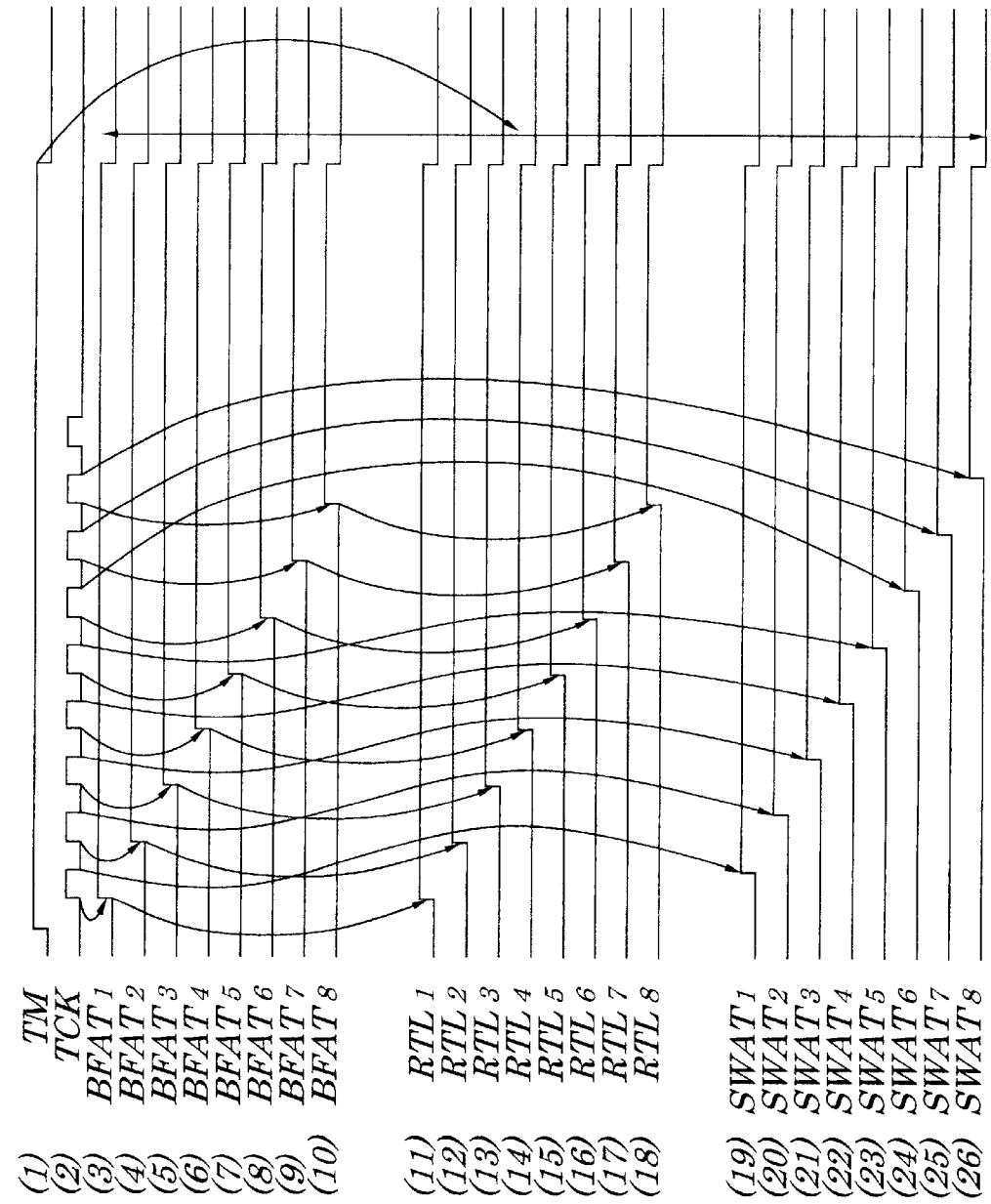
FIG. 45 is a timing chart briefly explaining testing operations of the DRAM according to the embodiment of the present invention.

Next, operations of the reliability test on the DRAM such as the analysis on defects will be briefly described by referring to FIG. 45. First, as shown in FIG. 45, the control circuit 3 makes the test mode signal TM rise to go high to move the routine to the test mode. Then, the control circuit 3, as shown in FIG. 45, feeds the test clock TCK to the activating circuit 4 and, at the same time, as shown in FIG. 45 to [10], sequentially makes the block forcedly-activating signals $BFAT_1$ to $BFAT_8$ rise at a time of the first to eighth rise of the test clock TCK and feeds them to the activating circuit 4. This causes the row address latch signal generating circuits $19_1$ to $19_8$ to output the high-level row address latch signals $RLT_1$ to $RLT_8$ with timing in which the corresponding block forcedly-activating signals $BFAT_1$ to $BFAT_8$ change to go high, as shown in FIG. 45 to [18]. Moreover, the activating signal generating circuits $20_1$ to $20_8$ output the high-level main-word timing control signals $MTC_1$ to $MTC_8$ with timing in which the corresponding block forcedly-activating signal $BFAT_1$ to $BFAT_8$ change to go high (not shown) and simultaneously the high-level sub-word activating signals $SWAT_1$ to $SWAT_8$ at a time of the first to eighth fall of the test clock TCK as shown in FIG. 45 to [26]. Therefore, since all blocks making up the memory block 1 are activated at the time when the test clock TCK has fallen eighth, the reliability test such as the analysis on defects can be executed. Then, to terminate the test, as shown in FIG. 45, the test mode signal TM is made to fall as shown in FIG. 45. This makes the block forcedly-activating signals $BFAT_1$ to $BFAT_8$ (see FIG. 45 to [10]), row address latch signals $RLT_1$ to $RLT_8$ (see FIG. 45 to [18]), sub-word activating signals $SWAT_1$ to $SWAT_8$ (see FIG. 45 to [26]) and main-word timing control signals $MTC_1$ to $MTC_8$ (not shown) to simultaneously fall to go low.

Figure 46:
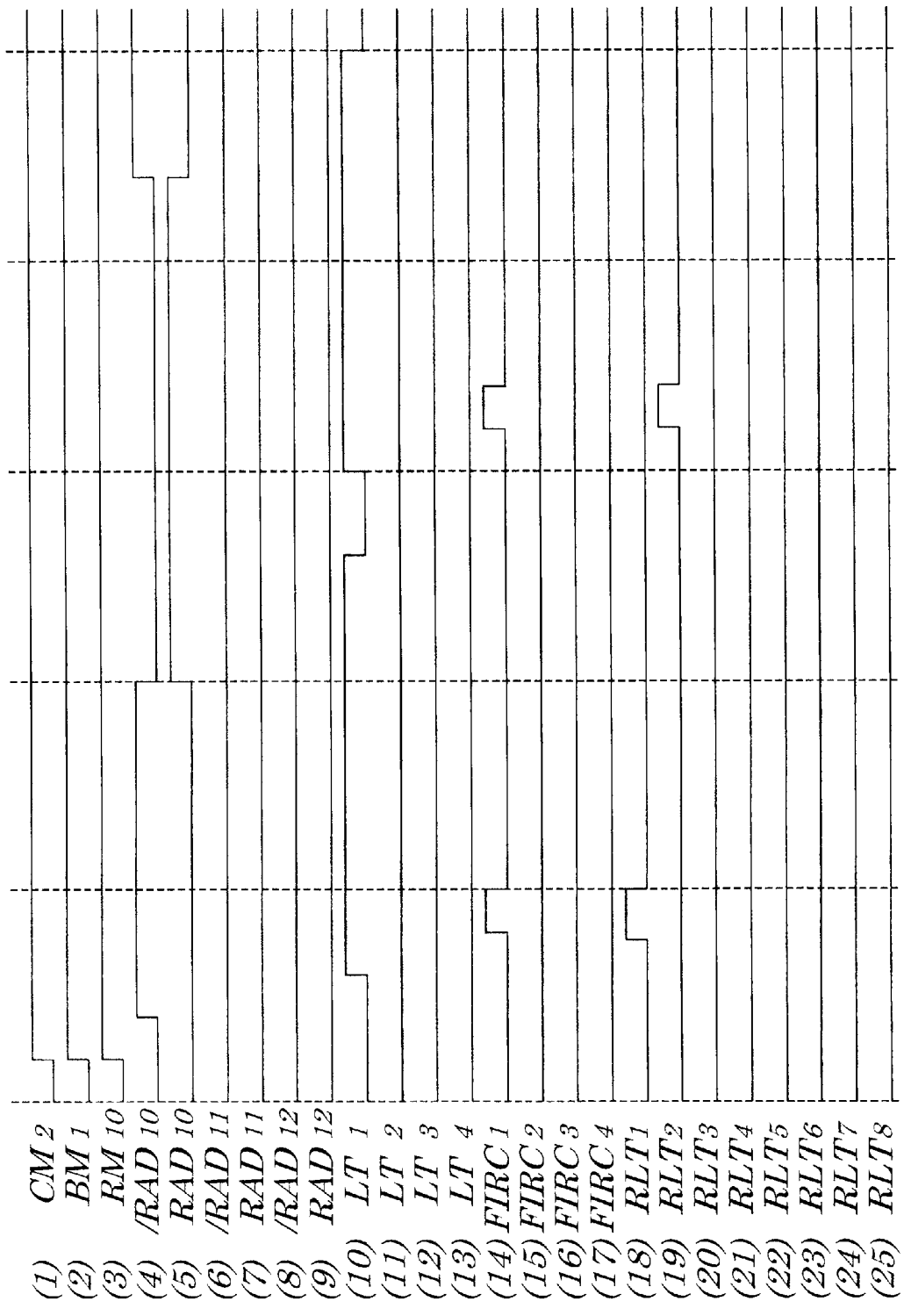
FIG. 46 is a timing chart explaining, in detail, multi-banking operations of the DRAM in which 2M bits are set as the storage capacity, 1 is set as the number of banks and 1K is set as the number of rows of memory cell arrays to be refreshed according to the embodiment of the present invention.

Next, normal operations of the DRAM performed when the system designer sets the storage capacity at 2M bits, the number of banks at 1 and the number of rows of memory cell arrays to be refreshed at 1K will be explained by referring to FIG. 46 to FIG. 48. In this case, the memory block, if configurations shown in FIG. 2 are applied, can be made up of 2 blocks contained in the bank $7_1$. First, the control circuit 3, as shown in FIG. 46 to [3], outputs all of the capacity mode signal $CM_2$, bank mode signal $BM_1$ and refresh mode signal $RM_{10}$ as a high level, and all of the capacity mode signals $CM_4$ and $CM_8$, bank mode signals $BM_2$ and $BM_4$ and refresh mode signals $RM_{05,}$ $RM_{20}$ and $RM_{40}$ as a low level (not shown). Moreover, the control circuit 3, since the number of rows of memory cell arrays to be refreshed is set at 1K, feeds the row address higher-bit signal $RAD_{10}$ and the reversed row address higher-bit signal $/RAD_{10}$ out of address signals AD supplied from outside to the activating circuit 4, however, does not feed the row address higher-bit signals $RAD_{11}$ and $RAD_{12}$ and the reversed row address higher-bit signals $/RAD_{11}$ and $/RAD_{12}$ (see FIG. 46 to [9]) to the activating circuit 4. Furthermore, the control circuit 3, since it is in a normal operation, keeps the test mode signal TM and the block forcedly-activating signals $BFAT_1$ to $BFAT_8$ at a low level and does not supply the test clock TCK. The control circuit 3, after specified time has elapsed following supply of the high-level reversed row address higher-bit signal $/RAD_{10}$, makes the latch signal $LT_1$ rise to go high (see FIG. 46) and the reversed latch signal $/LT_4$ simultaneously fall to go low (not shown). On the other hand, the refresh decoder 15 shown in FIG. 5, though not shown, based on the high-level refresh mode signal $RM_{10}$ and high-level reversed row address higher-bit signal $/RAD_{10}$, generates the block activating designation signal $ATD_1$ and feeds it to the block selecting signal generating circuits $18_1$, $18_3$, $18_5$ and $18_7$. This causes the block selecting signal generating circuit $18_1$ to output the block selecting signal $BS_{114}$ as a low level and, while the latch signal $LT_1$ remains at a high level, the block selecting signal $BS_{114}$ is held as the low level signal (not shown). However, since the high-level latch signals $LT_2$ to $/LT_4$ and the low-level reversed latch signals $/LT_2$ to $/LT_4$ are not supplied, the block selecting signals $BS_{324}$, $BS_{544}$ and $BS_{744}$ are output, as the low-level signal, respectively from the block selecting signal generating circuits $18_3$, $18_5$ and $18_7$ only while the block activating designation signal $ATD_1$ is being fed, that is, only while the high-level reversed row address higher-bit signal $/RAD_{10}$ is being fed.

Figure 47:
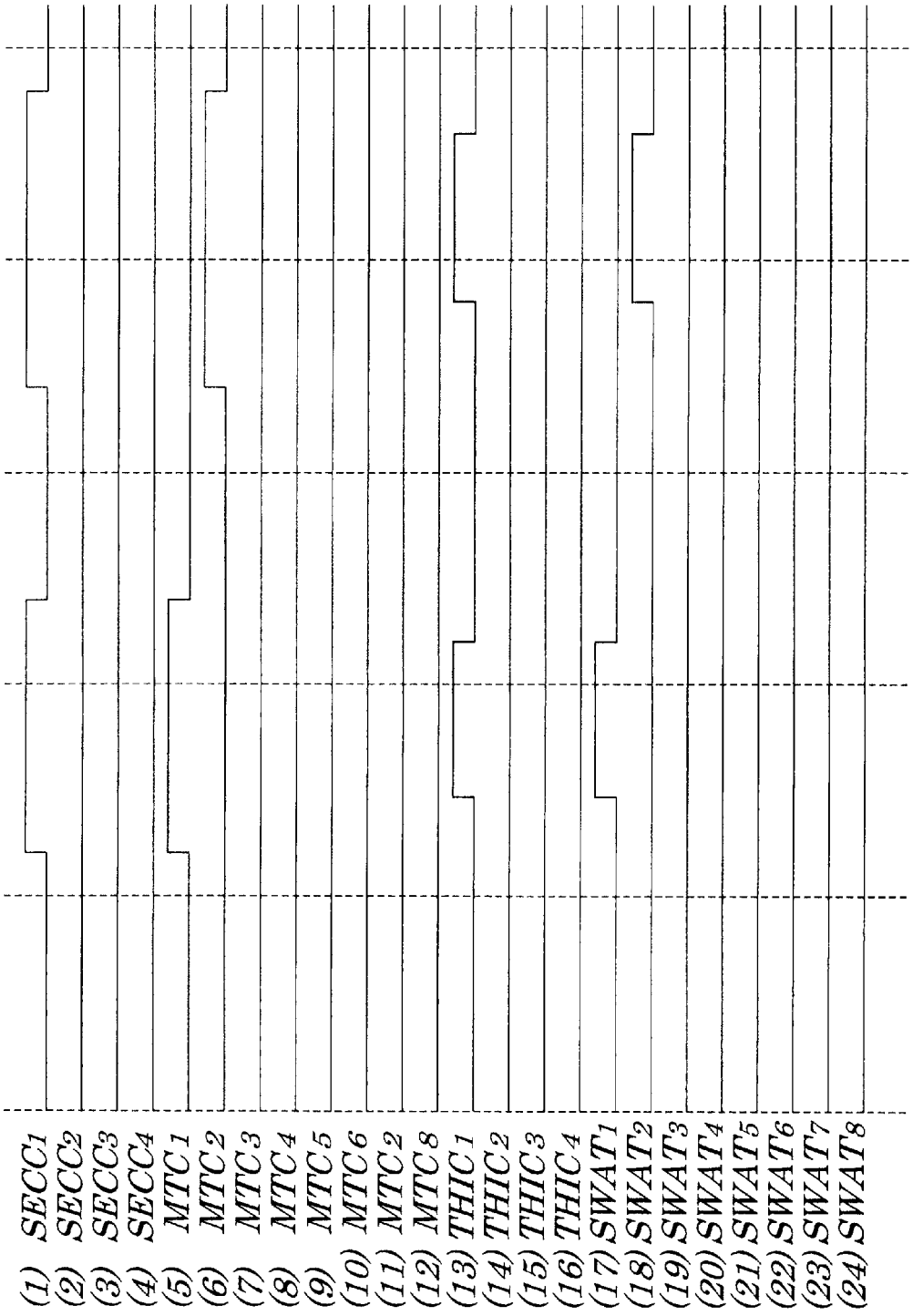
FIG. 47 is a timing chart explaining, in detail, multi-banking operations of the DRAM in which 2M bits are set as the storage capacity, 1 is set as the number of banks and 1K is set as the number of rows of memory cell arrays to be refreshed according to the embodiment of the present invention.
Figure 48:
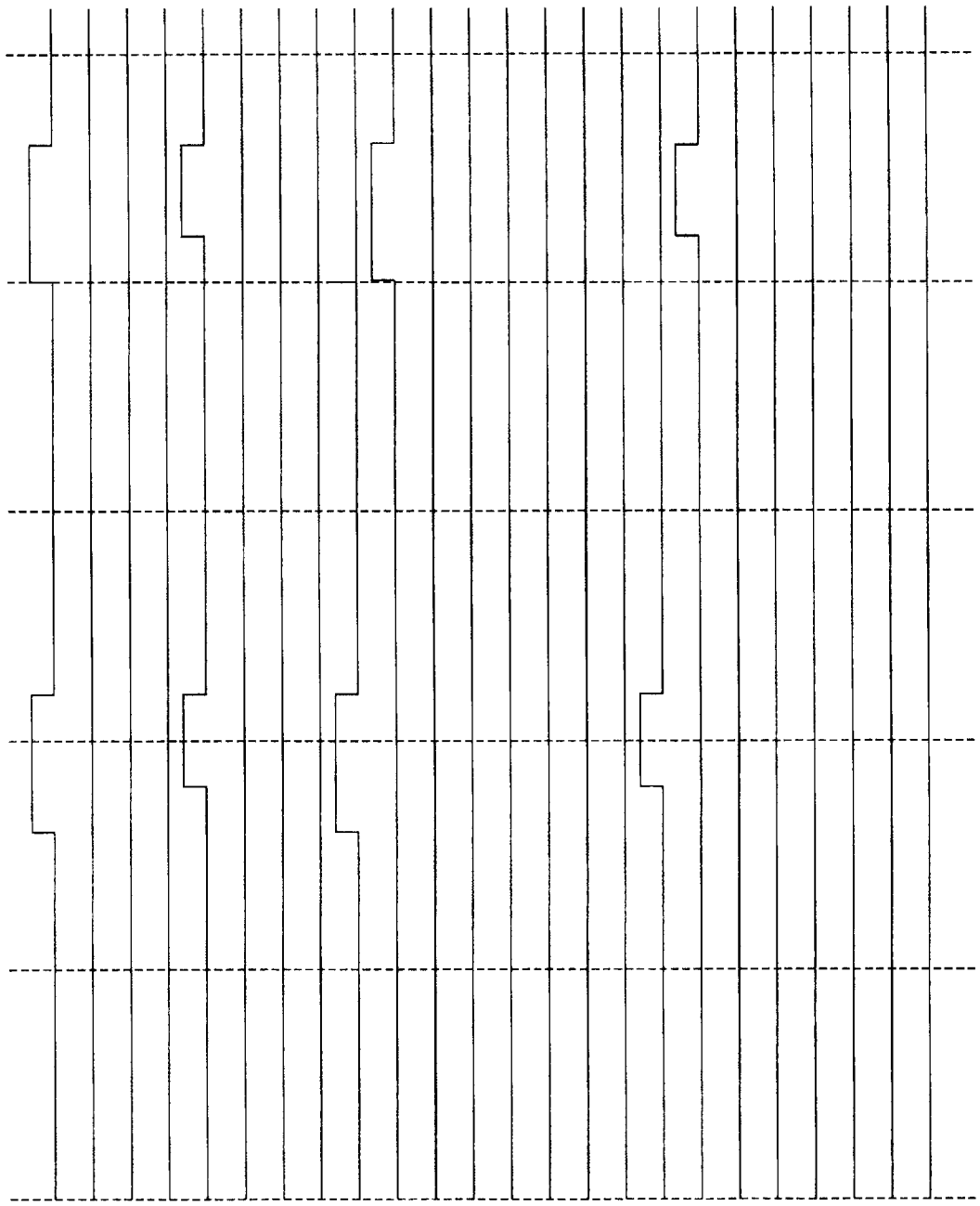
FIG. 48 is a timing chart explaining, in detail, multi-banking operations of the DRAM in which 2M bits are set as the storage capacity, 1 is set as the number of banks and 1K is set as the number of rows of memory cell arrays to be refreshed according to the embodiment of the present invention.

Next, the control circuit 3, after specified time has elapsed, makes the first control signal $FIRC_1$, second control signal $SECC_1$, third control signal $THIC_1$ and two kinds of fourth control signals $FORC_{11}$ and $FORC_{21}$ sequentially rise to go high and latches it for specified period of time (see FIG. 46, FIG. 47 and [13] and FIG. 48 and [5]). As a result, the row address latch signal generating circuit $19_1$ generates the high-level row address latch signal $RLT_1$ (see FIG. 46) while the first control signal $FIRC_1$ remains at a high level (see FIG. 46) and then feeds it to the row decoder 10 making up the corresponding row decoder group 6 (see FIG. 3). On the other hand, though each of the row address latch signal generating circuits $19_3$, $19_5$ and $19_7$ is fed respectively with each of the low-level block selecting signals $BS_{324}$, $BS_{544}$ and $BS_{744}$ only while the high-level reversed row address higher-bit signal $/RAD_{10}$ is being fed, since the high-level first control signals $FIRC_2$ to $FIRC_4$ are not fed, the high-level row address latch signals $RLT_3$, $RLT_5$ and $RLT_7$ are not output (see FIG. 46 [22] and [24]). Similarly, the activating signal generating circuits $20_1$, while the second control signals $SECC_1$ remains at a high level (see FIG. 47), generates the main-word timing control signals $MTC_1$ (see FIG. 47) and feeds them to the row decoder 10 making up the corresponding row decoder group 6 (see FIG. 3) and, while the third control signals $THIC_1$ remains at a high level (see FIG. 47), generates the sub-word activating signals $SWAT_1$ (see FIG. 47) and then feeds them to the sub-word lines of the corresponding MCA and further, while the two kinds of the fourth control signals $FORC_{11}$ and $FORC_{21}$ remain at a high level (see FIG. 48 and [5]), generates the two kinds of the SA activating signals $SAAT_{11}$ and $SAAT_{21}$ (see FIG. 48 and [17]) and then feeds them to two SAs $9_{11}$ and $9_{12}$ making up the first block being equivalent to the bank $7_1$ in FIG. 2. On the other hand, though each of the activating signal generating circuits $20_3$, $20_5$ and $20_7$ is fed respectively with each of the low-level block selecting signals $BS_{324}$, $BS_{544}$ and $BS_{744}$ only while the high-level reversed row address higher-bit signal $/RAD_{10}$ is being fed, since the high-level second control signals $SECC_2$ to $SECC_4$, high-level third control signals $THIC_2$ to $THIC_4$ and high-level fourth control signals $FORC_{12}$ to $FORC_{14}$ and $FORC_{22}$ to $FORC_{24}$ are not fed, the high-level main-word timing control signals $MTC_3$, $MTC_5$ and $MTC_7$, high-level sub-word activating signals $SWAT_3$, $SWAT_5$ and $SWAT_7$, high-level SA activating signals $SAAT_{13}$, $SAAT_{23}$, $SAAT_{15}$, $SAAT_{17}$ and $SAAT_{27}$ are not output (see FIG. 47 [9] [11], [19], [21] and [23], and FIG. 48, [13], [15] [19] [21] and [23]).

Then, the control circuit 3, after having made the first control signal $FIRC_1$ fall to go low (see FIG. 46), by causing the third control signal $THIC_1$, two kinds of the fourth control signals $FORC_{11}$ and $FORC_{21}$ to fall simultaneously to go low (see FIG. 47 and FIG. 48 and [5]), makes both the sub-word activating signal $SWAT_1$ and two kinds of SA activating signals $SAAT_{11}$ and $SAAT_{21}$ simultaneously fall (see FIG. 47 and FIG. 48 and [17]). Then, the control circuit 3, by making the second control signal $SECC_1$ fall to go low (see FIG. 47), after completion of the activation of the first block, makes the latch signal $LT_1$ fall to go low (see FIG. 46) and the reversed latch signal $/LT_3$ simultaneously rise to go high (not shown).

Next, the control circuit 3, after specified time has elapsed following the supply of the high-level row address higher-bit signal $RAD_{10}$, again makes the latch signal $LT_1$ rise to go high (FIG. 46) and makes the reversed latch signal $/LT_1$ simultaneously fall to go low (not shown). On the other hand, the refresh decoder 15 shown in FIG. 5, though not shown, based on the high-level refresh mode signal $RM_{10}$ and high-level row address higher-bit signal $RAD_{10}$, generates the block activating designation signal $ATD_2$ and feeds it to the block selecting signal generating circuits $18_2$, $18_4$, $18_6$ and $18_8$. This causes the block selecting signal generating circuit $18_2$ to output the block selecting signal $BS_{214}$ as a low level and, while the latch signal $LT_1$ remains at a high level, the block selecting signal $BS_{214}$ is held as the low level signal (not shown). However, since the high-level latch signals $LT_2$ to $LT_4$ and the low-level reversed latch signals $/LT_2$ to $/LT_4$ are not supplied, the block selecting signals $BS_{424}$, $BS_{644}$ and $BS_{844}$ are output, as the low-level signal, respectively from the block selecting signal generating circuits $18_4$, $18_6$ and $18_8$ only while the block activating designation signal $ATD_2$ is being fed, that is, only while the high-level row address higher-bit signal $RAD_{10}$ is being fed (not shown).

Next, the control circuit 3, after specified time has elapsed, makes the first control signal $FIRC_1$, second control signal $SECC_1$, third control signal $THIC_1$, two kinds of the fourth control signals $FORC_{11}$ and $FORC_{21}$ sequentially rise to go high (FIG. 46, FIG. 47 and [13] and FIG. 48 and [5]). This causes the row address latch signal generating circuit $19_2$, while the first control signal $FIRC_1$ remains at a high level (see FIG. 46), to generate the row address latch signal $RLT_2$ (see FIG. 46) and then feeds it to the row decoder 10 making up the corresponding row decoder group 6 (see FIG. 3). On the other hand, though each of the row address latch signal generating circuits $19_4$, $19_6$ and $19_8$ is fed respectively with each of the low-level block selecting signals $BS_{424}$, $BS_{644}$ and $BS_{844}$ only while the high-level row address higher-bit signal $RAD_{10}$ is being fed, since the high-level first control signals $FIRC_2$ to $FIRC_4$ are not fed, the high-level row address latch signals $RLT_4$, $RLT_6$ and $RLT_8$ are not output (see FIG. 46 [23] and [25]). Similarly, the activating signal generating circuit $20_2$, while the second control signal $SECC_1$ is at a high level (see FIG. 47), generates the main-word timing control signal $MTC_2$ (see FIG. 47) and then feeds it to the corresponding row decoder 10 making up the row decoder group 6 (see FIG. 3) and, while the third control signal $THIC_1$ is at a high level, generates the sub-word activating signal $SWAT_2$ (see FIG. 47) and then feeds it to the corresponding sub-word lines of the MCA and, while two kinds of the corresponding fourth control signals $FORC_{11}$ and $FORC_{21}$ are at a high level (see FIG. 48 and [5]), generates two kinds of the SA activating signals $SAAT_{12}$ and $SAAT_{22}$ (see FIG. 48 and [18]) and then feeds it to the two SAs $9_{21}$ and $9_{22}$ making up the second block being equivalent to the bank $7_1$ in FIG. 2. On the other hand, though each of the activating signal generating circuits $20_4$, $20_6$ and $20_8$ is fed respectively with each of the low-level block selecting signals $BS_{424}$, $BS_{644}$ and $BS_{844}$ only while the high-level row address higher-bit signal $RAD_{10}$ is being fed, since the high-level second control signals $SECC_2$ to $SECC_4$, high-level third control signals $THIC_2$ to $THIC_4$ and high-level fourth control signals $FORC_{12}$ to $FORC_{14}$ and $FORC_{22}$ to $FORC_{24}$ are not fed, the high-level main-word timing control signals $MTC_4$, $MTC_6$ and $MTC_8$, high-level sub-word activating signals $SWAT_4$, $SWAT_6$ and $SWAT_8$, high-level SA activating signals $SAAT_{14}$, $SAAT_{24}$, $SAAT_{16}$, $SAAT_{26}$, $SAAT_{18}$ and $SAAT_{28}$ are not output (see FIG. 47 [10] [12], [20], [22] and [24], and FIG. 48, [14], [16] [20] [22] and [24]). Then, the control circuit 3, after having made the first control signal $FIRC_1$ fall to go low (see FIG. 46), by causing the third control signal $THIC_1$, two kinds of the fourth control signals $FORC_{11}$ and $FORC_{21}$ to fall simultaneously to go low (see FIG. 47 and FIG. 48 and [5]), makes both the sub-word activating signal $SWAT_2$ and two kinds of SA activating signals $SAAT_{12}$ and $SAAT_{22}$ simultaneously fall (see FIG. 47 and FIG. 48 and [18]). Then, the control circuit 3, by making the second control signal $SECC_1$ fall to go low (see FIG. 47), after completion of the activation of the second block, makes the latch signal $LT_1$ fall to go low (see FIG. 46) and the reversed latch signal $/LT_3$ simultaneously rise to go high (not shown).

Thereafter, every time the high-level reversed row address higher-bit signal $/RAD_{10}$ and high-level row address higher-bit signal $RAD_{10}$ are supplied, by repeating the same operations as described above, the first and second blocks are activated alternately. Moreover, operations of writing and reading of data, of refreshing or a like are almost the same as those of the conventional DRAM and their descriptions are omitted accordingly Thus, according to the embodiment of the present invention, since one memory block that can be treated as one versatile storage unit is so constructed that one MCA having a storage capacity of 1M bits and having a plurality of memory cells (512 rows×2048 columns) arranged in a matrix-like form is sandwiched between two SAs, the system designer can freely increase or decrease the number of the blocks making up the memory block according to desired storage capacity. Moreover, since activating circuits are provided which can operate in a versatile manner, irrespective of combinations of the memory capacity, the number of banks, the number of rows of memory cell arrays to be refreshed, the system designer can also perform the system design only by designating required storage capacity, the number of banks and the number of rows of memory cell arrays to be refreshed, without giving special considerations to individual circuit configuration of the DRAM. This allows the system designer to perform the system design with great ease and freedom. Furthermore, a preparation of one kind of the activating circuit which can operate in a versatile manner is all that is needed by semiconductor manufacturers, which assures shortened development period of semiconductor devices. FIG. 49 shows combinations of the storage capacity, the number of banks and the number of rows of memory cell arrays to be refreshed and relations among the capacity mode signals $CM_6$, $CM_4$ and $CM_2$, bank modes $BM_4$, $BM_2$ and $BM_1$ and refresh mode signals $RM_{40}$, $RM_{20}$, $RM_{10}$ and $RM_{05}$, that can be applied to the embodiment of the present invention. As shown in FIG. 49, the system designer can freely select any one of 19 possible combinations of the storage capacity, the number of banks and the number of rows of memory cell arrays to be refreshed.

It is apparent that the present invention is not limited to the above embodiment but may be changed and modified without departing from the scope and spirit of the invention. For example, one SA making up the block is activated in two stages by using the two kinds of SA activating signals $SAAT_{11}$ to $SAAT_{18}$ and $SAAT_{21}$ to $SAAT_{28}$ to be output by each of the activating signal generating circuits $20_1$ to $20_8$, however, one SA may be activated in one stage by using one kind of the SA activating signal. Moreover, each of the configuration of the row decoder 10, refresh decoder 15, block selecting signal generating circuits $18_1$ to $18_8$, row address latch signal generating circuits $19_1$ to $19_8$ and activating signal generating circuits $20_1$ to $20_8$ is merely one example and any configuration may be employed only if it has the same functions as those employed in the embodiment. In the above embodiment, no description of circuits to be embedded together with the DRAM is given, however, a DMAC (Direct Memory Access Controller), digital-analog converter, analog-digital converter, or a plurality of analog signal processing circuits used to process various analog signals, in addition to the CPU described in the above Related Art or digital signal processing circuits to process various digital signals may be incorporated in one semiconductor chip and they may be connected to each other through buses or signal lines therein. Also, in the above embodiment, since the MCA making up the block is so configured that a plurality of memory cells (512 rows×2048 columns) is arranged in a matrix-like form, any one of the 8M bits, 4M bits, 2M bits and 1M bits can be selected as the storage capacity, 4, 2 or 1 can be selected as the number of banks, and 4K, 2K, 1K or 512 can be selected as the number of rows of memory cell arrays to be refreshed, however, these are only examples, that is, by changing configurations of the MCA, the storage capacity, the number of banks and the number of rows of memory cell arrays to be refreshed may be set freely, and their combinations, though they are limited by configurations of the MCA, may be selected freely to some extent. Furthermore, in the above embodiment, the DRAM is employed as the memory to be embedded in the semiconductor, however, an SRAM (Static RAM) or ROM may be used as the memory, in which no refreshing is required and therefore the storage capacity and the number of banks only may be set, thus simplifying the configurations of the activating circuit 4.

What is claimed is:

1. A semiconductor device comprising:
a memory to store various data and to be embedded in one semiconductor chip together with circuits to process various signals, wherein said memory includes a memory block in which a plurality of blocks, being corresponded to pre-set storage capacity of said memory block, made up of a memory cell array having predetermined storage capacity and being constructed of a plurality of memory cells is arranged and an activating circuit configured so as to correspond to numbers of blocks satisfying maximum settable storage capacity which outputs a variety of activating signals used to activate a plurality of said blocks making up said memory block according to pre-set storage capacity and/or numbers of banks.

2. The semiconductor device according to claim 1, wherein said activating circuit outputs, according to pre-set storage capacity and/or numbers of banks, a block selecting signal used to select any one of blocks making up said memory block, a row address latch signal used to temporarily latch a row address decoded by a row decoder which outputs a main-word activating signal to put a main-word line corresponding to said memory cell array in a selected state based on said decoded row address, a main-word timing control signal used to control timing with which said row decoder outputs said main-word activating signal and a sub-word activating signal used to activate a sub-word line of said memory cell array making up said corresponding block, to each of a plurality of said blocks making up said memory block.

3. The semiconductor device according to claim 1, further comprising a control circuit which generates, according to pre-set storage capacity and/or numbers of banks and based on an address supplied from outside, a latch signal used to temporarily latch said block selecting signal, a first control signal used to control timing with which said row address latch signal is output, a second control signal used to control timing with which said activating circuit outputs said main-word timing control signal, a third control signal used to control timing with which said activating circuit outputs said sub-word activating signal, a capacity mode signal corresponding to pre-set storage capacity and a bank mode signal corresponding to numbers of banks and then feeds these signals to said activating circuit with specified timing, wherein said activating circuit, based on said latch signal, said first to third control signals, said capacity mode signal and said bank mode signal, generates said various activating signals.

4. The semiconductor device according to claim 3, wherein said control circuit, when a test on said memory is executed, generates a test mode signal used to put all banks in a test mode, a test clock being a clock used in said test mode and a block forcedly-activating signal used to forcedly activate corresponding one block contained in said blocks and feeds these signals to said activating circuit, wherein said activating circuit, based on said test mode signal, said test clock and said block forcedly-activating signal, generates said various activating signals.

5. The semiconductor device according to claim 1, wherein said memory cell array has storage capacity of 1M bits and has said plurality of said memory cells arranged in a matrix-like manner and in 512 rows×2048 columns form and wherein storage capacity that is allowed to be set includes any one of 1M, 2M, 4M and 8M bits and numbers of banks that are allowed to be set include any one of 1, 2 and 4.

6. A semiconductor device comprising:
a dynamic random access memory to store various data and to be embedded in one semiconductor chip together with circuits to process various signals, wherein said dynamic random access memory includes a memory block in which a plurality of blocks, being corresponded to pre-set storage capacity of said memory block, made up of a memory cell array having predetermined storage capacity and being constructed of a plurality of memory cells is arranged and of first and second sense amplifiers constructed so as to sandwich said memory cell array and used to detect data read to a bit line from said memory cell making up said memory cell array and to amplify said data and an activating circuit configured so as to correspond to numbers of blocks satisfying maximum settable storage capacity which outputs a variety of activating signals used to activate a plurality of said blocks making up said memory block according to pre-set storage capacity, numbers of banks and numbers of rows of memory cell arrays to be refreshed representing numbers of rows of said memory cell arrays to be activated by one time refreshing processing.

7. The semiconductor device according to claim 6, wherein said activating circuit outputs, according to said pre-set storage capacity, numbers of banks and numbers of rows of memory cell arrays, a block selecting signal used to select any one of blocks making up said memory block, a row address latch signal used to temporarily latch a row address decoded by a row decoder which outputs a main-word activating signal to put a main-word line corresponding to said memory cell array in a selected state, based on said decoded row address, a main-word timing control signal used to control timing with which said row decoder outputs said main-word activating signal, a sub-word activating signal used to activate a sub-word line of said memory cell array making up said corresponding block and a sense amplifier activating signal used to activate two sense amplifiers making up said corresponding block, to each of a plurality of said blocks making up said memory block.

8. The semiconductor device according to claim 6, further comprising a control circuit which generates, according to pre-set storage capacity, numbers of banks and numbers of rows of memory cell arrays to be refreshed and based on an address supplied from outside, a latch signal used to temporarily latch said block selecting signal, a first control signal used to control timing with which said row address latch signal is output, a second control signal used to control timing with which said activating circuit outputs said main-word timing control signal, a third control signal used to control timing with which said activating circuit outputs said sub-word activating signal, a fourth control signal used to control timing with which said activating circuit outputs said sense amplifier activating signal, a capacity mode signal corresponding to pre-set storage capacity, a bank mode signal corresponding to numbers of banks, a refresh mode signal corresponding to pre-set numbers of rows of memory cell arrays to be refreshed and then feeds these signals to said activating circuit with specified timing, wherein said activating circuit, based on said latch signal, said first to fourth control signals, said capacity mode signal, said bank mode signal and said refresh mode signal, generates said various activating signals.

9. The semiconductor device according to claim 8, wherein said activating circuit includes a refresh decoder to decode data obtained by combining higher-order bits contained in said refresh mode signal with those contained in said row address and to generate a block activating designation signal used to designate said block to be activated and a block activating section mounted in numbers corresponding to numbers of blocks satisfying maximum settable capacity, to generate, based on said latch signal, a reversed latch signal obtained by reversing said latch signal, said first to fourth control signals, said capacity mode signal, said bank mode signal and said refresh mode signal, according to pre-set storage capacity, numbers of banks and numbers of rows of memory cell arrays to be refreshed, with specified timing, said block selecting signal and generates said row address latch signal, said main-word timing control signal, said sub-word activating signal and said sense amplifier activating signal.

10. The semiconductor device according to claim 9, wherein said block activating section includes a block selecting signal generating circuit which generates, based on said block activating designation signal, said latch signal, said reversed latch signal, said refresh mode signal and said bank mode signal, a block selecting signal used to designate said corresponding block, a row address latch signal generating circuit which generates, based on said first control signal and said block selecting signal, said row address latch signal and feeds it to corresponding one contained in said blocks and an activating signal generating circuit which generates, based on said second to fourth control signals and said block selecting signal, said sub-word activating signal and said sense amplifier activating signal and said main-word timing control signal and feeds these signals to corresponding blocks.

11. The semiconductor device according to claim 10, wherein said control circuit, when a test on said memory is executed, generates a test mode signal used to put all banks in a test mode, a test clock being a clock used in said test mode and a block forcedly-activating signal used to forcedly activate corresponding one block contained in said blocks and feeds these signals to said activating circuit, wherein said activating circuit, based on said test mode signal, said test clock and said block forcedly-activating signal, generates said various activating signals.

12. The semiconductor device according to claim 6, wherein said memory cell array has a storage capacity of 1M bits and has a plurality of memory cells arranged in a matrix-like manner and in 512 rows×2048 columns form and wherein storage capacity that is allowed to be set includes any one of 1M, 2M, 4M and 8M bits, numbers of banks that are allowed to be set include any one of 1, 2 and 4 and numbers of rows of memory cell arrays to be refreshed that are allowed to be set include any one of $512, 2^{10}, 2^{11}$ and $2^{12}$.

* * * * *